(12) United States Patent
Rothberg et al.

(10) Patent No.: US 11,237,326 B2
(45) Date of Patent: Feb. 1, 2022

(54) OPTICAL REJECTION PHOTONIC STRUCTURES USING TWO SPATIAL FILTERS

(71) Applicant: Quantum-Si Incorporated, Guilford, CT (US)

(72) Inventors: Jonathan M. Rothberg, Guilford, CT (US); Gerard Schmid, Guilford, CT (US); Alexander Gondarenko, Portland, OR (US); James Beach, Austin, TX (US); Kyle Preston, Guilford, CT (US); Farshid Ghasemi, Guilford, CT (US); Jeremy Lackey, Guilford, CT (US); Jack Jewell, Boulder, CO (US); Keith G. Fife, Palo Alto, CA (US); Ali Kabiri, Madison, CT (US)

(73) Assignee: Quantum-Si Incorporated, Guilford, CT (US)

( * ) Notice: Subject to any disclaimer, the term of this patent is extended or adjusted under 35 U.S.C. 154(b) by 0 days.

(21) Appl. No.: 16/042,968

(22) Filed: Jul. 23, 2018

(65) Prior Publication Data
US 2019/0025511 A1    Jan. 24, 2019

Related U.S. Application Data

(60) Provisional application No. 62/536,268, filed on Jul. 24, 2017.

(51) Int. Cl.
*G02B 6/122* (2006.01)
*G02B 26/08* (2006.01)
(Continued)

(52) U.S. Cl.
CPC ......... *G02B 6/1225* (2013.01); *G01N 21/648* (2013.01); *G01N 21/6454* (2013.01);
(Continued)

(58) Field of Classification Search
CPC .... G02B 6/1225; G02B 6/02323; G02B 5/20; G02B 5/3025; G02B 26/08; H04L 25/167
See application file for complete search history.

(56) References Cited

U.S. PATENT DOCUMENTS 5,500,540 A * 3/1996 Jewell .................. H01L 25/167
                                                   257/432
5,547,849 A * 8/1996 Baer .................. G01N 15/1468
                                                   435/287.2

(Continued)

FOREIGN PATENT DOCUMENTS

WO    WO 2011/153962 A1    12/2011
WO    WO 2014/031157 A1     2/2014

OTHER PUBLICATIONS

Reference number list for U.S. Patent Application Publication No. 2015/0141267 of Rothberg et al. (Rothberg) (Year: 2021).*

(Continued)

*Primary Examiner* — Andrew Jordan
(74) *Attorney, Agent, or Firm* — Wolf, Greenfield & Sacks, P.C.

(57) ABSTRACT

An integrated device and related instruments and systems for analyzing samples in parallel are described. The integrated device may include sample wells arranged on a surface of where individual sample wells are configured to receive a sample labeled with at least one fluorescent marker configured to emit emission light in response to excitation light. The integrated device may further include photodetectors positioned in a layer of the integrated device, where one or more photodetectors are positioned to receive a photon of emission light emitted from a sample well. The integrated device further includes one or more photonic structures positioned between the sample wells and the photodetectors, where the one or more photonic structures are configured to attenuate the excitation light relative to the (Continued)

emission light such that a signal generated by the one or more photodetectors indicates detection of photons of emission light.

38 Claims, 35 Drawing Sheets

(51) Int. Cl.
G02B 5/30 (2006.01)
G02B 6/02 (2006.01)
G02B 5/20 (2006.01)
H01L 25/16 (2006.01)
G01N 21/64 (2006.01)

(52) U.S. Cl.
CPC .............. *G02B 5/20* (2013.01); *G02B 5/3025* (2013.01); *G02B 6/02323* (2013.01); *G02B 26/08* (2013.01); *H01L 25/167* (2013.01)

(56) References Cited

U.S. PATENT DOCUMENTS

| | | | |
|---|---|---|---|
| 5,814,565 A * | 9/1998 | Reichert | G01N 33/54373 385/12 |
| 5,835,646 A * | 11/1998 | Yoshimura | G02B 6/262 385/14 |
| 5,961,924 A | 10/1999 | Reichert et al. | |
| 6,350,413 B1 * | 2/2002 | Reichert | G01N 21/648 385/12 |
| 6,388,535 B1 * | 5/2002 | Otsuki | H03B 5/1847 331/177 R |
| 6,437,345 B1 | 8/2002 | Bruno-Raimondi et al. | |
| 6,600,847 B2 * | 7/2003 | Saini | G02B 6/1228 372/43.01 |
| 6,787,308 B2 | 9/2004 | Balasubramanian et al. | |
| 6,825,921 B1 | 11/2004 | Moldin et al. | |
| 6,843,590 B2 * | 1/2005 | Jones | H01J 63/06 362/554 |
| 6,867,900 B2 * | 3/2005 | Weisbuch | G01N 21/648 359/321 |
| 6,882,430 B2 * | 4/2005 | Hill | G01B 9/02019 356/490 |
| 6,906,784 B2 * | 6/2005 | Hill | G01B 9/02019 355/53 |
| 6,917,726 B2 | 7/2005 | Levene et al. | |
| 7,013,054 B2 * | 3/2006 | Levene | G02B 6/10 385/12 |
| 7,057,135 B2 * | 6/2006 | Li | B23K 26/04 219/121.67 |
| 7,175,811 B2 | 2/2007 | Bach et al. | |
| 7,181,122 B1 * | 2/2007 | Levene | G02B 6/10 385/132 |
| 7,232,656 B2 * | 6/2007 | Balasubramanian | B01J 19/0046 435/6.12 |
| 7,251,041 B2 * | 7/2007 | Hill | G01B 9/02019 356/498 |
| 7,265,840 B2 * | 9/2007 | Cheng | G02B 6/4227 356/399 |
| 7,292,742 B2 * | 11/2007 | Levene | G01N 21/645 385/12 |
| 7,426,322 B2 | 9/2008 | Hyde | |
| 7,511,247 B2 * | 3/2009 | Li | B23K 26/0736 219/121.61 |
| 7,537,734 B2 * | 5/2009 | Reichert | G01N 21/648 356/12 |
| 7,692,783 B2 * | 4/2010 | Lundquist | G01J 3/02 356/244 |
| 7,738,086 B2 | 6/2010 | Shepard et al. | |
| 7,820,983 B2 | 10/2010 | Lundquist et al. | |
| 7,834,329 B2 | 11/2010 | Lundquist et al. | |
| 7,838,847 B2 | 11/2010 | Lundquist et al. | |
| 8,053,742 B2 | 11/2011 | Lundquist et al. | |
| 8,193,123 B2 * | 6/2012 | Rank | B82Y 30/00 506/43 |
| 8,207,509 B2 | 6/2012 | Lundquist et al. | |
| 8,274,040 B2 | 9/2012 | Zhong et al. | |
| 8,278,728 B2 | 10/2012 | Murshid | |
| 8,465,699 B2 | 6/2013 | Fehr et al. | |
| 8,467,061 B2 * | 6/2013 | McCaffrey | G01N 21/75 356/432 |
| 8,471,219 B2 | 6/2013 | Lundquist et al. | |
| 8,471,230 B2 | 6/2013 | Zhong et al. | |
| 8,502,169 B2 | 8/2013 | Rigneault et al. | |
| 8,618,507 B1 | 12/2013 | Lundquist et al. | |
| 8,649,011 B2 * | 2/2014 | McCaffrey | C12Q 1/6825 356/432 |
| 8,655,138 B2 * | 2/2014 | Lipson | G02B 6/136 385/146 |
| 8,772,202 B2 * | 7/2014 | Rank | B82Y 20/00 506/43 |
| 8,778,849 B2 * | 7/2014 | Bowen | B01J 19/0046 506/32 |
| 8,802,600 B2 * | 8/2014 | Rank | C12Q 1/6874 506/43 |
| 8,867,038 B2 * | 10/2014 | McCaffrey | G01N 21/75 356/432 |
| 8,885,987 B2 * | 11/2014 | Augusto | G02B 6/12 385/14 |
| 8,975,216 B2 * | 3/2015 | Rank | C12Q 1/6837 506/43 |
| 9,029,802 B2 | 5/2015 | Lundquist et al. | |
| 9,036,960 B2 * | 5/2015 | Augusto | G02B 6/12 385/14 |
| 9,157,864 B2 | 10/2015 | Fehr et al. | |
| 9,222,123 B2 | 12/2015 | Zhong et al. | |
| 9,222,133 B2 | 12/2015 | Lundquist et al. | |
| 9,223,084 B2 | 12/2015 | Grot et al. | |
| 9,244,066 B2 * | 1/2016 | O'Driscoll | G01J 3/0202 |
| 9,291,568 B2 * | 3/2016 | McCaffrey | B01L 3/502715 |
| 9,291,569 B2 * | 3/2016 | Fehr | G01N 21/03 |
| 9,372,308 B1 | 6/2016 | Saxena et al. | |
| 9,410,891 B2 * | 8/2016 | Fehr | G01N 21/0303 |
| 9,488,584 B2 * | 11/2016 | McCaffrey | G01N 21/645 |
| 9,528,925 B2 * | 12/2016 | Kletter | G01N 15/1429 |
| 9,587,276 B2 | 3/2017 | Lundquist et al. | |
| 9,606,060 B2 | 3/2017 | Chen et al. | |
| 9,655,523 B2 * | 5/2017 | Hillman | G02B 23/2476 |
| 9,658,161 B2 | 5/2017 | Saxena et al. | |
| 9,666,748 B2 | 5/2017 | Leobandung | |
| 9,670,535 B2 * | 6/2017 | Bowen | C12Q 1/686 |
| 9,678,012 B2 * | 6/2017 | Rothberg | C12Q 1/6874 |
| 9,719,138 B2 | 8/2017 | Zhong et al. | |
| 9,765,395 B2 | 9/2017 | Goldsmith | |
| 9,784,679 B2 * | 10/2017 | Rothberg | C12Q 1/6874 |
| 9,822,410 B2 * | 11/2017 | McCaffrey | C12Q 1/6825 |
| 9,863,880 B2 * | 1/2018 | Rothberg | C12Q 1/6869 |
| 9,885,657 B2 * | 2/2018 | Rothberg | C12Q 1/6874 |
| 9,921,157 B2 * | 3/2018 | Rothberg | G01N 21/6408 |
| 9,944,980 B2 * | 4/2018 | Rank | C12Q 1/6837 |
| 9,946,017 B2 | 4/2018 | Saxena et al. | |
| 9,983,135 B2 * | 5/2018 | Rothberg | C12Q 1/6869 |
| 10,018,764 B2 | 7/2018 | Grot et al. | |
| 10,048,208 B2 * | 8/2018 | Rothberg | C12Q 1/6869 |
| 10,090,429 B2 | 10/2018 | Leobandung | |
| 10,138,515 B2 | 11/2018 | Fehr et al. | |
| 10,280,454 B2 * | 5/2019 | Bowen | C12Q 1/686 |
| 10,280,457 B2 | 5/2019 | Zhong et al. | |
| 10,310,178 B2 | 6/2019 | Saxena et al. | |
| 10,348,317 B2 * | 7/2019 | Nishida | G04F 5/145 |
| 10,371,906 B1 * | 8/2019 | Beresnev | G02B 7/02 |
| 10,487,356 B2 | 11/2019 | Lundquist et al. | |
| 10,578,788 B2 | 3/2020 | Grot et al. | |
| 10,640,825 B2 * | 5/2020 | McCaffrey | G01N 21/645 |
| 10,655,172 B2 | 5/2020 | Rank et al. | |
| 10,697,012 B2 * | 6/2020 | Zhong | C12Q 1/6825 |
| 10,718,732 B2 * | 7/2020 | Levine | H01L 23/5226 |
| 10,724,090 B2 * | 7/2020 | McCaffrey | G01N 21/0303 |
| 10,768,362 B2 * | 9/2020 | Saxena | C12Q 1/6869 |

(56) References Cited

U.S. PATENT DOCUMENTS

| | | | |
|---|---|---|---|
| 2002/0034457 A1* | 3/2002 | Reichert | G01N 21/7703 422/82.11 |
| 2002/0110839 A1* | 8/2002 | Bach | B82Y 5/00 435/7.9 |
| 2002/0182716 A1 | 12/2002 | Weisbuch et al. | |
| 2003/0086654 A1* | 5/2003 | Saini | G02B 6/1228 385/50 |
| 2003/0174992 A1 | 9/2003 | Levene et al. | |
| 2003/0186227 A1* | 10/2003 | Balasubramanian | C12Q 1/6837 506/9 |
| 2003/0211402 A1* | 11/2003 | Hill | G01B 9/02018 430/5 |
| 2004/0052491 A1* | 3/2004 | Otake | G02F 1/2257 385/131 |
| 2004/0091903 A1* | 5/2004 | Balasubramanian | C12Q 1/6837 506/9 |
| 2005/0030549 A1* | 2/2005 | Hill | G01B 9/02007 356/498 |
| 2005/0168755 A1* | 8/2005 | Hill | G01B 9/02019 356/500 |
| 2005/0276535 A1* | 12/2005 | Levene | G01N 33/54373 385/12 |
| 2006/0187434 A1* | 8/2006 | Sogard | G03F 9/7026 355/55 |
| 2006/0285796 A1* | 12/2006 | Cheng | G02B 6/4296 385/38 |
| 2007/0017797 A1* | 1/2007 | Hyde | B01J 19/123 204/157.15 |
| 2007/0036502 A1* | 2/2007 | Levene | C12Q 1/25 385/132 |
| 2007/0134716 A1* | 6/2007 | Levene | B82Y 20/00 435/6.11 |
| 2007/0188750 A1 | 8/2007 | Lundquist et al. | |
| 2007/0238679 A1* | 10/2007 | Rank | C12Q 1/6837 514/44 R |
| 2008/0032301 A1* | 2/2008 | Rank | B82Y 30/00 435/6.11 |
| 2008/0037008 A1* | 2/2008 | Shepard | G01N 21/6408 356/73 |
| 2008/0081769 A1 | 4/2008 | Hassibi | |
| 2008/0111994 A1* | 5/2008 | Sogard | G03F 9/7026 356/498 |
| 2008/0128627 A1* | 6/2008 | Lundquist | G01N 21/648 250/363.01 |
| 2008/0152280 A1* | 6/2008 | Lundquist | G01N 21/6428 385/30 |
| 2008/0152281 A1* | 6/2008 | Lundquist | G01N 21/6428 385/31 |
| 2008/0153100 A1* | 6/2008 | Rank | B82Y 20/00 435/6.11 |
| 2008/0176769 A1* | 7/2008 | Rank | B82Y 30/00 506/32 |
| 2010/0065726 A1 | 3/2010 | Zhong et al. | |
| 2010/0140460 A1* | 6/2010 | Rigneault | G01N 21/6452 250/226 |
| 2010/0168586 A1* | 7/2010 | Hillman | G02B 23/2476 600/476 |
| 2010/0300899 A1* | 12/2010 | Levine | C12Q 1/6825 205/792 |
| 2011/0082051 A1* | 4/2011 | Lundquist | G01N 21/6428 506/11 |
| 2011/0089518 A1* | 4/2011 | Murshid | H01L 27/1446 257/448 |
| 2012/0014837 A1* | 1/2012 | Fehr | C12Q 1/6825 422/82.11 |
| 2012/0019828 A1* | 1/2012 | McCaffrey | G01N 21/64 356/432 |
| 2012/0021525 A1* | 1/2012 | Fehr | C12Q 1/6825 436/94 |
| 2012/0077190 A1* | 3/2012 | Lundquist | G02B 6/43 435/6.1 |
| 2012/0085894 A1* | 4/2012 | Zhong | G01N 21/648 250/227.11 |
| 2012/0302459 A1* | 11/2012 | Rank | C12Q 1/6874 506/9 |
| 2013/0116153 A1 | 5/2013 | Bowen et al. | |
| 2013/0130363 A1* | 5/2013 | Lundquist | G01N 21/7743 435/287.2 |
| 2013/0183676 A1* | 7/2013 | Chen | G01N 21/6408 435/6.12 |
| 2013/0202525 A1* | 8/2013 | Pandey | A61K 41/0057 424/1.11 |
| 2013/0251592 A1* | 9/2013 | McCaffrey | G01N 21/6428 422/82.05 |
| 2013/0330731 A1* | 12/2013 | Fehr | B01L 3/502715 435/6.12 |
| 2013/0330817 A1* | 12/2013 | Lundquist | C12Q 1/6874 435/288.7 |
| 2013/0338013 A1* | 12/2013 | Zhong | G01N 21/6428 506/3 |
| 2014/0145647 A1* | 5/2014 | Walter | H01L 27/15 315/313 |
| 2014/0171331 A1* | 6/2014 | McCaffrey | G01N 21/75 506/6 |
| 2014/0178863 A1* | 6/2014 | Lundquist | G01N 21/6452 435/6.1 |
| 2014/0199016 A1* | 7/2014 | Grot | G01N 21/7703 385/11 |
| 2014/0200158 A1* | 7/2014 | Bowen | C12Q 1/686 506/9 |
| 2014/0315756 A1* | 10/2014 | Rank | B82Y 20/00 506/16 |
| 2015/0030298 A1* | 1/2015 | Augusto | G02B 6/12 385/131 |
| 2015/0057194 A1* | 2/2015 | McCaffrey | C12Q 1/6874 506/39 |
| 2015/0141267 A1 | 5/2015 | Rothberg et al. | |
| 2015/0141268 A1* | 5/2015 | Rothberg | C12Q 1/6869 506/2 |
| 2015/0168703 A1* | 6/2015 | Wei | G02B 21/16 250/459.1 |
| 2015/0177150 A1* | 6/2015 | Rothberg | C12Q 1/6869 506/2 |
| 2015/0203909 A1* | 7/2015 | Lundquist | G01N 21/6428 506/9 |
| 2015/0234205 A1* | 8/2015 | Schowengerdt | G02B 3/0037 351/159.02 |
| 2015/0235473 A1* | 8/2015 | Schowengerdt | G02B 5/005 345/633 |
| 2015/0247800 A1* | 9/2015 | Fehr | G01N 21/645 506/38 |
| 2015/0293021 A1* | 10/2015 | Finkelstein | C12Q 1/6869 506/13 |
| 2015/0376694 A1* | 12/2015 | McCaffrey | B01L 3/502707 506/2 |
| 2016/0041095 A1 | 2/2016 | Rothberg et al. | |
| 2016/0069806 A1* | 3/2016 | Fehr | G01N 21/05 506/2 |
| 2016/0084761 A1 | 3/2016 | Rothberg et al. | |
| 2016/0146724 A1* | 5/2016 | Gao | E21B 49/08 250/269.1 |
| 2016/0153040 A1* | 6/2016 | Zhong | G01N 21/7703 506/3 |
| 2016/0154165 A1* | 6/2016 | Grot | G01N 21/6452 362/619 |
| 2016/0186255 A1* | 6/2016 | Lundquist | G02B 6/10 506/4 |
| 2016/0201123 A1* | 7/2016 | Leobandung | H01L 31/18 435/176 |
| 2016/0213252 A1* | 7/2016 | Hillman | G02B 23/2476 |
| 2016/0273034 A1* | 9/2016 | Lundquist | G01N 21/648 |
| 2016/0334334 A1* | 11/2016 | Saxena | B29D 17/007 |
| 2016/0370291 A1* | 12/2016 | Rothberg | C12Q 1/6874 |
| 2016/0370292 A1* | 12/2016 | Rothberg | C12Q 1/6874 |
| 2017/0030834 A1* | 2/2017 | Fehr | G01N 21/648 |

(56) References Cited

U.S. PATENT DOCUMENTS

| | | | |
|---|---|---|---|
| 2017/0082544 A1 | 3/2017 | Dorpe et al. | |
| 2017/0137877 A1* | 5/2017 | McCaffrey | G01N 21/0303 |
| 2017/0146479 A1 | 5/2017 | Levine et al. | |
| 2017/0197193 A1* | 7/2017 | Bowen | B01J 19/0046 |
| 2017/0244420 A1* | 8/2017 | Nishida | G02B 5/20 |
| 2017/0263801 A1* | 9/2017 | Leobandung | C12Q 1/6874 |
| 2017/0299518 A1* | 10/2017 | Rothberg | C12Q 1/6874 |
| 2017/0322156 A1* | 11/2017 | Saxena | C12Q 1/6869 |
| 2017/0350818 A1 | 12/2017 | Rothberg et al. | |
| 2017/0362652 A1* | 12/2017 | Zhong | C12Q 1/6874 |
| 2018/0088052 A1* | 3/2018 | Rothberg | C12Q 1/6869 |
| 2018/0120229 A1* | 5/2018 | Rothberg | C12Q 1/6874 |
| 2018/0155781 A1* | 6/2018 | McCaffrey | G01N 21/77 |
| 2018/0231465 A1* | 8/2018 | Rothberg | G01N 21/6408 |
| 2018/0239087 A1* | 8/2018 | Saxena | B29D 17/007 |
| 2018/0328850 A1* | 11/2018 | Rothberg | C12Q 1/6869 |
| 2018/0348132 A1* | 12/2018 | Rothberg | C12Q 1/6869 |
| 2018/0348133 A1* | 12/2018 | Rothberg | C12Q 1/6869 |
| 2018/0371535 A1* | 12/2018 | Bowen | C12Q 1/686 |
| 2019/0025511 A1* | 1/2019 | Rothberg | G02B 6/1225 |
| 2019/0064421 A1* | 2/2019 | Grot | G02B 6/122 |
| 2019/0212265 A1* | 7/2019 | Rothberg | C12Q 1/6869 |
| 2019/0219779 A1* | 7/2019 | Beresnev | G02B 6/262 |
| 2019/0292590 A1 | 9/2019 | Zhong et al. | |
| 2019/0309361 A1* | 10/2019 | McCaffrey | G01N 21/03 |
| 2019/0360042 A1* | 11/2019 | Fehr | C12Q 1/6869 |
| 2020/0142127 A1* | 5/2020 | Saxena | G02B 6/02123 |
| 2020/0341181 A1* | 10/2020 | Grot | G01N 21/6486 |

OTHER PUBLICATIONS

Reference number list for U.S. Patent Application Publication No. 2005/0168755 of Hill (Hill) (Year: 2021).*
Reference number list for U.S. Appl. No. 16/042,968 of Rothberg et al. (Rothberg, the present application, prior to publication) (Year: 2021).*
International Search Report and Written Opinion for International Application No. PCT/US18/43333 dated Oct. 15, 2018.
Hale, Fibre Optic Sensors using Adiabatically Tapered Single Mode Fibres. Dissertation submitted to the University of Cambridge. Feb. 1994. 209 pages.
Mogensen et al., A Microfluidic Device with an Integrated Waveguide Beam Splitter for Velocity Measurements of Flowing Particles by Fourier Transformation. Analytical Chemistry. Sep. 15, 2003;75(18):4931-4936.
Taitt et al., Evanescent wave fluorescence biosensors. Biosens Bioelectron. Jun. 2005;20(12):2470-87. Epub Dec. 8, 2004.
Extended European Search Report dated Mar. 5, 2021 in connection with European Application No. 18839142.9.
18839142.9, Mar. 5, 2021, Extended European Search Report.

* cited by examiner

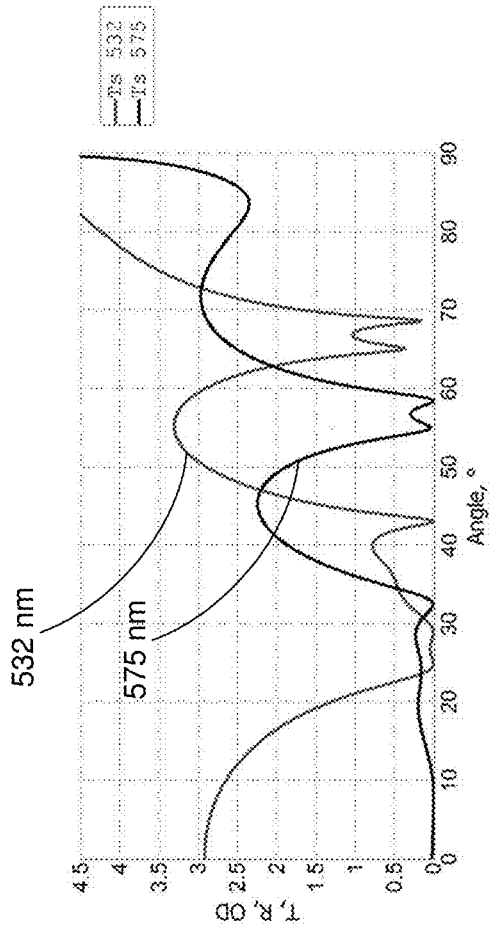
FIG. 2-7A
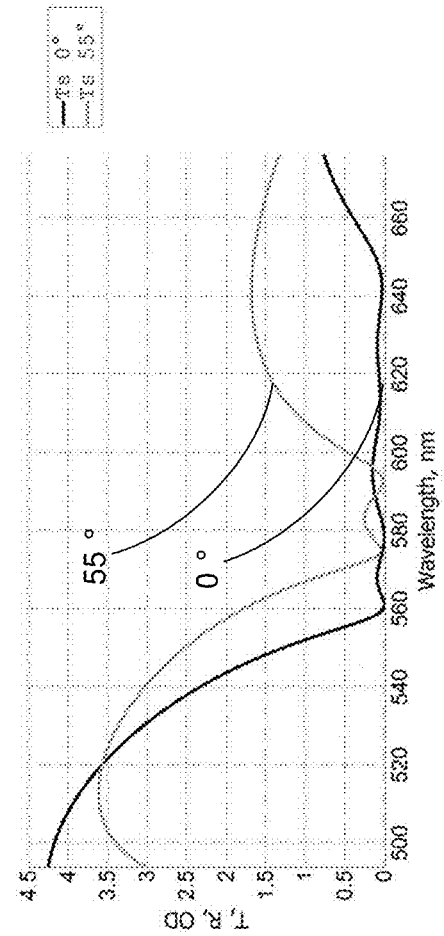
FIG. 2-7B
FIG. 2-7C

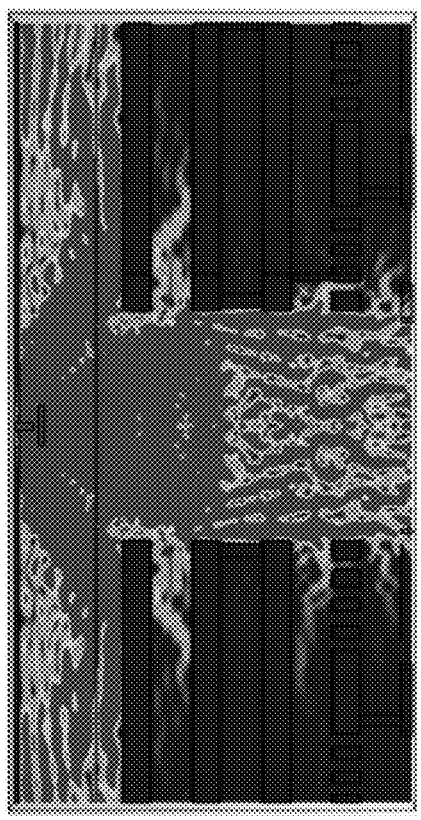
FIG. 3-3A
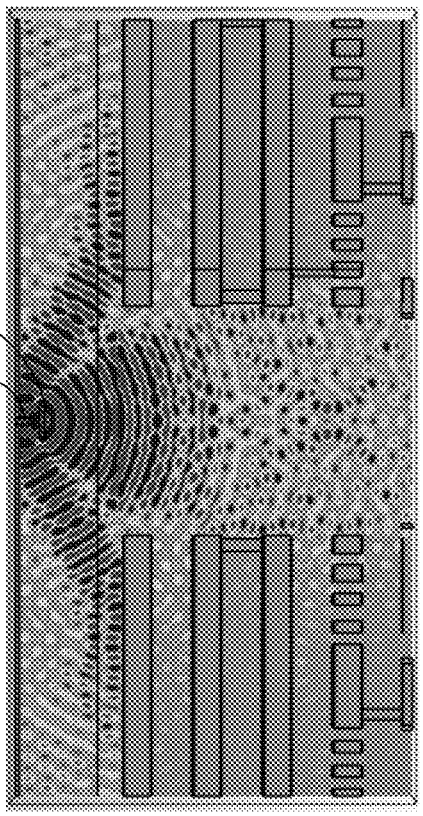
FIG. 3-3B
FIG. 3-3C
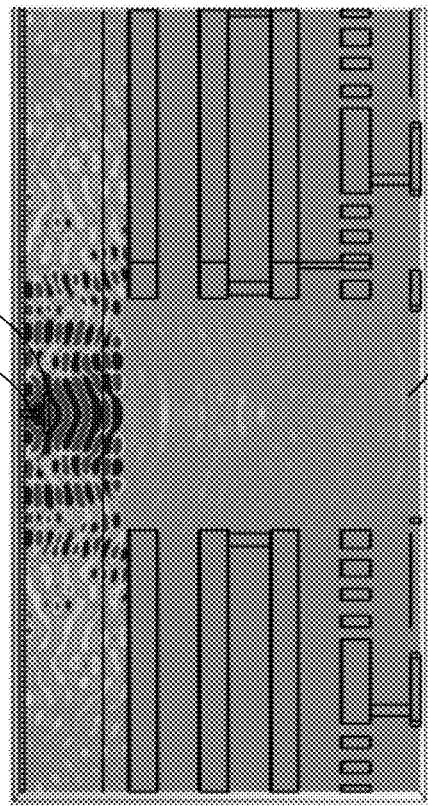
FIG. 3-3D

OPTICAL REJECTION PHOTONIC STRUCTURES USING TWO SPATIAL FILTERS

RELATED APPLICATIONS

The present application claims the benefit under 35 U.S.C. § 119(e) of U.S. Application Ser. No. 62/536,268, filed Jul. 24, 2017 and titled "OPTICAL REJECTION PHOTONIC STRUCTURES," which is hereby incorporated herein by reference in its entirety.

FIELD OF THE APPLICATION

The present application relates to integrated devices and related instruments that can perform massively-parallel analyses of samples by providing short optical pulses to tens of thousands of sample wells or more simultaneously and receiving fluorescent signals from the sample wells for sample analyses. The instruments may be useful for point-of-care genetic sequencing and for personalized medicine.

BACKGROUND

Instruments that are capable of massively-parallel analyses of biological or chemical samples are typically limited to laboratory settings because of several factors that can include their large size, lack of portability, requirement of a skilled technician to operate the instrument, power need, need for a controlled operating environment, and cost. When a sample is to be analyzed using such equipment, a common paradigm is to extract a sample at a point of care or in the field, send the sample to the lab and wait for results of the analysis. The wait time for results can range from hours to days.

SUMMARY

Some embodiments are directed to an integrated device comprising a plurality of sample wells arranged on a first layer of the integrated device. Individual sample wells of the plurality of sample wells are configured to receive a sample labeled with at least one fluorescent marker configured to emit emission light in response to excitation light. The integrated device further comprises a plurality of photodetectors arranged on a second layer of the integrated device and positioned to receive photons of emission light emitted from the plurality of sample wells. Individual sample wells of the plurality of sample wells align with at least one photodetector of the plurality of photodetectors. The integrated device further comprises at least one photonic structure positioned between an individual sample well and its respective at least one photodetector, the at least one photonic structure configured to attenuate the excitation light relative to the emission light, a signal generated by the at least one photodetector indicates detection of photons of emission light.

In some embodiments, the at least one photonic structure is positioned to align on a common axis with an individual sample well and its respective at least one photodetector. In some embodiments, a sample well of the plurality of sample wells is positioned to overlap with its respective at least one photodetector. In some embodiments, individual sample wells of the plurality of sample wells align with individual photodetectors of the plurality of photodetectors. In some embodiments, the at least one photonic structure has at least one opening that aligns on a common axis with an individual sample well and its respective at least one photodetector.

In some embodiments, the integrated device further comprises at least one waveguide configured to couple excitation light to a portion of the plurality of sample wells. In some embodiments, a first waveguide of the at least one waveguide is positioned to overlap with a first sample well of the portion of sample wells and a first photodetector of the plurality of photodetectors along a common axis. In some embodiments, the at least one photonic structure is positioned between the first waveguide and the first photodetector along the common axis.

In some embodiments, the at least one photonic structure includes at least one spatial filter having at least one opening that overlaps with at least a portion of the plurality of sample wells and is configured to block transmission of at least a portion of the excitation light. In some embodiments, the at least one spatial filter includes at least one metal layer configured to block transmission of at least a portion of the excitation light. In some embodiments, the integrated device further comprises circuitry that includes the at least one metal layer, the circuitry is electrically coupled to at least one photodetector of the plurality of photodetectors. In some embodiments, the at least one spatial filter includes a first spatial filter positioned proximate the plurality of sample wells and a second spatial filter positioned proximate the plurality of photodetectors. In some embodiments, the first spatial filter has an opening having a first size and the second spatial filter has an opening having a second size, the first size being greater than the second size.

In some embodiments, the at least one photonic structure includes at least one spectral filter configured to transmit a first range of wavelengths at a higher level than a second range of wavelengths, the first range of wavelengths include at least one characteristic wavelength of the emission light and the second range of wavelengths include at least one characteristic wavelength of the excitation light. In some embodiments, the at least one spectral filter is positioned between a first spatial filter and a second spatial filter. In some embodiments, the at least one spectral filter includes a plurality of low refractive index layers having a low refractive index material and a plurality of high refractive index layers having a high refractive index material. In some embodiments, the at least one spectral filter includes alternating layers of the plurality of high refractive index layers and the plurality of low refractive index layers. In some embodiments, the integrated device further includes an excitation source coupling region configured to receive a beam of excitation light and optically couple excitation light to a waveguide of the integrated device, the at least one spectral filter overlaps with the excitation source coupling region.

In some embodiments, the at least one photonic structure includes at least one polarization filter configured to attenuate transmission of light having a type of polarization. In some embodiments, the excitation light is transverse electric (TE) polarized light, and the at least one polarization filter is configured to attenuate TE polarized light. In some embodiments, the at least one polarization filter includes a periodic array of slits.

In some embodiments, the excitation light is a pulse of excitation light and the emission light is a photon emitted by the at least one fluorescent marker emitted in response to the pulse of excitation light and individual photodetectors of the plurality of photodetectors are further configured to generate a signal indicative of a lifetime of the emission light. In some embodiments, individual photodetectors of the plurality of photodetectors are configured to discard charge carriers produced from photons of excitation light. In some embodiments, the excitation light is a pulse of excitation light, and individual photodetectors are further configured to discard charge carriers produced from photons of the excitation light pulse over a first period of time. In some embodiments, individual photodetectors are further configured to selectively direct, over a second period of time, charge carriers produced by incident photons into respective charge carrier storage regions based upon times at which the charge carriers are produced.

In some embodiments, the at least one photonic structure is configured to attenuate excitation light over a range of angles from normal to the at least one photonic structure. In some embodiments, a characteristic wavelength of the emission light is between 550 nm and 650 nm. In some embodiments, a characteristic wavelength of the excitation light is 532 nm. In some embodiments, a characteristic wavelength of the excitation light is 515 nm.

In some embodiments, the at least one photonic structure includes at least one spatial filter and vertical sidewalls positioned between the at least one spatial filter and at least a portion of the plurality of photodetectors. In some embodiments, the at least one photonic structure includes a first spatial filter, a second spatial filter, and vertical sidewalls positioned between the first spatial filter and the second spatial filter. In some embodiments, the at least one photonic structure includes a spatial filter, and the integrated device further comprises a region having a first dielectric material positioned between the spatial filter and at least one photodetector of the plurality of photodetectors and a region having a second dielectric material positioned between the spatial filter and a sample well overlapping with the at least one photodetector, the first dielectric material has a higher refractive index than the second dielectric material.

In some embodiments, a distance between one sample well of the plurality of sample wells and at least one photodetector of the plurality of photodetectors is less than 10 microns. In some embodiments, a distance between one sample well of the plurality of sample wells and at least one photodetector of the plurality of photodetectors is less than 5 microns. In some embodiments, a distance between one sample well of the plurality of sample wells and at least one photodetector of the plurality of photodetectors is between 1.5 microns and 5 microns.

Some embodiments are directed to an integrated device as described herein and an instrument comprising an excitation source configured to emit pulses of excitation light and at least one alignment component configured to align a beam of excitation light to the integrated device such that excitation light is coupled to at least one waveguide of the integrated device.

Some embodiments are directed to a method of forming an integrated device comprising: forming a plurality of sample wells arranged on a first layer of the integrated device, individual sample wells of the plurality of sample wells are configured to receive a sample labeled with at least one fluorescent marker configured to emit emission light in response to excitation light. The method further comprises forming a plurality of photodetectors arranged on a second layer of the integrated device and positioned to receive photons of emission light emitted from the plurality of sample wells, individual sample wells of the plurality of sample wells align with at least one photodetector of the plurality of photodetectors. The method further comprises forming at least one photonic structure positioned to align on a common axis with an individual sample well and its respective at least one photodetector, the at least one photonic structure configured to attenuate the excitation light relative to the emission light, a signal generated by the at least one photodetector indicates detection of photons of emission light.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 1-1B is a schematic of a pixel of an integrated device, according to some embodiments.

FIG. 2-1A is a cross-sectional view of an integrated device having a spectral filter, according to some embodiments.

FIG. 2-1B is a cross-sectional view of an integrated device having a spectral filter and a spatial filter, according to some embodiments.

FIG. 2-2A is a table of the material, thickness, and index of refraction of individual layers included in a spectral filter, according to some embodiments.

FIG. 2-2B is a plot of transmission versus wavelength for an exemplary spectral filter, according to some embodiments.

FIG. 2-3A is a table of the material, thickness, and index of refraction of individual layers included in a spectral filter, according to some embodiments.

FIG. 2-3B is a plot of transmission versus wavelength for an exemplary spectral filter, according to some embodiments.

FIG. 2-4A is a table of the material, thickness, and index of refraction of individual layers included in a spectral filter, according to some embodiments.

FIG. 2-4B is a plot of transmission versus wavelength for an exemplary spectral filter, according to some embodiments.

FIG. 2-5A is a table of the material, thickness, and index of refraction of individual layers included in a spectral filter, according to some embodiments.

FIG. 2-5B is a plot of transmission versus wavelength for an exemplary spectral filter, according to some embodiments.

FIG. 2-6 is a plot of transmission at normal incidence versus wavelength of two spectral filters, according to some embodiments.

FIG. 2-7A is a table of the thickness of individual layers included in a spectral filter, according to some embodiments FIG. 2-7B is a plot of optical rejection versus angle relative to normal incidence for an exemplary spectral filter, according to some embodiments.

FIG. 2-7C is a plot of optical rejection versus wavelength for an exemplary spectral filter, according to some embodiments.

FIG. 3-1A is a top planar view of an integrated device having a polarization filter, according to some embodiments.

FIG. 3-1B is a cross-sectional view of an integrated device having a polarization filter, according to some embodiments.

FIGS. 3-2A and 3-2B are plots of optical power and electric field of transverse electric light having a characteristic wavelength of 532 nm through a cross-sectional integrated device having no polarization filter, according to some embodiments.

FIGS. 3-2C and 3-2D are plots of optical power and electric field of transverse magnetic light having a characteristic wavelength of 532 nm through a cross-sectional integrated device having no polarization filter, according to some embodiments.

FIGS. 3-3A and 3-3B are plots of optical power and electric field, respectively, of transverse electric light having a characteristic wavelength of 532 nm through a cross-sectional integrated device having a polarization filter, according to some embodiments.

FIGS. 3-3C and 3-3D are plots of optical power and electric field, respectively, of transverse magnetic light having a characteristic wavelength of 532 nm through a cross-sectional integrated device having a polarization filter, according to some embodiments.

FIG. 4-1A is a cross-sectional view of an integrated device having multiple spatial filters, according to some embodiments.

FIGS. 4-1B, 4-1C, 4-1D, 4-1E, and 4-1F are planar views of pixels in an integrated device illustrating exemplary spatial filter openings, according to some embodiments.

FIG. 4-2 is a cross-sectional view of layers of a spatial filter, according to some embodiments.

FIGS. 4-3A and 4-3B are plots of absorption versus angle and wavelength, respectively, for an exemplary spatial filter.

FIGS. 4-3C and 4-3D are plots of reflection versus angle and wavelength, respectively, for an exemplary spatial filter.

FIG. 4-3E is a plot of reflection versus angle for two exemplary spatial filters for light having a characteristic wavelength of 532 nm.

FIG. 4-3F is a plot of reflection versus angle for two exemplary spatial filters for light having a characteristic wavelength of 532 nm.

FIG. 4-3G is a plot of reflection versus angle for this spatial filter in comparison to a standard CMOS metal layer for light having a characteristic wavelength of 532 nm.

FIG. 4-4 is a cross-sectional view of an integrated device having multiple spatial filters and a spectral filter, according to some embodiments.

FIGS. 4-5A is a cross-sectional view of the integrated device shown in FIG. 4-4 and plots propagation of optical power of 532 nm light, according to some embodiments.

FIGS. 4-5B is a cross-sectional view of the integrated device shown in FIG. 4-4 and plots propagation of optical power of 575 nm light, according to some embodiments.

FIGS. 4-6 is a cross-sectional view of an integrated device having a spectral filter and a metal layer configured to act as a spatial filter and plots propagation of optical power of 532 nm light, according to some embodiments.

FIG. 4-7 is a cross-sectional view of an integrated device having vertical absorbing sidewalls, according to some embodiments.

FIGS. 4-8A-4-8F illustrate exemplary fabrication steps used to form vertical absorbing sidewalls, according to some embodiments.

FIG. 4-9A is a cross-sectional view of an integrated device having vertical absorbing sidewalls, according to some embodiments.

FIG. 4-9B is a cross-sectional view of an integrated device having vertical absorbing sidewalls, according to some embodiments.

FIG. 4-9C is a cross-sectional view of an integrated device having vertical absorbing sidewalls, according to some embodiments.

FIG. 4-10A is a cross-sectional view of an integrated device having vertical absorbing sidewalls, according to some embodiments.

FIG. 4-10B is a cross-sectional view of an integrated device having regions of high dielectric material within individual pixels, according to some embodiments.

FIG. 5-1 is a block diagram of an integrated device and an instrument, according to some embodiments.

FIG. 5-2A is a block diagram depiction of an instrument, according to some embodiments.

FIG. 5-2B is plot of a train of optical pulses, according to some embodiments.

FIG. 5-3 is a schematic of parallel sample wells that may be excited optically by a pulsed laser via one or more waveguides and corresponding detectors for each sample well, according to some embodiments.

FIG. 5-4 is a plot of optical power depicting optical excitation of a sample well from a waveguide, according to some embodiments.

FIG. 5-5 is a schematic of a pixel having a sample well, optical waveguide, and time-binning photodetector, according to some embodiments.

FIG. 5-6 is a schematic of an exemplary biological reaction that may occur within a sample well, according to some embodiments.

FIG. 5-7 is a plot of emission probability curves for two different fluorophores having different decay characteristics.

FIG. 5-8 is a plot of time-binning detection of fluorescent emission, according to some embodiments.

FIG. 5-9A is an exemplary time-binning photodetector, according to some embodiments.

FIG. 5-9B is an exemplary time-binning photodetector, according to some embodiments.

FIG. 5-10A is a schematic illustrating pulsed excitation and time-binned detection of fluorescent emission from a sample, according to some embodiments.

FIG. 5-10B is a histogram of accumulated fluorescent photon counts in various time bins after repeated pulsed excitation of a sample, according to some embodiments.

FIG. 5-11A-5-11D are different histograms that may correspond to the four nucleotides (T, A, C, G) or nucleotide analogs, according to some embodiments.

DETAILED DESCRIPTION

I. Introduction

Figures 1, 1A:
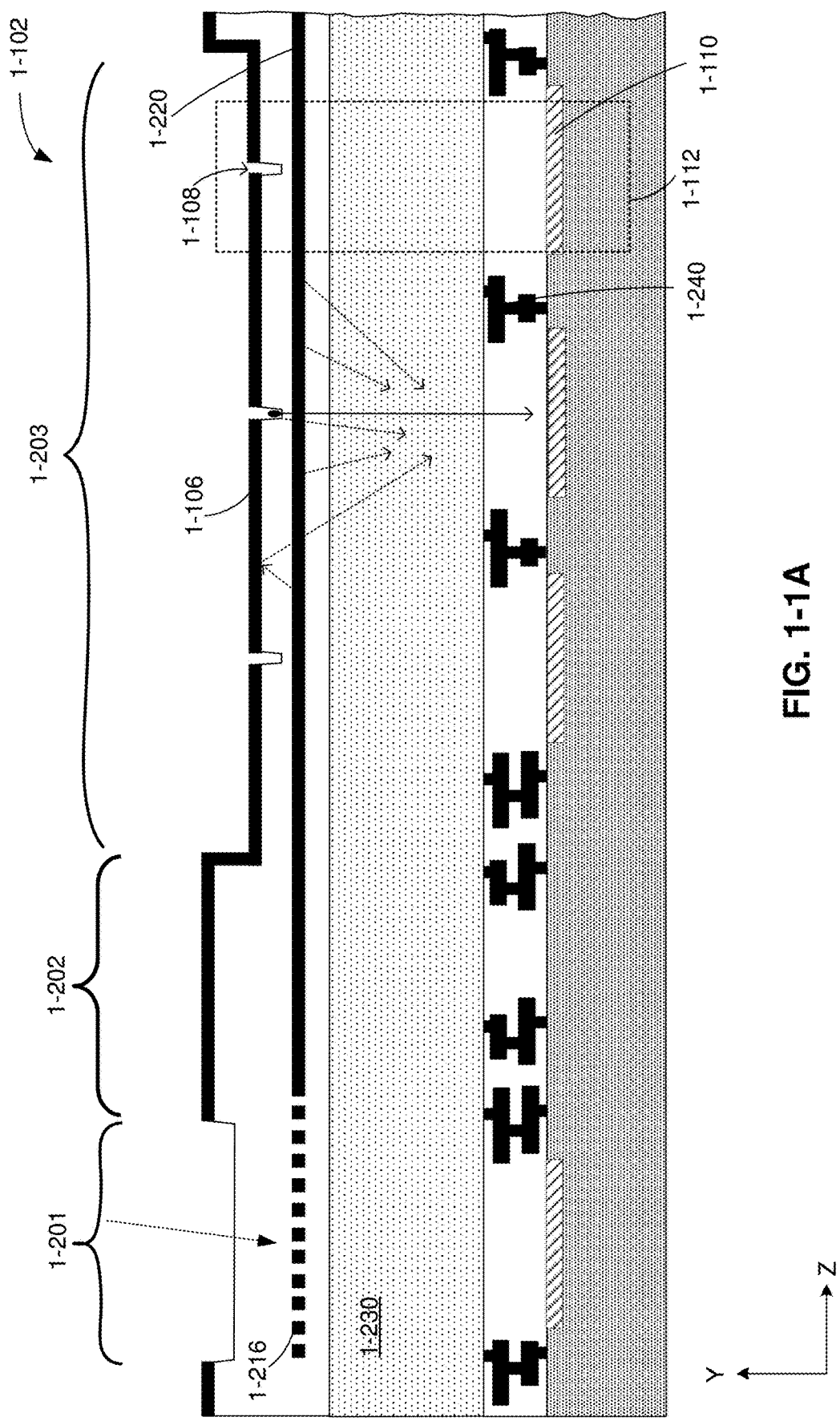
FIG. 1-1A is a schematic of an integrated device, according to some embodiments.

Aspects of the present application relate to integrated devices, instruments and related systems capable of analyzing samples in parallel, including identification of single molecules and nucleic acid sequencing. Such an instrument may be compact, easy to carry, and easy to operate, allowing a physician or other provider to readily use the instrument and transport the instrument to a desired location where care may be needed. Analysis of a sample may include labeling the sample with one or more fluorescent markers, which may be used to detect the sample and/or identify single molecules of the sample (e.g., individual nucleotide identification as part of nucleic acid sequencing). A fluorescent marker may become excited in response to illuminating the fluorescent marker with excitation light (e.g., light having a characteristic wavelength that may excite the fluorescent marker to an excited state) and, if the fluorescent marker becomes excited, emit emission light (e.g., light having a characteristic wavelength emitted by the fluorescent marker by returning to a ground state from an excited state). Detection of the emission light may allow for identification of the fluorescent marker, and thus, the sample or a molecule of the sample labeled by the fluorescent marker. According to some embodiments, the instrument may be capable of massively-parallel sample analyses and may be configured to handle tens of thousands of samples or more simultaneously.

The inventors have recognized and appreciated that an integrated device, having sample wells configured to receive the sample and integrated optics formed on the integrated device, and an instrument configured to interface with the integrated device may be used to achieve analysis of this number of samples. The instrument may include one or more excitation light sources, and the integrated device may interface with the instrument such that the excitation light is delivered to the sample wells using integrated optical components (e.g., waveguides, optical couplers, optical splitters) formed on the integrated device. The optical components may improve the uniformity of illumination across the sample wells of the integrated device and may reduce a large number of external optical components that might otherwise be needed. Furthermore, the inventors have recognized and appreciated that integrating photodetectors on the integrated device may improve detection efficiency of fluorescent emissions from the sample wells and reduce the number of light-collection components that might otherwise be needed.

Challenges may arise in detecting photons of the fluorescent emission because a fluorescent marker only emits a single photon at a time. To reliably excite a fluorescent marker, excitation light coupled into the integrated device and delivered to individual sample wells may be at such a high power level that photons of excitation light may negatively impact the efficiency of a photodetector of the integrated device to detect emission light because the photodetector may become saturated with excitation photons, which can generate noise in the overall detection signal of the emission light. The inventors have recognized and appreciated that techniques used to reduce or remove the impact of excitation light from the detection signals generated by the photodetectors of the integrated device may improve detection of emission light, and thus, sample analysis. Such techniques may reject some or all of the excitation light from contributing to a signal generated by the photodetectors. For detection of a single photon of emission light by a photodetector, between hundreds and millions of photons of excitation light may need to be rejected by the photodetector and/or from reaching the photodetector, according to some embodiments.

The inventors have further recognized and appreciated that including photonic structures formed on the integrated device, positioned between the sample wells and the photodetectors, and configured to attenuate excitation light relative to emission light may contribute to improved detection of emission photons. Such photonic structures may act to attenuate the amount of excitation light that reaches the photodetectors by using one or more properties to manipulate light, including absorption, reflection, and refraction of the excitation light. These types of photonic structures may be referred to as "optical rejection" photonic structures because some or all of the excitation light is prevented from reaching the photodetectors.

The integrated device may include multiple waveguides configured to deliver excitation light to some or all of the sample wells. The waveguides may be configured to couple with a beam of excitation light via one or more optical components (e.g., grating coupler, optical splitter) of the integrated device and optically couple with sample well(s). In some embodiments, a waveguide may couple with a row of sample wells positioned proximate to the waveguide. Photonic structure(s) configured to attenuate the excitation light may be formed between a waveguide and photodetector(s). The photonic structure(s) may provide optical rejection of some or all excitation light scattered from a waveguide, which might otherwise reach photodetector(s) and impact detection efficiency of photons of emission light. Excitation light scattered from a waveguide may propagate in multiple directions, including over a wide angular region from the waveguide. In contrast, emission light from a sample well may propagate substantially along the direction between the sample well and corresponding photodetector(s). Accordingly, some photonic structure(s) of the present application take advantage in this difference in directionality between the scattered excitation light and the emission light by being configured to block some or all light propagating towards an individual photodetector at a particular angle or a particular range of angles. In some embodiments, an optical rejection photonic structure may allow transmission of light that is substantially normal incident to a photodetector while attenuate or block light that is incident to a photodetector substantially at an angle from normal to the photodetector (e.g., 45° from normal incidence).

One type of photonic structure which may be formed in an integrated device is a spectral filter. The spectral filter may selectively absorb, reflect, and/or reject light incident to the spectral filter based on the wavelength(s) of the light (e.g., a characteristic wavelength of the light, a band of wavelengths of the light). The wavelength(s) the spectral filter preferentially absorbs or rejects may correspond to characteristic wavelength(s) of the excitation light used to excite one or more fluorescent markers that label a sample. Suitable types of spectral filters may include color absorbing filters, notch rejection filters, bandpass filters, and long pass filters.

Another type of optical rejection photonic structure which may be formed in an integrated device is a polarization filter. The polarization filter may act to reduce or prevent transmission of light having a particular type of polarization. In this manner, the polarization filter may attenuate polarized light relative to unpolarized light. For example, a waveguide may propagate excitation light having a particular type of polarization (e.g., transverse electric (TE) polarization, transverse magnetic (TM) polarization). In contrast, light emitted by a fluorescent marker may be unpolarized or have a different type of polarization than the excitation light. A polarization filter integrated in an integrated device may act to attenuate the polarized excitation light, including scattered excitation light, while allowing some or most of the emission light to pass through the polarization filter. In some embodiments, a waveguide of the integrated device may be configured to propagate excitation light having TE polarization, and the integrated device may have a polarization filter configured to attenuate TE polarized light such that some or all of the excitation light incident to the polarization filter does not pass through the polarization filter. Although the polarization filter may attenuate emission light to some degree, incorporating a polarization filter into an integrated device may provide benefits over other optical rejection photonic structures, including ease of fabrication and desired optical rejection of light incident to the polarization filter over a range of angles.

A third type of optical rejection photonic structure which may be formed in an integrated device is a spatial filter. The spatial filter may include one or more iris structures, which may include one or more layers of material that act to absorb some or all incident light and one or more openings that allow light to pass through. The opening(s) may be positioned to overlap with sample well(s) and respective photodetector(s) to allow transmission of emission light through the spatial filter. The spatial filter may act to block stray excitation light and reduce cross-talk among neighboring photodetectors. In some embodiments, one or more metal layers of the integrated device may act as a spatial filter. The one or more metal layers may also act as circuitry of the integrated device (e.g., circuits electrically coupled to the photodetectors). The one or more metal layers may be formed using suitable complementary metal-oxide-semiconductor (CMOS) fabrication techniques.

One or more optical rejection photonic structures may be used in combination with other techniques for improving detection of emission light by an integrated device. According to some embodiments, the photodetectors of the integrated device may be configured to discard charge carriers produced by photons of excitation light. Detection of fluorescent emissions by a photodetector may occur after a time period corresponding to a pulse of excitation light when the photodetector may become saturated by photons of excitation light. Also, the inventors have recognized and appreciated that using a pulsed excitation source that turns off quickly (e.g., in less than 500 ps from a peak value) may allow for improved detection of emission light from the sample wells by detecting the emission light at a time after excitation when there is a sufficient fluorescent light level to be detected without having substantial noise signal from the excitation light. For example, detection of emission light may occur at a time when a photodetector is not saturated by excitation light. Such techniques that include timing of the pulsed excitation source and the photodetector(s) of the integrated device to reduce the impact of excitation light on detection efficiency of photons of emission light may be referred to as types of "electrical rejection" techniques. Combining optical rejection photonic structure(s) with such electrical rejection techniques may allow for reduced cross-talk signals between neighboring pixels, which may allow for individual pixels of the integrated device to occupy a smaller area footprint than if the optical rejection photonic structure(s) or the electrical rejection techniques were implemented alone. In some instances, combining optical rejection photonic structure(s) with such electrical rejection techniques may allow for more efficient transmission of emission light to the photodetectors, which may enable a larger signal-to-noise ratio than if the optical rejection photonic structure(s) or the electrical rejection techniques were implemented alone.

Other techniques to improve the emission signal may include techniques for increasing the intensity of the emission light. In some embodiments, a sample may be labeled with more than one fluorescent marker such that multiple photons of emission light may be emitted from a labeled sample after a pulse of excitation light. For example, a sample labeled with multiple fluorescent markers of the same type may emit multiple photons of emission light in response being illuminated by a pulse of excitation light. Additionally or alternatively, a fluorescent marker may be selected for one or more characteristics that may improve rejection of excitation light. One characteristic is the lifetime of the fluorescent marker. Using fluorescent marker(s) that have longer lifetimes may provide for improved rejection of excitation light because the time period when the photodetectors discard charge carriers produced by excitation light can be extended while still allowing for a time period to collect photons of emission light. Another characteristic of a fluorescent marker is its Stokes shift, or wavelength separation between a characteristic absorption wavelength (which may correspond to a characteristic wavelength of the excitation light) of a fluorescent marker and a characteristic emission wavelength (which may correspond to the emission light). Fluorescent markers that have larger Stokes shift may allow for greater rejection of excitation light, particularly when integrating one or more spectral filters in an integrated device.

II. Integrated Device

A. Overview

A cross-sectional schematic of integrated device 1-102 illustrating a row of pixels 1-112 is shown in FIG. 1-1A. Integrated device 1-102 may include coupling region 1-201, routing region 1-202, and pixel region 1-203. Pixel region 1-203 may include a plurality of pixels 1-112 having sample wells 1-108 positioned on a surface at a location separate from coupling region 1-201, which is where excitation light (shown as the dashed arrow) couples to integrated device 1-102. Sample wells 1-108 may be formed through metal layer(s) 1-106. One pixel 1-112, illustrated by the dotted rectangle, is a region of integrated device 1-102 that includes a sample well 1-108 and photodetector region having one or more photodetectors 1-110.

FIG. 1-1A illustrates the path of excitation (shown in dashed lines) by coupling a beam of excitation light to coupling region 1-201 and to sample wells 1-108. The row of sample wells 1-108 shown in FIG. 1-1A may be positioned to optically couple with waveguide 1-220. Excitation light may illuminate a sample located within a sample well. The sample may reach an excited state in response to being illuminated by the excitation light. When a sample is in an excited state, the sample may emit emission light, which may be detected by one or more photodetectors associated with the sample well. FIG. 1-1A schematically illustrates the path of emission light (shown as the solid line) from a sample well 1-108 to photodetector(s) 1-110 of pixel 1-112. The photodetector(s) 1-110 of pixel 1-112 may be configured and positioned to detect emission light from sample well 1-108. Examples of suitable photodetectors are described in U.S. patent application Ser. No. 14/821,656 titled "INTEGRATED DEVICE FOR TEMPORAL BINNING OF RECEIVED PHOTONS," which is incorporated by reference in its entirety. For an individual pixel 1-112, a sample well 1-108 and its respective photodetector(s) 1-110 may be aligned along a common axis (along the y-direction shown in FIG. 1-1A). In this manner, the photodetector(s) may overlap with the sample well within a pixel 1-112.

The directionality of the emission light from a sample well 1-108 may depend on the positioning of the sample in the sample well 1-108 relative to metal layer(s) 1-106 because metal layer(s) 1-106 may act to reflect emission light. In this manner, a distance between metal layer(s) 1-106 and a fluorescent marker positioned in a sample well 1-108 may impact the efficiency of photodetector(s) 1-110, that are in the same pixel as the sample well, to detect the light emitted by the fluorescent marker. The distance between metal layer(s) 1-106 and the bottom surface of a sample well 1-106, which is proximate to where a sample may be positioned during operation, may be in the range of 100 nm to 500 nm, or any value or range of values in that range. In some embodiments the distance between metal layer(s) 1-106 and the bottom surface of a sample well 1-106 is approximately 300 nm.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a sample well 1-106 and photodetector(s) may be in the range of 1.5 µm to 15 µm, or any value or range of values in that range. In some embodiments, the distance between a sample well and photodetector(s) may be less than 10 microns. In some embodiments, the distance between a sample well and photodetector(s) may be less than 5 microns. In some embodiments, the distance between a sample well and photodetector(s) may be between 1.5 microns and 5 microns.

Photonic structure(s) 1-230 may be positioned between sample wells 1-108 and photodetectors 1-110 and configured to reduce or prevent excitation light from reaching photodetectors 1-110, which may otherwise contribute to signal noise in detecting emission light. As shown in FIG. 1-1A, the one or more photonic structures 1-230 may be positioned between waveguide 1-220 and photodetectors 1-110. Photonic structure(s) 1-230 may include one or more optical rejection photonic structures including a spectral filter, a polarization filter, and a spatial filter. Photonic structure(s) 1-230 may be positioned to align with individual sample wells 1-108 and their respective photodetector(s) 1-110 along a common axis. Metal layers 1-240, which may act as a circuitry for integrated device 1-102, may also act as a spatial filter, in accordance with some embodiments. In such embodiments, one or more metal layers 1-240 may be positioned to block some or all excitation light from reaching photodetector(s) 1-110.

Figures 1, 1B:
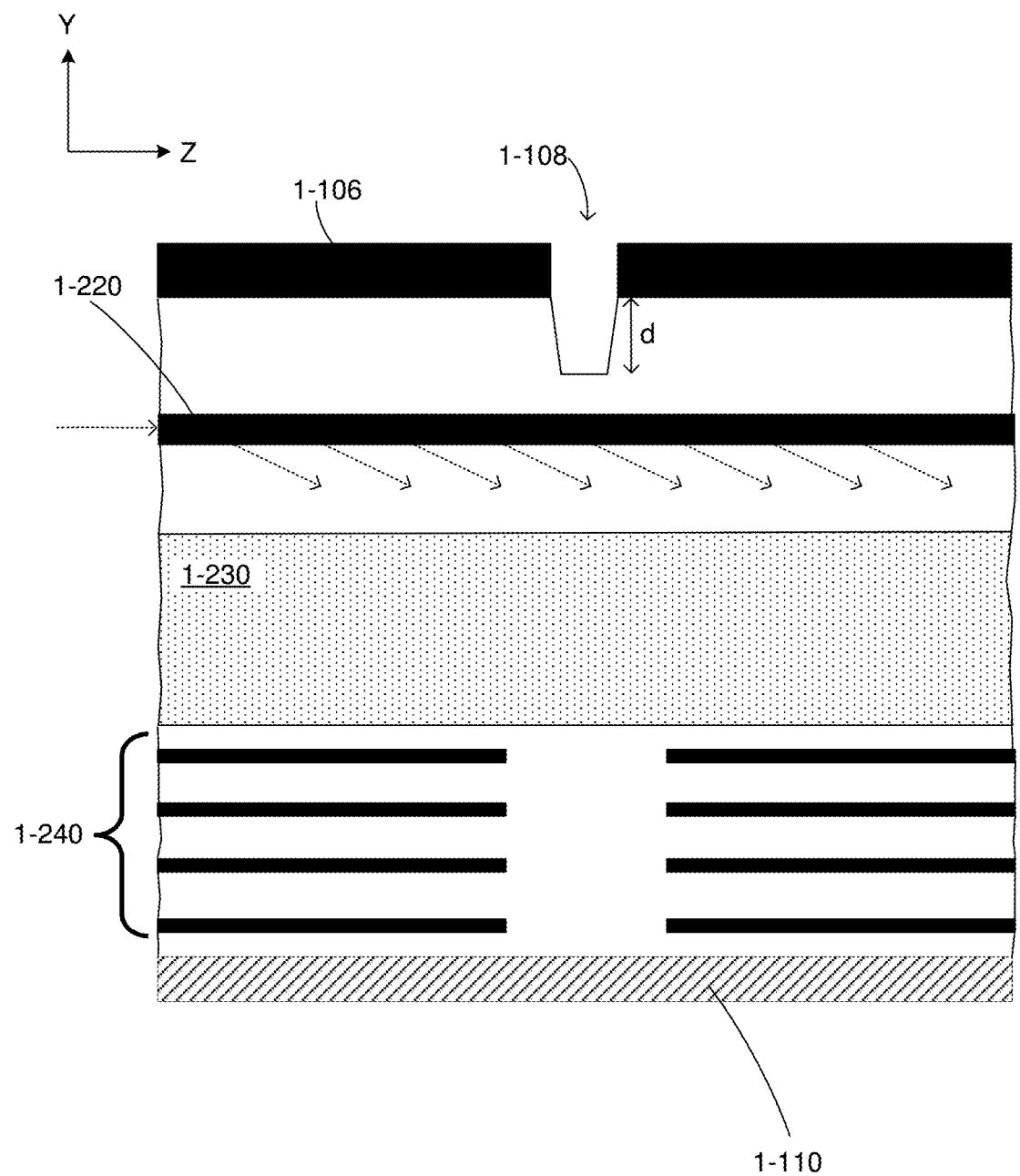

FIG. 1-1B illustrates a cross-sectional view of a pixel 1-112 of integrated device 1-102. Excitation light may propagate along waveguide 1-220, as shown by the dashed line at the left in FIG. 1-1B. As excitation light propagates along waveguide 1-220, scattering of some excitation light may occur. The scattered excitation light may have a particular directionality relative to the direction of light propagation along waveguide 1-220 and/or relative to a normal direction to photonic structure(s) 1-230 (e.g., along the y-direction shown in FIG. 1.1B). Light scattered off of waveguide 1-220 may be at a particular angle or range of angles relative to normal to photonic structure(s) 1-230, as shown by the dashed lines shown in FIG. 1-1B. The angle(s) of the scattered light may depend on one or more characteristics of the integrated device 1-102 including the refractive index of waveguide 1-220, the refractive index of the material surrounding waveguide 1-220, and a dimension of waveguide 1-220 perpendicular to propagation of light (e.g., waveguide width, waveguide height, such as along the y-direction). For example, in waveguide designs where there is a high refractive index contrast between waveguide 1-220 and the surrounding material (e.g., dielectric), light propagating along waveguide 1-220 may scatter at a higher angle than for waveguide designs having a lower refractive index contrast. In some embodiments, photonic structure(s) 1-230 may be configured to block or reduce transmission of excitation light that is incident to photonic structure(s) 1-230 at the angle(s) of scattered excitation light. In this manner, photonic structure(s) 1-230 may account for the scattered excitation light associated with a particular waveguide design. For example, excitation light scattered off of waveguide 1-220 may have a direction in the range of approximately 50° to 60° from normal to photonic structure(s) 1-230. Photonic structure(s) 1-230 may be configured to substantially block or reduce transmission of excitation light over this range of angles. In some embodiments, photonic structure(s) 1-230 may include a spectral filter configured to reduce transmission of excitation light over a range of 40° to 70° from normal to the spectral filter, which may act to block at least some of the excitation light scattered off of waveguide 1-220.

Coupling region 1-201 may include one or more optical components configured to couple excitation light from an external excitation source. Coupling region 1-201 may include grating coupler 1-216 positioned to receive some or all of a beam of excitation light. Examples of suitable grating couplers are described in U.S. Pat. Application 62/435,693 titled "OPTICAL COUPLER AND WAVEGUIDE SYSTEM," which is incorporated by reference in its entirety. Grating coupler 1-216 may couple excitation light to waveguide 1-220, which may be configured to propagate excitation light to the proximity of one or more sample wells 1-108. Alternatively, coupling region 1-201 may comprise other well-known structures for coupling light into a waveguide.

Components located off of the integrated device may be used to position and align the excitation source 1-106 to the integrated device. Such components may include optical components including lenses, mirrors, prisms, windows, apertures, attenuators, and/or optical fibers. Additional mechanical components may be included in the instrument to allow for control of one or more alignment components. Such mechanical components may include actuators, stepper motors, and/or knobs. Examples of suitable excitation sources and alignment mechanisms are described in U.S. patent application Ser. No. 15/161,088 titled "PULSED LASER AND SYSTEM," which is incorporated by reference in its entirety. Another example of a beam-steering module is described in U.S. Pat. Application 62/435,679 titled "COMPACT BEAM SHAPING AND STEERING ASSEMBLY," which is incorporated herein by reference in its entirety.

A sample to be analyzed may be introduced into sample well 1-108 of pixel 1-112. The sample may be a biological sample or any other suitable sample, such as a chemical sample. The sample may include multiple molecules and the sample well may be configured to isolate a single molecule. In some instances, the dimensions of the sample well may act to confine a single molecule within the sample well, allowing measurements to be performed on the single molecule. Excitation light may be delivered into the sample well 1-108, so as to excite the sample or at least one fluorescent marker attached to the sample or otherwise associated with the sample while it is within an illumination area within the sample well 1-108.

In operation, parallel analyses of samples within the sample wells are carried out by exciting some or all of the samples within the wells using excitation light and detecting signals from sample emission with the photodetectors. Emission light from a sample may be detected by a corresponding photodetector and converted to at least one electrical signal. The electrical signals may be transmitted along conducting lines (e.g., metal layers 1-240) in the circuitry of the integrated device, which may be connected to an instrument interfaced with the integrated device. The electrical signals may be subsequently processed and/or analyzed. Processing or analyzing of electrical signals may occur on a suitable computing device either located on or off the instrument.

B. Spectral Filter

Photonic structure(s) 1-230 may include one or more spectral filters configured to attenuate excitation light relative to emission light by selectively having a higher transmission level for emission light than excitation light. In some embodiments, a fluorescent marker used to label a sample may be configured to emit light having a wavelength in the range of 550 nm to 650 nm, or any value or range of values in that range. Excitation light used to excite the fluorescent marker may have a lower wavelength (e.g., 515 nm, 532 nm). A spectral filter included in the integrated device may be configured to have a high level of transmission of the emission light while a low level of transmission of the excitation light. In embodiments where the spectral filter attenuates shorter wavelengths (e.g., excitation light) and transmits longer wavelengths (e.g., emission light), the spectral filter may be considered a long pass filter. A spectral filter may be configured to attenuate excitation light over a wide range of angles incident to the spectral filter, which may provide optical rejection of some or all excitation light scattered in many directions from a waveguide and/or sample well. In some embodiments, a spectral filter may be configured to have a low level of transmission of excitation light over a range of angles from normal incidence (along the y-direction shown in FIG. 1-1A) to the spectral filer (e.g., 0° to) 45°. In some embodiments, a spectral filter may be configured to provide a low level of transmission of a particular polarization of light over a range of angles. Such a filter may provide substantially enhanced rejection of polarized excitation light, including light scattered from a waveguide.

A spectral filter may include a plurality of layers, which may be referred to as a stack of layers. The stack of layers that form a spectral filter may include alternating layers of a high index of refraction material and a low index of refraction material. A low index refraction material may have an index of refraction in the range of 1.40 to 1.55, or any value or range of values in that range. A high index of refraction material may have an index of refraction greater than 1.7. An example of a low index of refraction material that may be used in a spectral filter is silicon dioxide ($SiO_2$). Examples of high index of refraction materials that may be used in a spectral filter include $Ta_2O_5$, $Nb_2O_5$, $TiO_2$, $Al_2O_3$, silicon-rich oxide (SRO), and amorphous Si (a-Si). In some embodiments, low and high index of refraction materials may be selected to achieve desired optical properties of the resulting spectral filter while achieving a particular overall thickness of the stack of layers. For example, selecting a combination of low and high index of refraction materials to have a higher contrast (e.g., the difference between the low refractive index material and the high refractive index material), may allow for a thinner stack than a combination of low and high index of refraction materials with a low contrast. A thinner stack of the spectral filter may provide improved collection of emission light by one or more photodetectors. In some instances, a thinner stack may be desired to facilitate fabrication of the spectral filter and the resulting integrated device. A spectral filter may be formed of materials to allow for fabrication of other components of the integrated device without significantly decreasing the integrity and performance of the spectral filter. In some instances, the spectral filter may be substantially thermally stable up to approximately 400° C. Any fabrication techniques suitable for silicon-based photonic devices (e.g., complementary metal-oxide-semiconductor (CMOS) fabrication) may be used to form a spectral filter. In some embodiments, plasma-enhanced chemical vapor deposition (PECVD) can be used to form a spectral filter, such as filters that include $SiO_2$, SiN, SiON, a-Si, SiC, and combinations thereof. In some embodiments, a spectral filter may be formed by physical vapor deposition (PVD) or sputtering, which may allow for the ability to deposit metal oxide materials with suitable control of film thickness and/or optical properties. In some embodiments, ion-beam sputtering (IBS) or ion-beam deposition (IBD) may be used to form a spectral filter, and such techniques may allow for the formation of very dense optical films. Many filter stack materials exhibit significant film stress when deposited on a wafer, and this film stress can cause distortion of the wafer that may hinder subsequent processing (e.g. photolithography). Wafer distortion due to film stress can be minimized or reduced by annealing the wafer, or by coating the backside of the wafer with a film that substantially compensates for the film stress.

Figures 1A, 2:
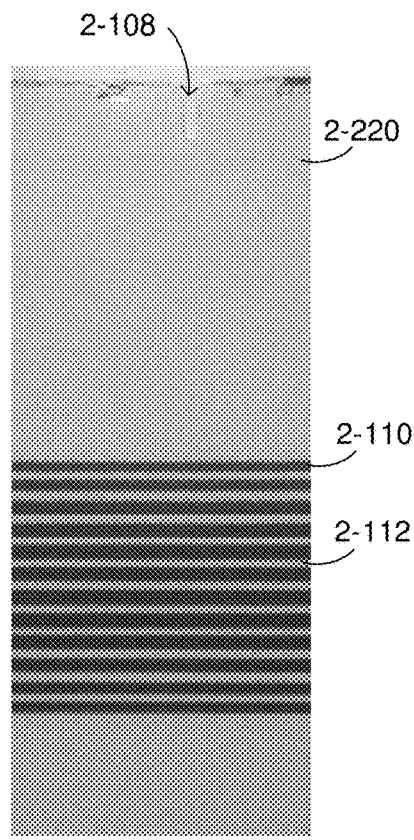
Figures 1B, 2:
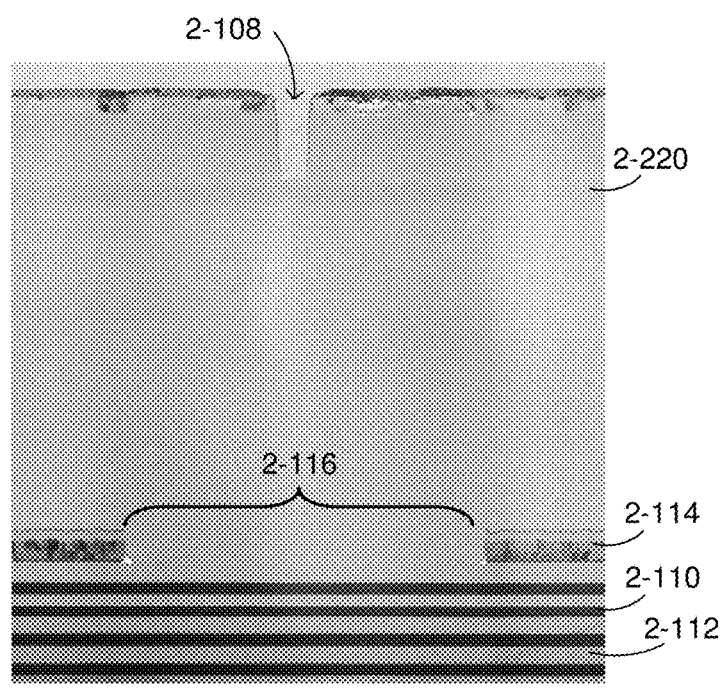

A spectral filter may include a number of layers of alternating high and low index of refraction materials in the range of 2 to 45 layers, or any number or range of numbers in that range. The thickness of individual layers in the spectral filter may vary such that an individual layer may have a thickness in the range of 20 nm to 300 nm, or any value or range of values in that range. The total thickness of the layers in a spectral filter may be in the range of 0.1 micron to 3 microns, or any value or range of values in that range. FIG. 2-1A is a cross-sectional image of an exemplary fabricated integrated device having sample well 2-108, waveguide 2-220, and spectral filter formed of alternating layers of high index of refraction material 2-110 and low index of refraction material 2-112. As described herein, some embodiments of the integrated device may include a spatial filter with an iris structure having openings that overlap with the individual sample wells. FIG. 2-1B is a cross-sectional image of an exemplary fabricated integrated device having sample well 2-108, waveguide 2-220, spectral filter formed of alternating layers of high index of refraction material 2-110 and low index of refraction material 2-112, and spatial filter 2-114 having opening 2-116.

Figures 2, 2A, 2B:
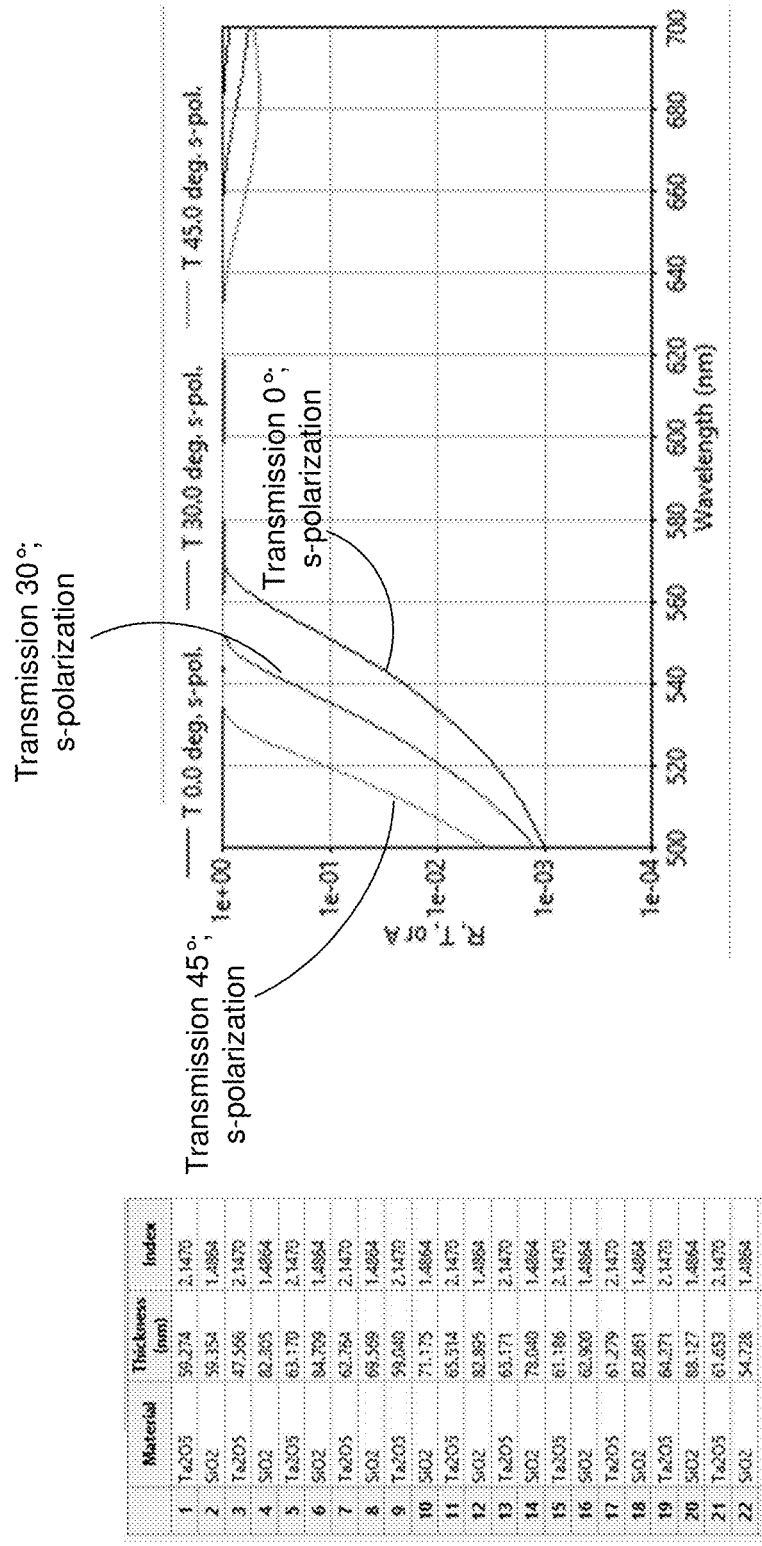

In some embodiments, a spectral filter may include alternating layers of $Ta_2O_5$ and $SiO_2$. FIG. 2-2A shows a table of the material, thickness, and index of refraction of individual layers included in an exemplary spectral filter having 23 layers and a total thickness of approximately 1466 nm. FIG. 2-2B is a plot of transmission versus wavelength for the spectral filter described in the table of FIG. 2-2A. The plot of transmission versus wavelength shown in FIG. 2-2B shows that this type of spectral filter has lower transmission for wavelengths of light in the range 500 nm to 540 nm over a range of angles incident to the spectral filter, including angles in the range of 0° to 45° from normal to the spectral filter. Another example of a spectral filter has 37 alternating layers of $Ta_2O_5$ and $SiO_2$ and a total thickness of approximately 2498 nm, as shown with reference to FIG. 2-3A and FIG. 2-3B. The increased thickness may account for decreased transmission of at lower wavelengths in contrast to the spectral filter of FIGS. 2-2A and 2-2B.

In some embodiments, a spectral filter may include alternating layers of $TiO_2$ and $SiO_2$. FIG. 2-4A shows a table of the material, thickness, and index of refraction of individual layers included in an exemplary spectral filter having 25 layers and a total thickness of approximately 1550 nm. In this example, the high index of refraction layers include $TiO_2$ and have an index of refraction of approximately 2.36 at a wavelength of 532 nm. FIG. 2-4B is a plot of transmission versus wavelength for the spectral filter described in the table of FIG. 2-4A. The plot of transmission versus wavelength shown in FIG. 2-4B shows that this type of spectral filter has lower transmission for wavelengths of light in the range 500 nm to 540 nm over a range of angles incident to the spectral filter, including angles in the range of 0° to 45° from normal to the spectral filter. Another example of a spectral filter has 23 alternating layers of $TiO_2$ and $SiO_2$ and a total thickness of approximately 1252 nm, as shown with reference to FIG. 2-5A and FIG. 2-5B. In this example, the high index of refraction layers include $TiO_2$ and have an index of refraction of approximately 2.75 at a wavelength of 532 nm. The higher index of refraction may allow for a thinner thickness of spectral filter in contrast to the spectral filter of FIGS. 2-4A and 2-4B.

FIG. 2-6 is a plot of transmission at normal incidence versus wavelength comparing the spectral filter described by FIGS. 2-3A and 2-3B and the spectral filter described by FIGS. 2-4A and 2-4B. As shown in FIG. 2-6, both spectral filters have decreased transmission of light at lower wavelengths (e.g., at wavelengths 515 nm and 532 nm), which may correspond to a characteristic wavelength or band of wavelengths of excitation light according to some embodiments.

In some embodiments, a spectral filter may include alternating layers of $Nb_2O_5$ and $SiO_2$. FIG. 2-7A shows a table of the thickness of individual layers included in an exemplary spectral filter having 23 layers. In this example, the high index of refraction layers include $Nb_2O_5$ and have an index of refraction of approximately 2.358 at a wavelength of 532 nm. FIG. 2-7B is a plot of optical density of transmittance of s-polarized light (TE light) versus angle relative to normal for the spectral filter described in the table of FIG. 2-7A at wavelengths 532 nm, which may correspond to excitation light, and 575 nm, which may correspond to emission light. The plot of optical density versus angle shown in FIG. 2-7B shows that this type of spectral filter has higher optical rejection, resulting in lower transmission, for 532 nm light than for 575 nm light over a range of approximately 50° to approximately 60° from normal to the spectral filter. Such a spectral filter may allow for optical rejection of excitation light that is scattered off of a waveguide within this range of angles. FIG. 2-7C is a plot of optical density of transmittance versus wavelength for the spectral filter described in the table of FIG. 2-7A for angles 0° and 55° from normal to the spectral filter. As shown in FIG. 2-7C, there is low optical rejection, resulting in high transmission, of wavelengths of light at both 0° and 55° in the range of 560 nm to 600 nm in comparison to wavelengths at less than 560 nm. Such a spectral filter may allow for a desired level of optical rejection of excitation light with a wavelength less than 560 nm while having a desired level of transmission of emission light within the range of approximately 560 nm to 600 nm.

C. Polarization Filter

Figures 2, 3, 3A, 3B:
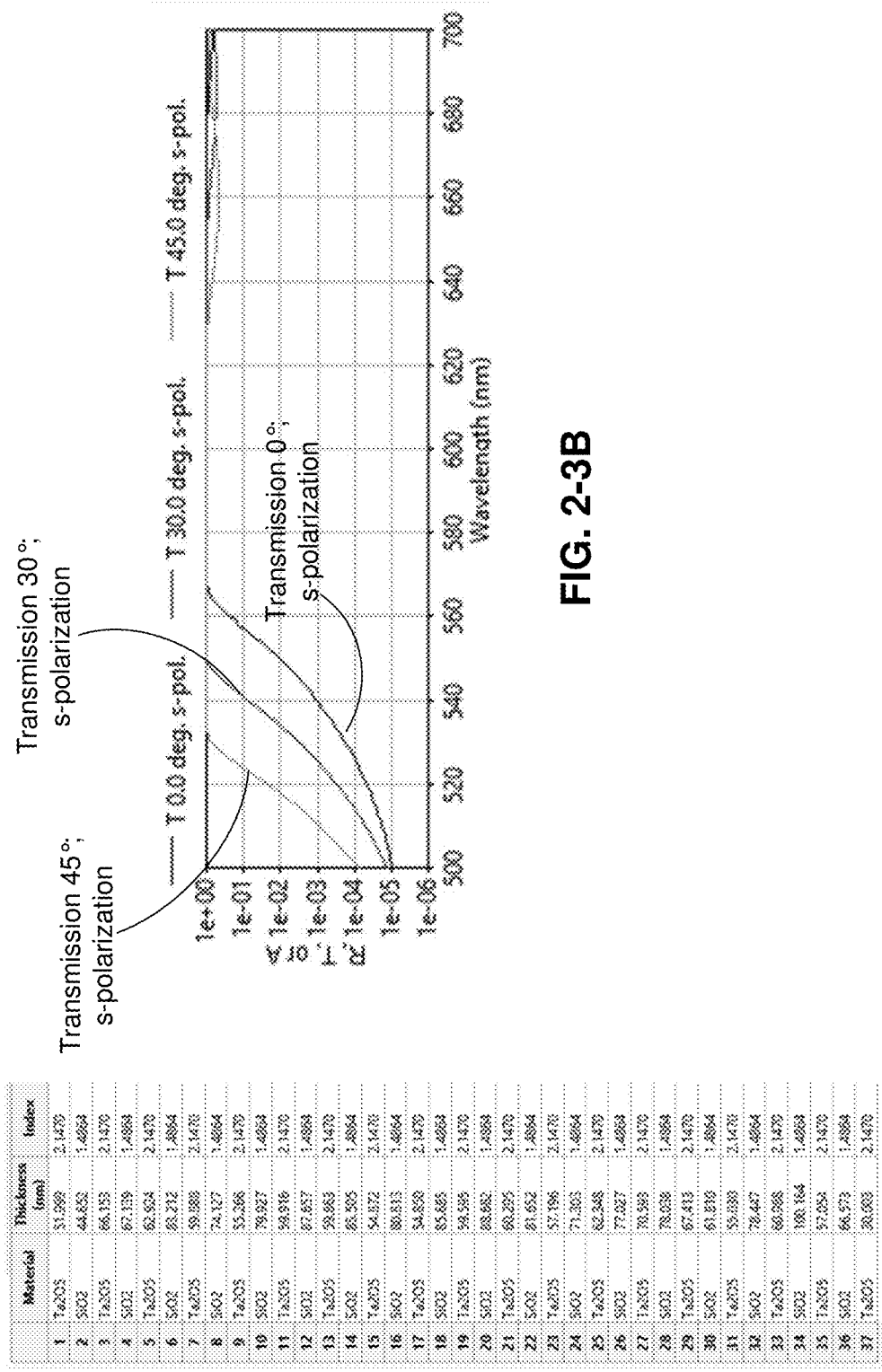

Photonic structure(s) 1-230 may include one or more polarization filters configured to selectively attenuate light having a particular type of polarization, which may correspond to the polarization of the excitation light according to some embodiments. Unpolarized light, or randomly polarized light such as photons emitted by a randomly oriented fluorescent marker, may at least partially pass through the polarization filter. Excitation light in a waveguide may be substantially polarized, and this excitation light may excite a fluorescent marker. The excitation of the fluorescent marker may depend on the orientation of the marker with respect to the polarization of the excitation light. The emission light from the fluorescent marker may have a different polarization than the excitation light. In addition, the fluorescent marker may or may not change orientation between excitation and emission events. A polarization filter may include a slit array, at least in regions of the integrated device that overlap with individual sample wells. FIG. 3-1A shows a planar view of an integrated device having sample wells 3-108 positioned proximate to waveguide 3-220 and polarization filter 3-230 having slit array positioned underneath waveguide 3-220. FIG. 3-1B shows a cross-sectional view of the integrated device shown in FIG. 3-1A and shows polarization filter 3-230 positioned between sample wells 3-108 and photodetectors 3-110. In some embodiments, polarization filter 3-230 may include slit array regions associated with individual sample wells 3-108. Between individual slit array regions one or more layers having no slits that may act to block light, which may reduce or prevent cross-talk between pixels. Slits of the slit array and layers between slit array regions may be formed of any suitable material, including aluminum or another metal (e.g., CMOS metal). The thickness, T, of the slit array may be in the range of 0.05 to 0.3 microns, or any value or range of values in that range. In some embodiments, the thickness of the slit array may be approximately 0.1 microns. Individual slits in the slit array may have a width, w, in the range of 0.05 to 0.15 microns, or any value or range of values in that range. In some embodiments, the width of a slit in the slit array may be approximately 0.09 microns. The slits may have a periodic arrangement such that there is a particular pitch, p, or distance between individual slits of the array. A slit array may have a pitch in the range of 0.1 to 0.5 microns, or any value or range of values in that range. In some embodiments, a slit array may have a pitch of approximately 0.26 microns.

Figures 1A, 3:
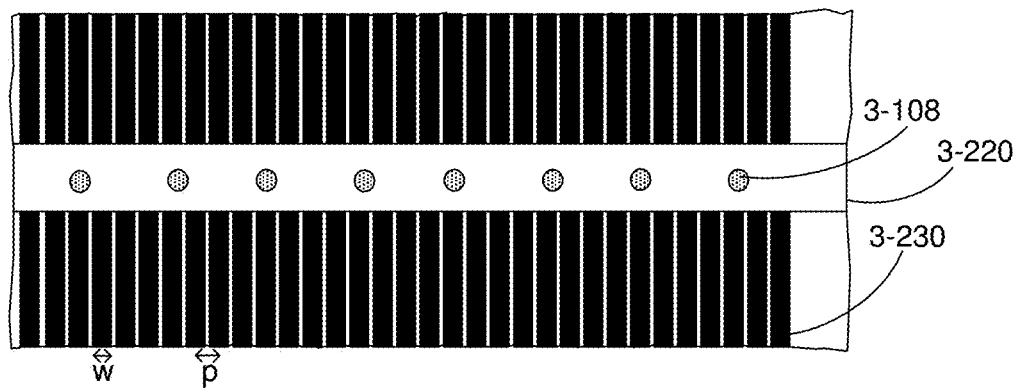
Figures 1B, 3:
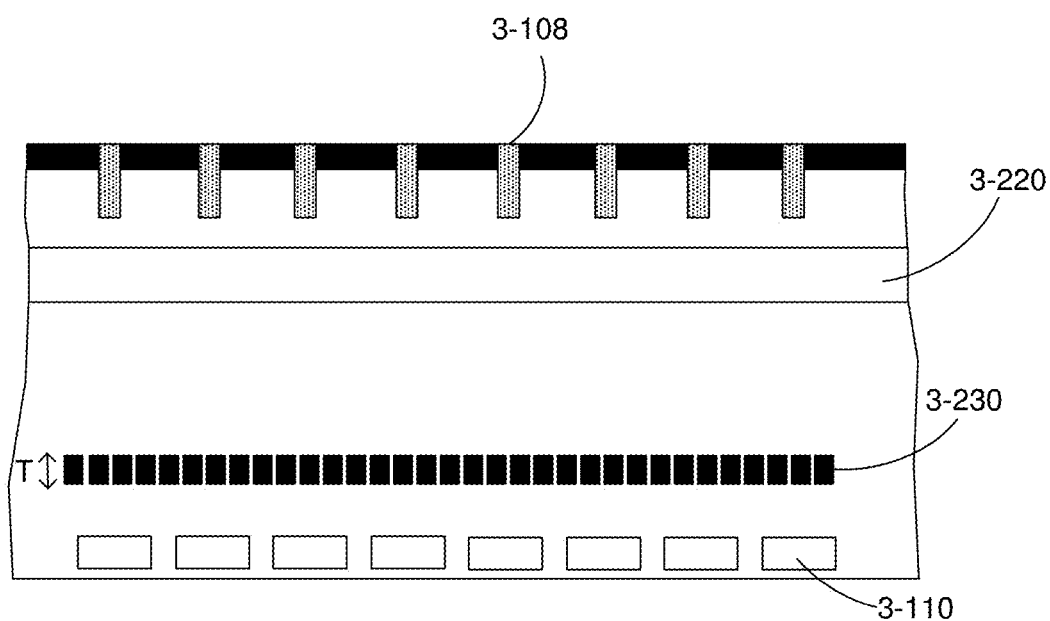
Figures 2A, 3:
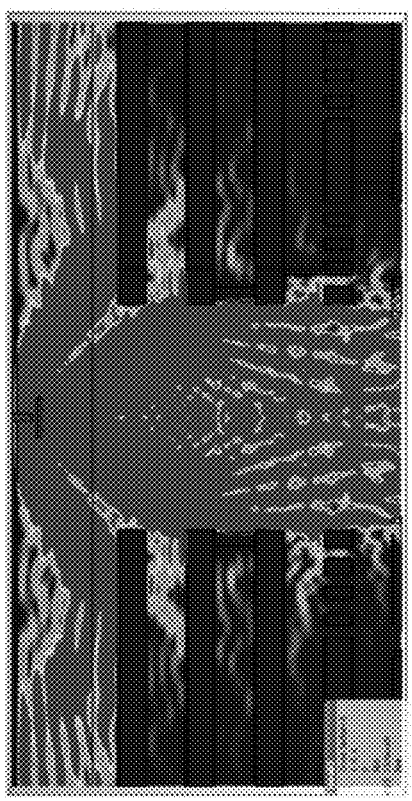
Figures 2D, 3:
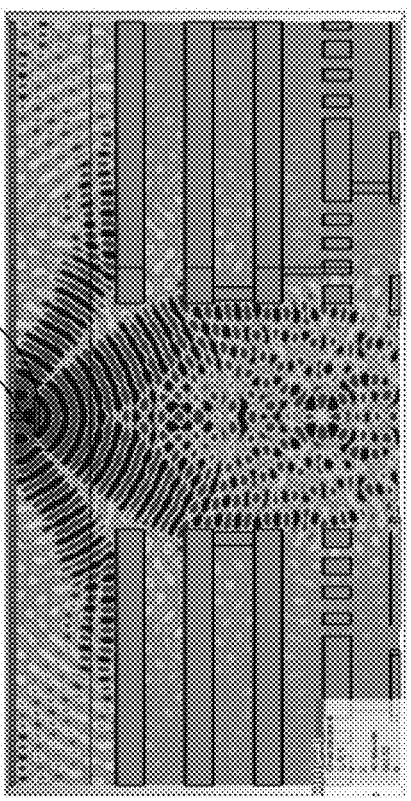
Figures 2C, 3:
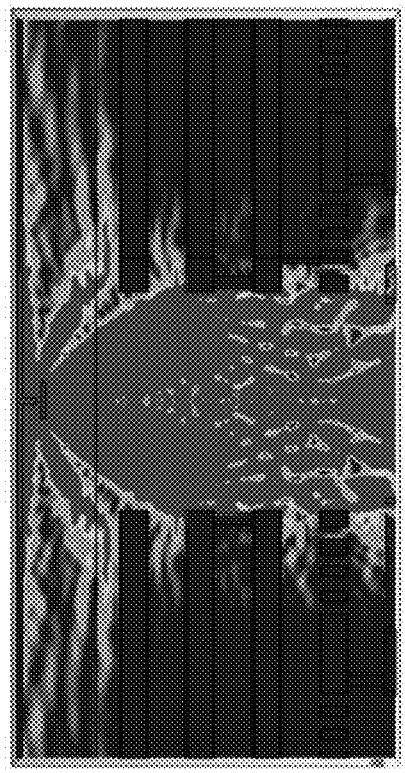
Figures 2B, 3:
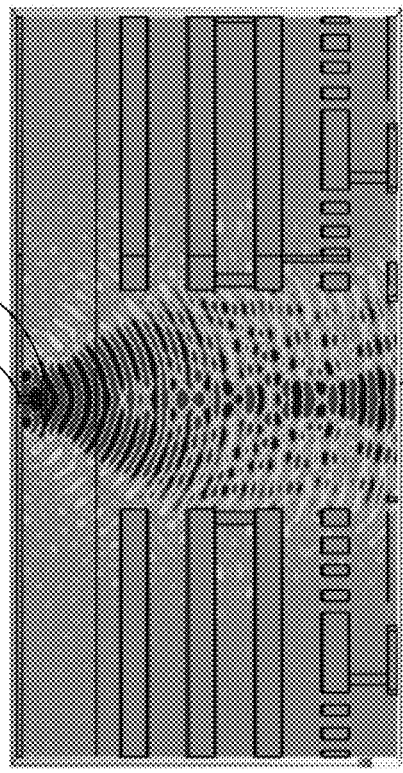
Figures 1A, 4:
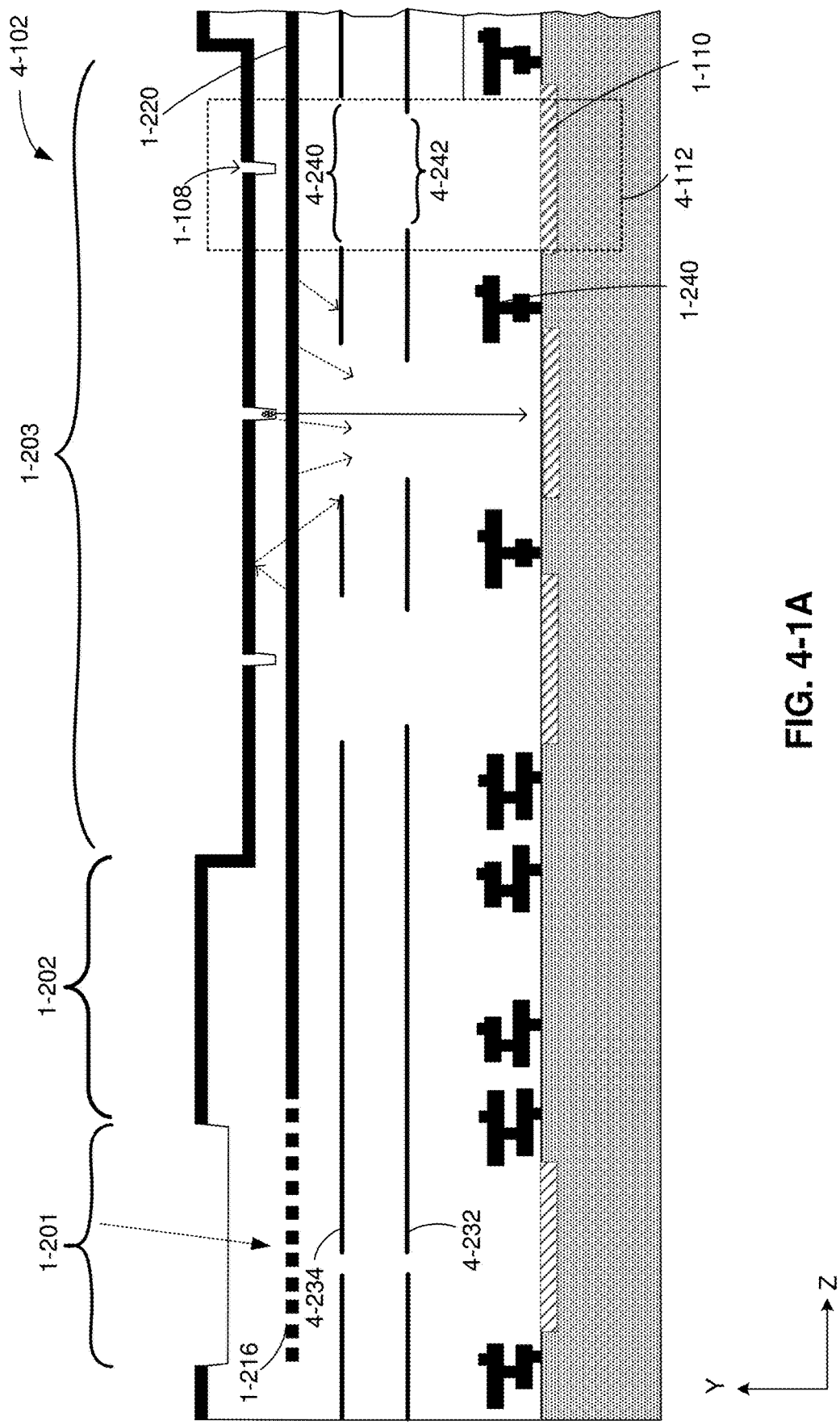
Figures 1B, 4:
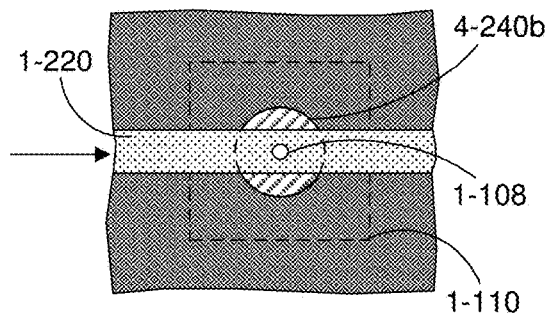
Figures 1C, 4:
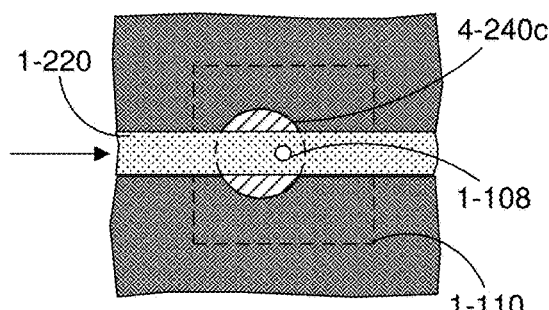
Figures 1D, 4:
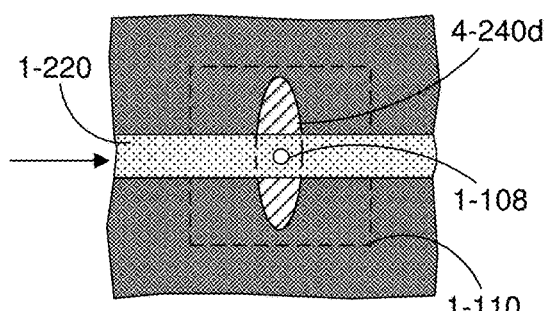
Figures 1E, 4:
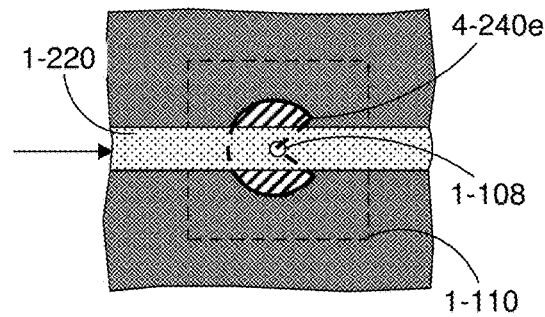
Figures 1F, 4:
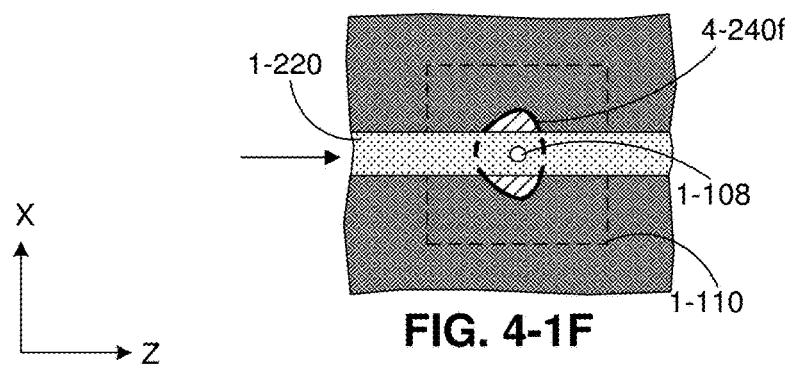
Figures 2, 4:
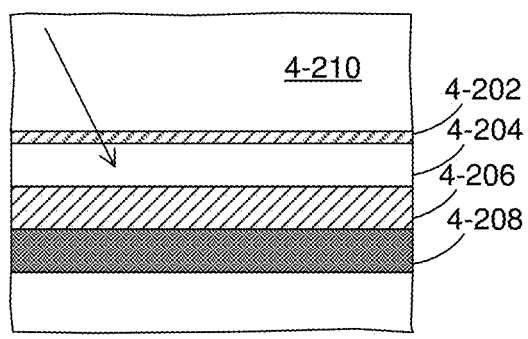
Figures 3C, 4:
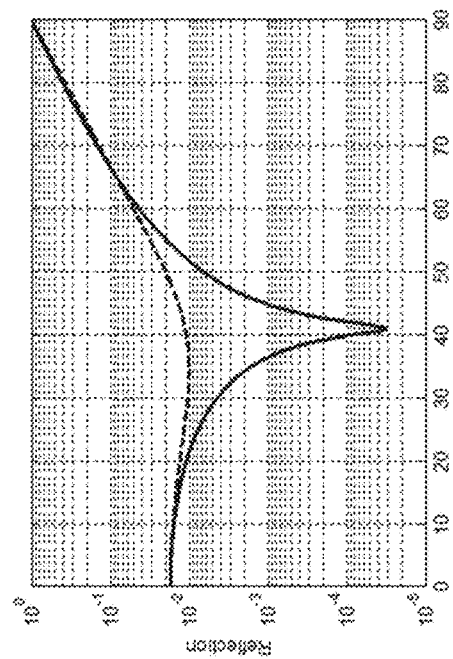
Figures 3D, 4:
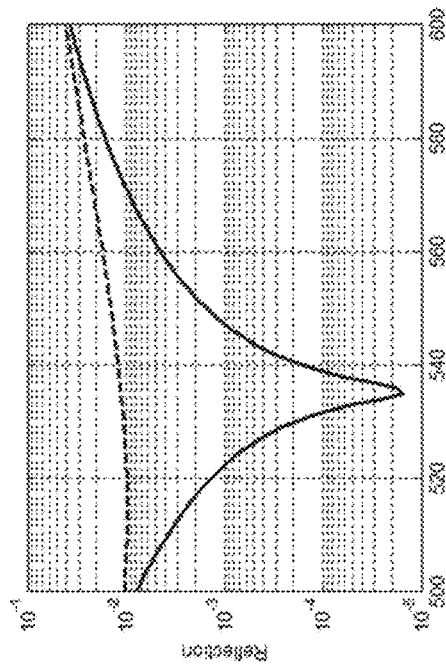
Figures 3A, 4:
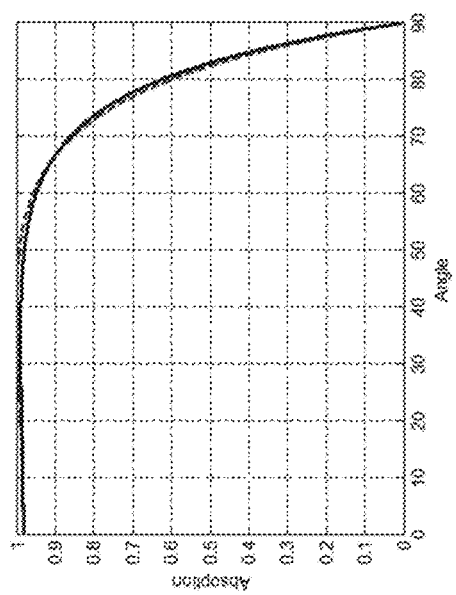
Figures 3B, 4:
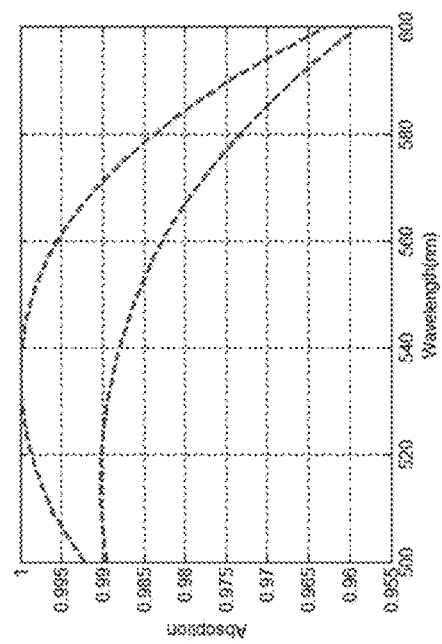

FIGS. 3-2A, B, C, D show cross-sectional views of an integrated device lacking a polarization filter and plot propagation of light having a characteristic wavelength of 532 nm scattered from sample well 3-108 and waveguide 3-220. As shown, both TE and TM 532 nm light propagate along the distance between sample well 3-108 and photodetector(s) 3-110. In contrast, FIGS. 3-3A, B, C, D show cross-sectional views of an integrated device having a polarization filter, such as a polarization filter described above, and plot propagation of light having a characteristic wavelength of 532 nm from sample well 3-108 to photodetector(s) 3-110. As shown in FIGS. 3-3A and 3-3B, integrating a polarization filter in an integrated device attenuates TE 532 nm light in comparison to an integrated device lacking the polarization filter (see FIGS. 3-2A and 3-2B for comparison). As shown in FIGS. 3-3C and 3-3D, the polarization filter has little to no impact on attenuating TM 532 nm light (see FIGS. 3-2C and 3-2D for comparison).

D. Spatial Filter

Photonic structure(s) 1-230 may include one or more spatial filters having layer(s) configured to block transmission of light, where the layer(s) have openings, or apertures, positioned to allow light to pass through the spatial filter. Individual openings of the spatial filter may be positioned to overlap with sample wells and photodetector(s) corresponding to individual sample wells, such that the openings are positioned to allow emission light from a sample well to propagate towards its respective photodetector(s). In some embodiments, individual openings of the spatial filter may be positioned to align with a sample well and its respective photodetector(s) along a common axis. Openings of the spatial filter may be suitably sized and shaped to allow detection of a desired level of emission light emitted from a sample well by photodetector(s) that correspond to the sample well. Since the layer(s) of the spatial filter may not discriminate emission light from excitation light, the openings of the spatial filter may be sized and shaped to take advantage of differences in directionality between the emission light and the excitation light. Emission light from a sample well may substantially propagate along a direction between the sample well and its respective photodetector(s), which is a direction normal to the spatial filter (along the y-direction shown in FIG. 4-1A). This directionality of the emission light may be achieved by the distance between the bottom surface of the sample well and metal layer(s), such as metal layer(s) 1-106, and the wavelength of emission light. A distance between the bottom surface of the sample well and the metal layer(s), d as shown in FIG. 1-1B, may be in the range of 100 nm to 500 nm, or any value or range of values in that range. To achieve directionality of the emission light that is substantially normal to the spatial filter, the distance between the bottom surface of the sample well and the metal layer(s) may be approximately an odd number of quarter-wavelengths for the wavelength of the emission light in the surrounding material. For example, the distance may be approximately $(3/4)*\lambda/n=300$ nm for an approximate emission wavelength $\lambda=580$ nm and a refractive index $n=1.45$. In contrast, excitation light scattered from a waveguide may propagate over a broader range of angles from normal to the spatial filter. The size and shape of the openings of the spatial filter may act to block some of the excitation light that is incident to the spatial filter, including excitation light incident to the spatial filter at broad angles. An opening in a spatial filter may be suitably sized and shaped to increase transmission of emission light relative to excitation light through the spatial filter where the excitation light is attenuated relative to the emission light. By implementing such a spatial filter, photodetector(s) may generate a signal that is indicative of the emission light where the signal is not substantially saturated by excitation light.

Some embodiments relate to an integrated device having multiple spatial filters. Openings in layer(s) of one spatial filter may overlap with openings of another spatial filter, and the overlapping openings of the spatial filters may be differently sized and shaped such that openings of the different spatial filters have different areas. In some embodiments, openings of one spatial filter and openings of another spatial filter may align along a common axis, which is shared by a sample well and its respective photodetectors within a pixel. The variation in size of the openings of the different spatial filters may attenuate light that passes through the series of spatial filters such that light that passes through an opening of a first spatial filter is blocked by a layer of a second spatial filter. This may allow the series of spatial filters to more efficiently block a wider angular range of light, including excitation light, from reaching the photodetector(s) than if a single spatial filter was used. In some embodiments, an integrated device may include a first spatial filter positioned proximate the sample wells and a second spatial filter positioned proximate the photodetector(s). For a pixel of the integrated device, the first spatial filter may have an opening with a first size (e.g., diameter of the opening) and the second filter may have an opening with a second size, where the first size and the second size are different. In some embodiments, the second size may be smaller than the first size. In other embodiments, the first size may be smaller than the second size.

Figures 2, 3, 4, 4A, 4B:
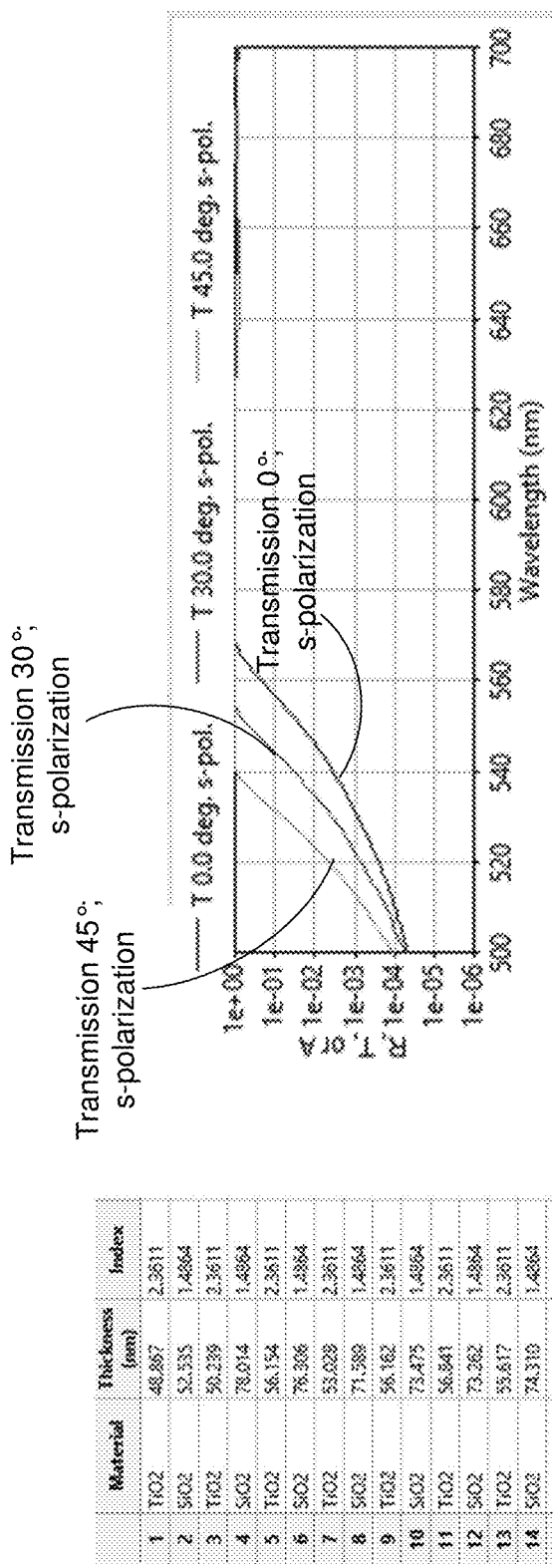

FIG. 4-1A shows a cross-sectional view of integrated device 4-102 having first spatial filter 4-234 and second spatial filter 4-232. First spatial filter 4-234 and second spatial filter 4-242 include openings that overlap with individual sample wells 1-108. First spatial filter 4-234 has opening 4-240 that overlaps with sample well 1-108 and photodetector(s) 1-110 of pixel 4-112. Second spatial filter 4-232 has opening 4-242 that overlaps with sample well 1-108 and photodetector(s) 1-110 of pixel 4-112. In some embodiments, opening 4-240 of spatial filter 4-234 and opening 4-242 of spatial filter 4-232 may align along a common axis with sample well 1-108 and photodetector(s) 1-110. As shown in FIG. 4-1A, opening 4-242 of second spatial filter 4-232 has a smaller size (dimension along the z-direction) than opening 4-240 of first spatial filter 4-234.

Individual openings in a spatial filter may be suitably sized, shaped, and positioned with respect to corresponding sample wells and photodetectors in the integrated device in a manner that improves collection of emission light by the photodetectors and/or reduces the amount of excitation light incident to the photodetectors. FIGS. 4-1B, 4-1C, 4-1D, 4-1E, and 4-1F are top planar views of pixels in an integrated device illustrating exemplary spatial filter openings 4-240b, 4-240c, 4-240d, 4-240e, and 4-240f, respectively. Openings in a spatial filter may be symmetric along one or more directions in the plane of the opening, such as spatial filter openings 4-240b and 4-240c as shown in FIGS. 4-1B and 4-1C, respectively, or non-symmetric along one or more directions in the plane of the opening, such as spatial filters 4-240e and 4-240f as shown in FIGS. 4-1E and 4-1F, respectively. An opening in a spatial filter may be coaxial with the corresponding sample well and/or photodetector(s) in the pixel, such as spatial filter openings 4-240b, 4-240d, and 4-240e as shown in FIGS. 4-1B, 4-1D, 4-1E, respectively, or non-coaxial, such as spatial filters 4-240c and 4-240f as shown in FIGS. 4-1B and 4-1F, respectively.

In some instances, the size and shape of the openings in the spatial filter may accommodate other characteristics of the integrated device, including characteristics that impact scattering of excitation light and collection of emission light. As an example, the size and/or shape of a sample well may impact the directionality of excitation light scattered by the sample well. In particular, as a cross-sectional dimension or area of the sample well increases, the sample well may exhibit more forward scattering because the sample well may act more as a Mie scattering object than as a Raleigh scattering object. For example, a sample well having a cross-sectional dimension of approximately 160 nm or less may act as a Raleigh scattering object and while a sample well having a cross-sectional dimension of approximately 170 nm or more may act as a Mie scattering object and may exhibit forward scattering. An opening in the spatial filter corresponding to the sample well may have a size, shape, and position relative to the sample well to reduce the amount of the forward scattered light that reaches the photodetectors. In some instances, the spatial filter opening may have a reduced size or dimension in the direction of light propagation along a waveguide. In some embodiments, a spatial filter opening may have a dimension along the direction of light propagation through a waveguide that is smaller than another dimension at some angle from the waveguide.

Returning to FIGS. 4-1B, 4-1C, 4-1D, 4-1E, and 4-1F, light propagates along waveguide 1-220 from the left to the right, as shown by the arrow. Spatial filter opening 4-240d has an elliptical shape with a dimension parallel to waveguide 1-220 that is smaller than a dimension of the opening perpendicular to waveguide 1-220. In some embodiments, a distance between a sample well and an edge of its corresponding spatial filter opening in a direction towards which excitation light propagates along the waveguide (e.g., towards the +z direction as shown in FIGS. 4-1B, 4-1C, 4-1D, 4-1E, and 4-1F) is smaller in comparison to a distance between the sample well and an edge of the spatial filter opening in a direction towards where light propagates from along the waveguide (e.g., towards the −z direction as shown in FIGS. 4-1B, 4-1C, 4-1D, 4-1E, and 4-1F). Such spatial filter openings may allow for reduced blocking of forward scattered light, including forward scattered light that arises from the sample well acting as a Mie scattering object. For example, spatial filter opening 4-240e has a shape where the right-hand side of the opening may act to block forward scattered excitation light because the opening is partially closed on the right-hand side in comparison to the left-hand side of opening 4-240e. As another example, spatial filter opening 4-240f has a shape and position relative to sample well 1-108 such that a distance between the sample well and an edge of opening 4-240f in the +z direction is smaller than in the −z direction.

Some spatial filter openings may act to block forward scattered light by offsetting the opening from the corresponding sample well towards the direction of light incident to the waveguide such that the opening and the sample well are non-coaxial. For example, spatial filter opening 4-240c is non-coaxial with the corresponding sample well 1-108 by being offset in a direction towards where light propagates from along the waveguide, which is in the −z direction as shown in FIG. 4-1C.

Layer(s) of a spatial filter may be formed of one or more materials configured to block or attenuate transmission of light, including excitation light. A spatial filter may include metal layer(s) and anti-reflective layer(s). Examples of materials that may be used to form layer(s) of a spatial filter include titanium, titanium nitride, aluminum, tantalum nitride, tantalum, silicon oxide, silicon oxynitride, and silicon nitride. Individual layers of a spatial filter may have a thickness between 5 nm to 200 nm, or any value or range of values in that range.

FIG. 4-2 is a cross-sectional view of an exemplary spatial filter having first layer 4-202, second layer 4-204, third layer 4-206, and fourth layer 4-208 formed within optically transparent material 4-210. This exemplary spatial filter may have reduced or minimal reflection at an excitation wavelength over a wide range of angles. The spatial filter may be integrated in a device where first layer 4-202 is proximate to sample wells of the device (e.g., sample wells 1-108) and fourth layer 4-208 is proximate to photodetectors of the device (e.g., photodetectors 1-110) such that light is substantially incident to first layer 4-202. First layer 4-202 and third layer 4-206 may include titanium nitride (TiN). Second layer 4-204 may include silicon nitride (SiN) and/or silicon dioxide ($SiO_2$). Fourth layer 4-208 may include titanium. Optically transparent material may include silicon dioxide. The thickness of first layer 4-202 may be in the range of 3 nm to 15 nm, or any value or range of values in that range. The thickness of second layer 4-204 may be in the range of 30 nm to 60 nm, or any value or range of values in that range. The thickness of third layer 4-206 may be in the range of 20 nm to 90 nm, or any value or range of values in that range. The thickness of fourth layer 4-208 may be in the range of 40 nm to 60 nm, or any value or range of values in that range. FIGS. 4-3A and 4-3B are plots of absorption (both p-polarized light and s-polarized light) versus angle and wavelength, respectively, and FIGS. 4-3C and 4-3D are plots of reflection (both p-polarized light and s-polarized light) versus angle and wavelength, respectively, for an exemplary spatial filter having a first layer of titanium nitride having a thickness of approximately 7 nm, a second layer of silicon nitride having a thickness of approximately 47 nm, a third layer of titanium nitride having a thickness of approximately 50 nm, and a fourth layer of titanium having a thickness of approximately 50 nm.

Figures 3E, 4:
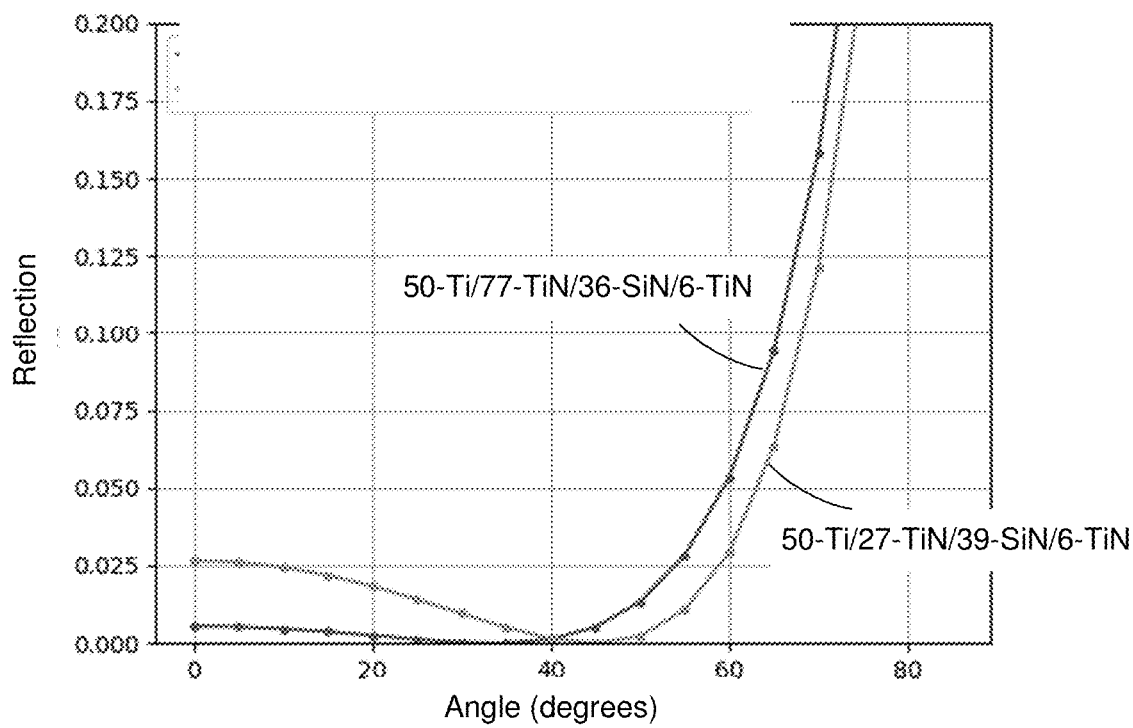
Figures 3F, 4:
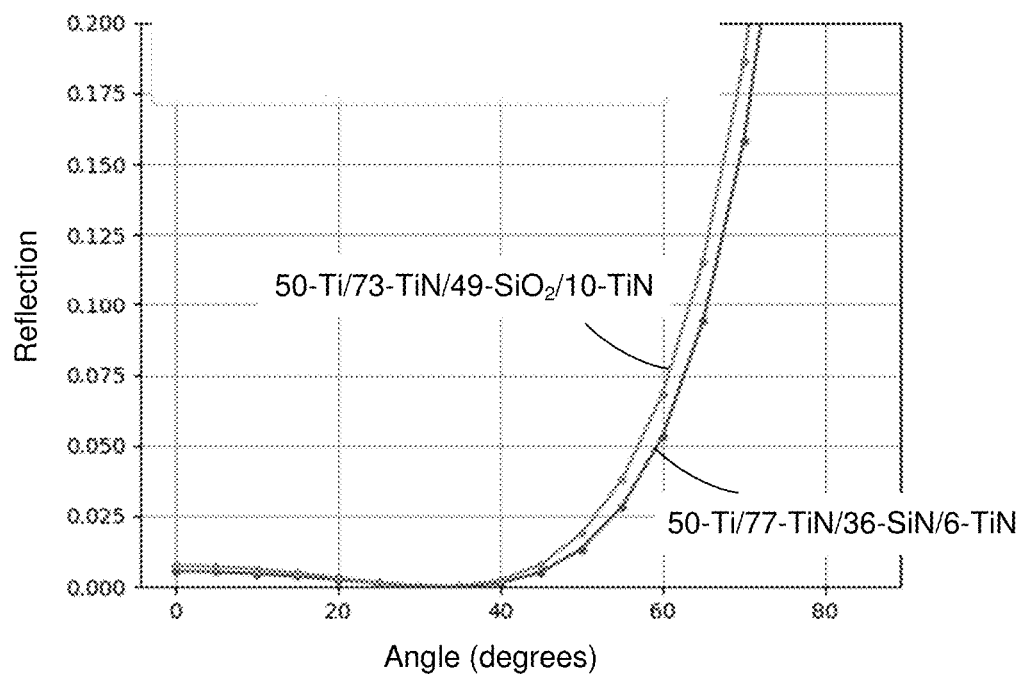

FIG. 4-3E is a plot of reflection versus angle for two exemplary spatial filters for light having a characteristic wavelength of 532 nm. One of the spatial filters has a first layer of titanium nitride having a thickness of approximately 6 nm, a second layer of silicon nitride having a thickness of approximately 36 nm, a third layer of titanium nitride having a thickness of approximately 77 nm, and a fourth layer of titanium having a thickness of approximately 50 nm. The other spatial filter has a first layer of titanium nitride having a thickness of approximately 6 nm, a second layer of silicon nitride having a thickness of approximately 39 nm, a third layer of titanium nitride having a thickness of approximately 27 nm, and a fourth layer of titanium having a thickness of approximately 50 nm. FIG. 4-3F is a plot of reflection versus angle for two exemplary spatial filters for light having a characteristic wavelength of 532 nm. One of the spatial filters has a first layer of titanium nitride having a thickness of approximately 6 nm, a second layer of silicon nitride having a thickness of approximately 36 nm, a third layer of titanium nitride having a thickness of approximately 77 nm, and a fourth layer of titanium having a thickness of approximately 50 nm. The other spatial filter has a first layer of titanium nitride having a thickness of approximately 10 nm, a second layer of silicon dioxide having a thickness of approximately 49 nm, a third layer of titanium nitride having a thickness of approximately 73 nm, and a fourth layer of titanium having a thickness of approximately 50 nm.

Figures 3G, 4:
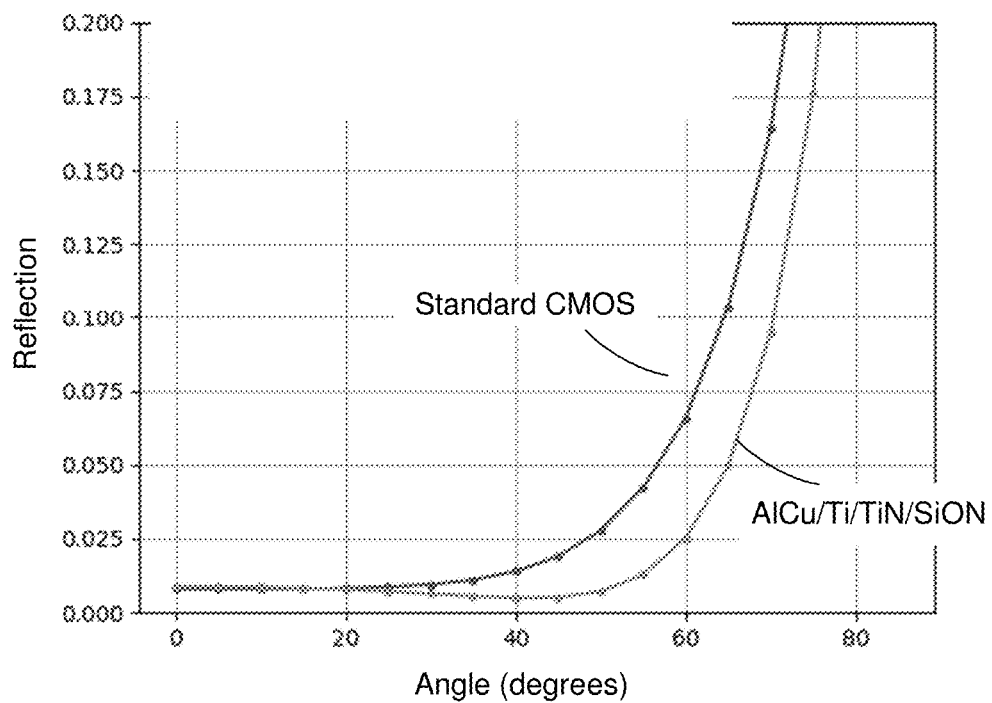
Figure 4:
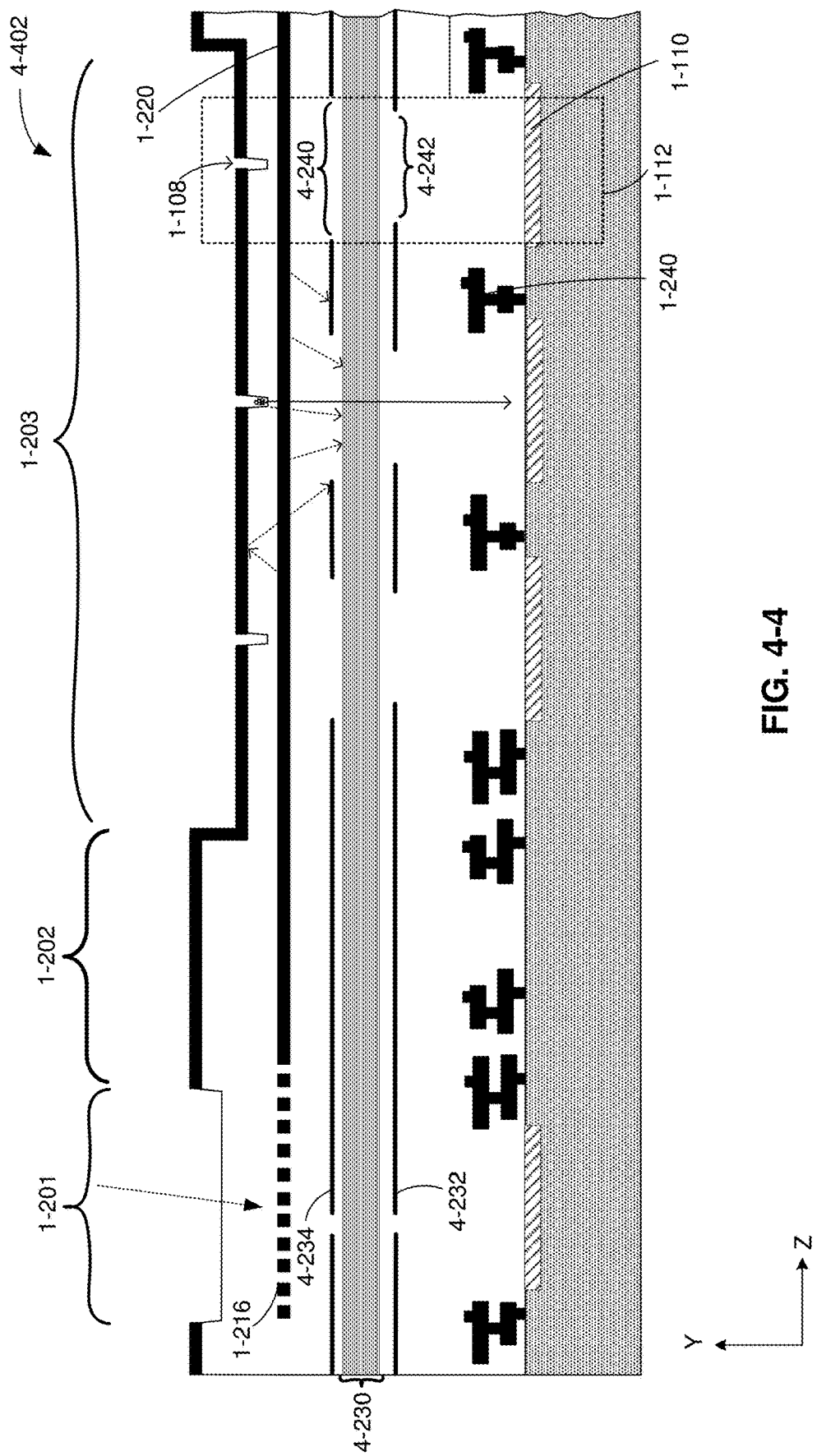
Figures 4, 5, 5B:
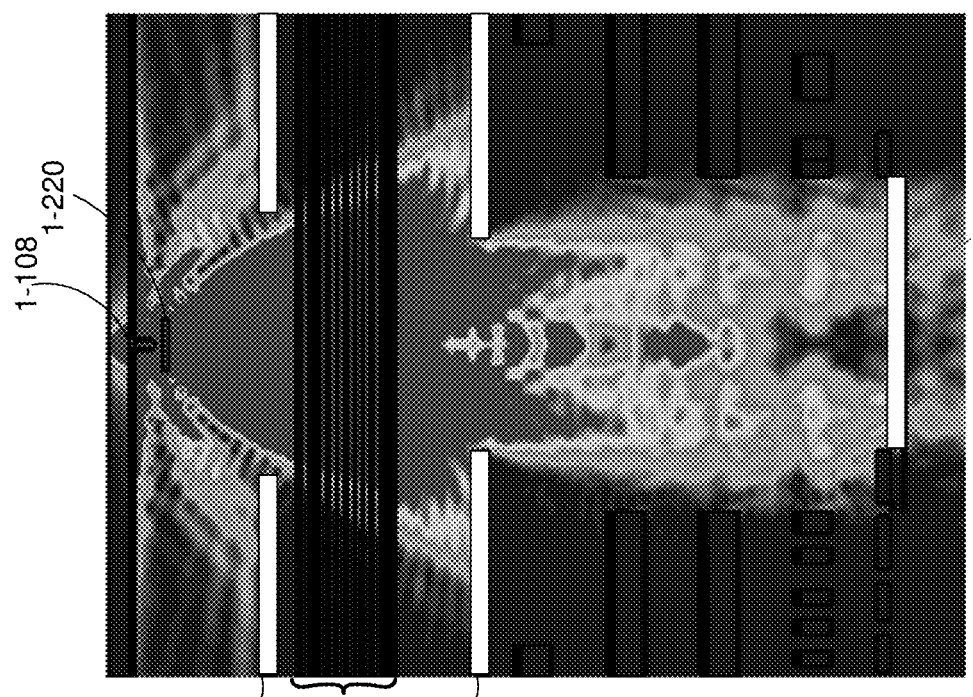
Figures 4, 5, 5A:
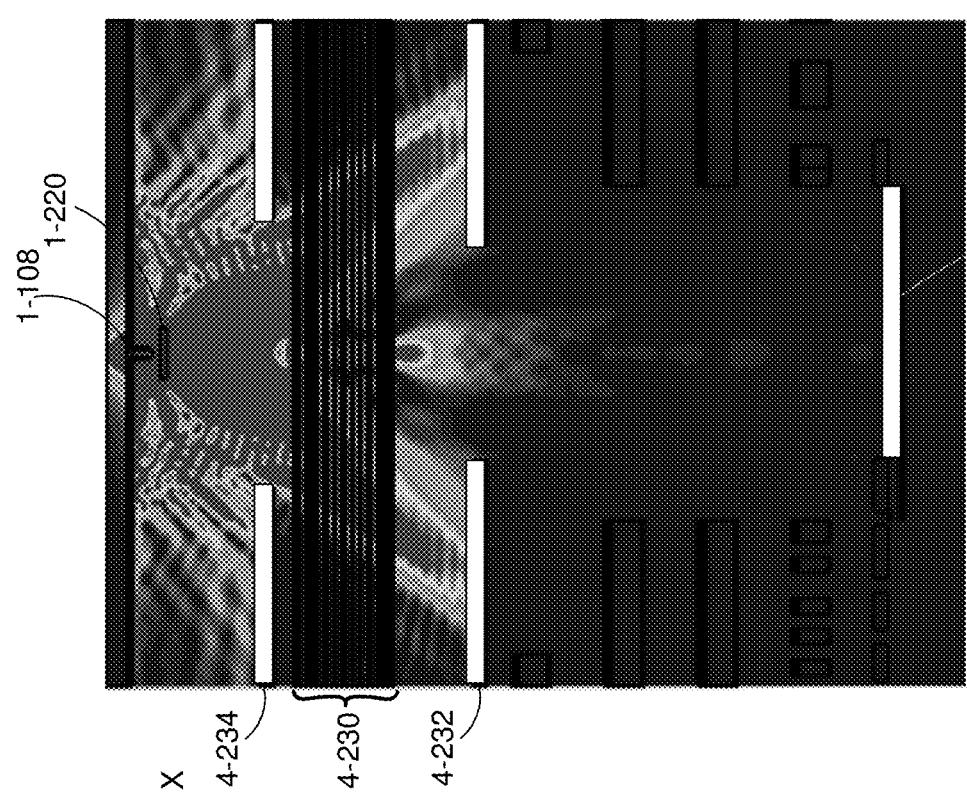
Figures 4, 5, 6:
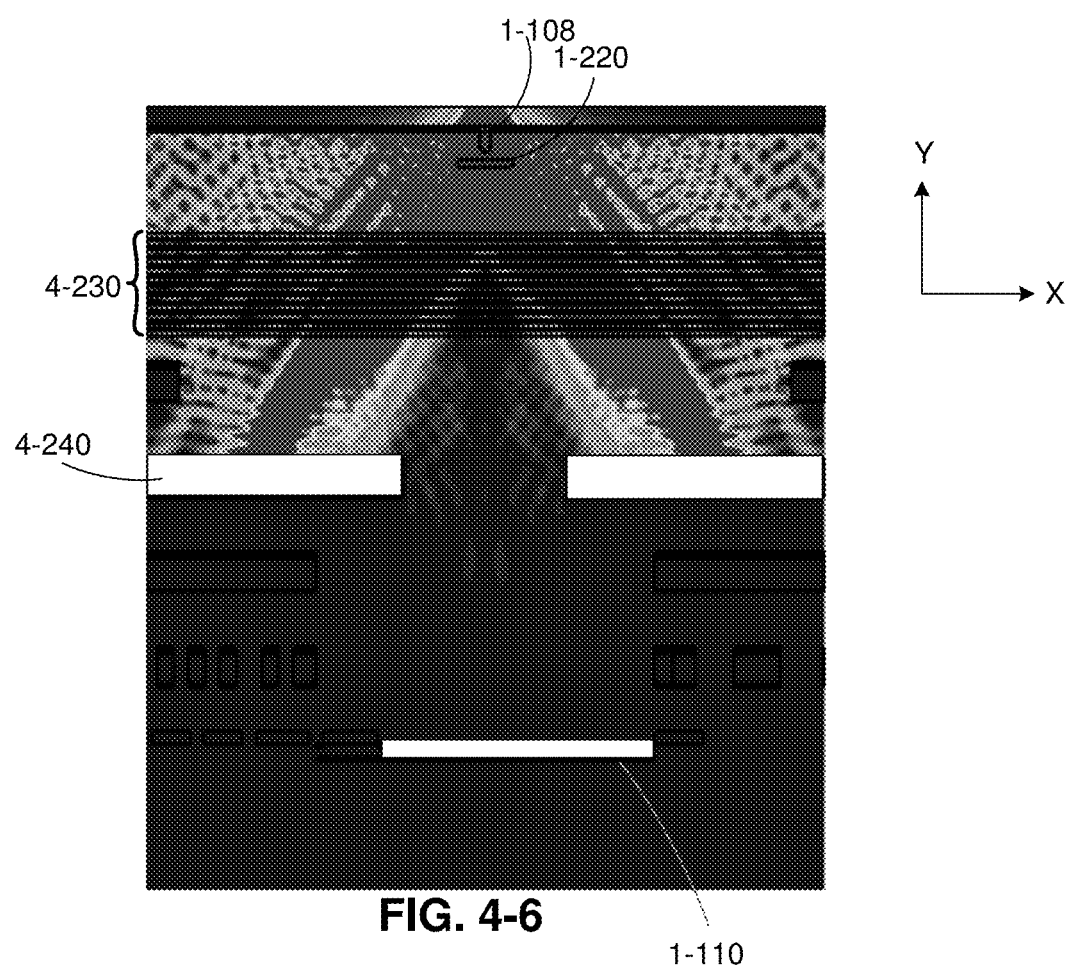

In some embodiments, a spatial filter may be formed of metal layer(s) (e.g., metal layers 1-240) of the integrated device that act as circuitry of the integrated device. The metal layer(s) may be electrically coupled to photodetector(s) of the integrated device and may be configured to transmit control signals to the photodetector(s) from circuitry external to the integrated device (e.g., an instrument that interfaces with the integrated device) and/or transmit detection signals generated by the photodetector(s) to external circuitry. Metal layer(s) configured to act as a spatial filter may be formed within a complementary metal-oxide-semiconductor (CMOS) region of the integrated device. The metal layer(s) may be formed using a suitable CMOS fabrication technique(s). Examples of materials that may be used to form layer(s) of a spatial filter include titanium, titanium nitride, aluminum, copper, silicon oxynitride (e.g., SiON). In some embodiments, a spatial filter may include a first layer of silicon oxynitride (SiON), a second layer of titanium nitride, a third layer of titanium, and a fourth layer of aluminum copper (AlCu). FIG. 4-3G is a plot of reflection versus angle for this spatial filter in comparison to a standard CMOS metal layer for light having a characteristic wavelength of 532 nm. As shown in FIG. 4-3G, the optical properties of this spatial filter reduce the reflectance of light in comparison to the CMOS metal. In particular, this spatial filter exhibits reduced reflectance for incident light over the range of 0 to 45 degrees.

In some embodiments, an integrated device may include a first spatial filter positioned proximate the sample wells and a second spatial filter positioned proximate the phototedetector(s) that is formed of metal layer(s) of the integrated device that act as circuitry of the integrated device. The first spatial filter may be formed of a metal layer (e.g., Ti) and two or more anti-reflection layers (e.g., TiN), where an anti-reflection layer is positioned on either side of the metal layer. The metal layer(s) that act as circuitry and form the second spatial filter may reflect incident light. The anti-reflection layer of the first spatial filter proximate the second spatial filter may act to reduce light reflected by the metal layer(s) of the second spatial filter, which may improve the efficiency of the first and second spatial filters to block excitation light than if the anti-reflection layer was not included.

Some embodiments relate to integrated devices having multiple types of photonic structures discussed herein. The different types of photonic structures may take advantage of the benefits of different types of photonic structures, and improved optical rejection of excitation light may be achieved over using one type of photonic structure alone. For example, the performance of a spectral filter to optically reject excitation light may depend on the angle of incidence of the excitation light to the spectral filter. The spectral filter may have improved performance in optically rejecting excitation light at angles close to normal to the spectral filter than at broader angles. A spatial filter may be used in combination with the spectral filter to account for the decreased performance at these broader angles. In some embodiments, a spatial filter may be positioned on a side of the spectral filter proximate to the sample wells. In some embodiments, a spatial filter may be positioned on a side of the spectral filter proximate the photodetectors.

Figures 2, 3, 4, 5, 5A, 5B:
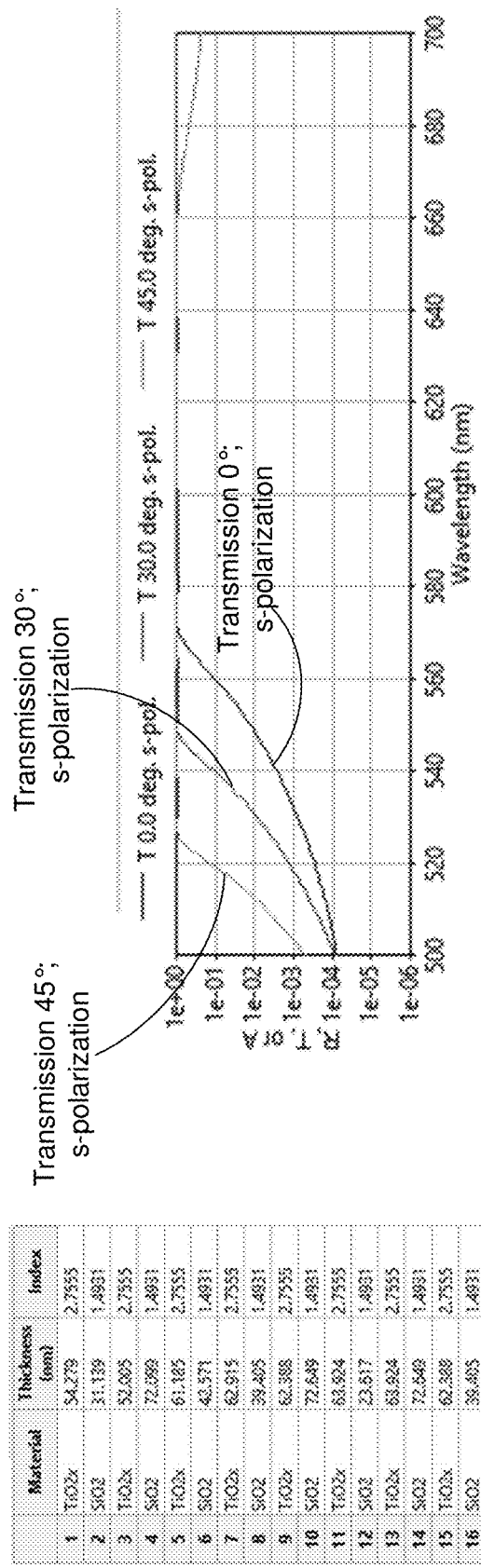

FIG. 4-4 is a cross-sectional view of integrated device 4-402 having spectral filter 4-230 positioned between first spatial filter 4-234 and second spatial filter 4-232. As shown in FIG. 4-4, spectral filter 4-230 may extend along the length (along the z-direction) of the integrated device and may overlap with openings in the first spatial filter 4-234 and second spatial filter 4-232, and sample wells 1-108. FIG. 4-5A is a cross-sectional view of a pixel in the integrated device shown in FIG. 4-4 and plots propagation of 532 nm light, which may be used as excitation light in some embodiments, scattered from waveguide 1-220 and sample well 1-108. As shown by FIG. 4-5A, the combination of first spatial filter 4-234, spectral filter 4-230, and second spatial filter 4-232 substantially blocks the 532 nm light from reaching photodetector 1-110. FIG. 4-5B is a cross-sectional view of a pixel in the integrated device shown in FIG. 4-4 and plots propagation of 572 nm light, which may be emission light emitted by a fluorescent marker in some embodiments. As shown by FIG. 4-5B, spectral filter 4-230 allows transmission of 572 nm light, in contrast to 532 nm light, such that although some of the 572 nm light may be blocked by first spatial filter 4-234 and second spatial filter 4-232, some of the 572 nm light reaches photodetector 1-110. In addition, the amount of 572 nm light that may be incident to photodetector 1-110 may be significantly larger than the amount of 532 nm light such that a signal generated by photodetector 1-110 may be indicative of the 572 nm light.

Figures 2, 3, 4, 5, 6:
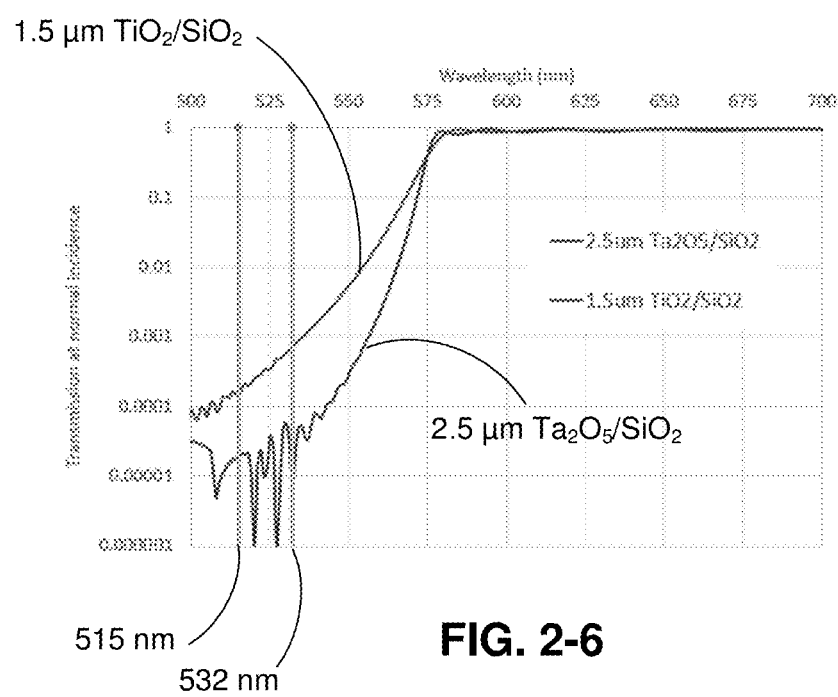

As discussed above, a metal layer of an integrated device that acts as circuitry may also be configured to act as a spatial filter. In some embodiments, an integrated device may include both a spectral filter and one or more metal layers configured as a spatial filter. FIG. 4-6 is a cross-sectional view of a pixel of an integrated device and plots propagation of 532 nm light, which may be used as excitation light in some embodiments, scattered from waveguide 1-220 and sample well 1-108. As shown by FIG. 4-6, the combination of spectral filter 4-230 and metal layer 4-240 substantially blocks the 532 nm light from reaching photodetector 1-110.

Some embodiments relate to an integrated device having light absorbing structures that are oriented substantially vertically, such as substantially perpendicular to the waveguides or top surface of the integrated device, and may be referred to as vertical absorbing sidewalls. The vertical absorbing sidewalls may be positioned between individual pixels of the integrated device and may improve optical isolation between pixels and may reduce crosstalk of excitation light and emission light between neighboring pixels. The vertical absorbing sidewalls may be positioned at any suitable location along the optical pathway between the sample well and photodetector(s) of a pixel. In embodiments that include multiple spatial filters layers, the vertical absorbing sidewalls may extend between two spatial filter layers. In some embodiments, the vertical absorbing sidewalls may be positioned between a spatial filter layer and the photodetector(s) of the integrated device.

FIG. 4-7 is a cross-sectional view of integrated device 4-702 having first spatial filter 4-234 and second spatial filter 4-232, and vertical absorbing sidewalls 4-704 positioned between first spatial filter 4-234 and second spatial filter 4-232. As shown in FIG. 4-4, vertical absorbing sidewalls 4-704 are positioned between individual pixels such that a set of vertical absorbing sidewalls are associated with individual sample wells and corresponding photodetector(s) 1-110. Vertical absorbing sidewalls 4-704 may absorb or otherwise reduce emission light (shown by the solid arrows) from a sample well from reaching the photodetector(s) in a neighboring pixel, which may reduce the amount of crosstalk among pixels in the integrated device. Additionally, vertical absorbing sidewalls 4-704 may reduce excitation light (shown by the dashed arrows) from reaching the photodetectors of the integrated device.

The vertical absorbing sidewalls may include one or more layers of materials configured to absorb or substantially block light. Examples of suitable materials that may be used to form vertical absorbing sidewalls may include silicon, silicon nitride, silicon oxynitride, silicon oxide, tungsten, titanium, titanium nitride, tantalum, and tantalum nitride.

According to some embodiments, vertical absorbing sidewalls may be formed by etching trenches and depositing the light absorbing material within the trenches during fabrication of the integrated device. In some embodiments, forming the vertical absorbing sidewalls may involve etching trenches within the pixel regions of the integrated device. In some embodiments, forming the vertical absorbing sidewalls may involve etching trenches between pixel regions of the integrated device.

FIGS. 4-8A-4-8F illustrate exemplary fabrication steps used to form vertical absorbing sidewalls. In FIG. 4-8A, optically transparent material 4-210 is formed over spatial filter 4-232, which in some embodiments is a metal CMOS layer. As shown in FIG. 4-8A, spatial filter 4-232 is formed over metal layer(s) 1-240 and substrate 4-802, which may include photodetector(s). The optically transparent material may include silicon dioxide ($SiO_2$). As discussed herein, in some embodiments, spatial filter 4-232 may include one or more layers that act to reduce reflection light, such as the exemplary spatial filter shown in FIG. 4-2. The optically transparent material may be planarized using chemical-mechanical planarization (CMP) techniques. As shown in FIG. 4-8B, trenches 4-804 may be formed in the optically transparent material using any suitable lithography techniques. Trenches 4-804 may be formed to extend regions of spatial filter 4-232, as shown in FIG. 4-8B. In such instances, spatial filter 4-232 may act as an etch stop. In some embodiments, trenches 4-804 may not fully extend towards the underlying spatial filter.

After formation of trenches 4-804, material used to form the vertical absorbing sidewalls 4-704 may be deposited over the trenches, as shown in FIG. 4-8C. The vertical absorbing sidewalls may be formed using one or more layers of silicon, tungsten, titanium, titanium nitride, tantalum, and tantalum nitride. The remaining portion of the trenches may be filled with any suitable dielectric material 4-806. Examples of dielectric material 4-806 may include silicon dioxide ($SiO_2$), silicon oxynitride (SiON), silicon nitride (SiN), and silicon, including amorphous silicon. The trenches may be filled using any suitable deposition techniques, including plasma-enhanced chemical vapor deposition (PECVD). Once the trenches are filled with dielectric material, layer(s) forming spatial filter 4-234 may be formed over the filled trenches, as shown in FIG. 4-8E. Spatial filter 4-234 may be formed by etching those layers between the trenches filled with dielectric material 4-806, as shown in FIG. 4-8F. Additional optically transparent material may be formed over the etched spatial filter 4-234. Subsequent processing of the integrated device may involve forming waveguide 1-220 and sample wells 1-108, as shown in FIG. 4-9A. The resulting integrated device shown in FIG. 4-9A has vertical absorbing sidewalls 4-704 and dielectric material 4-806 formed between individual pixels having a sample well 1-108 and associated photodetector(s) 1-110.

In some embodiments, forming the vertical absorbing sidewalls may involve etching regions within individual pixels of the integrated device. For example, instead of etching regions that overlap with spatial filter 4-232, as shown in FIG. 4-8B, formation of the vertical absorbing sidewalls may include etching regions that overlap with the openings of spatial filter 4-232 and forming dielectric material in these etched trenches. FIG. 4-9B shows a cross-sectional view of an integrated device having vertical absorbing sidewalls formed by such a process. In particular, regions of dielectric material 4-808 are formed to overlap with the individual pixels 1-108 and photodetector(s) within the pixels.

It should be appreciated that any suitable number of vertical absorbing sidewalls may be positioned between pixels to achieve desired properties of the integrated device. Additionally, the ease of fabrication of the integrated device may be considered in selecting the number of vertical absorbing sidewalls to use between adjacent pixels in the resulting integrated device. In some instances, fewer sidewalls between pixels may allow for scalability of the pixel structure across the array of pixels in the integrated device and/or for improved fabrication tolerances. For example, having a single vertical sidewall between adjacent pixels may reduce the need for forming smaller features using lithographic techniques, including patterning, etching, and depositing material, that have particular fabrication constraints in forming small features. FIG. 4-9C shows a cross-sectional view of an integrated device having a single vertical absorbing sidewall 4-704 positioned between adjacent pixels.

In some embodiments, an integrated device may include vertical absorbing sidewalls positioned between spatial filter(s) and the photodetectors of the integrated device. FIG. 4-10A shows a cross-sectional view of an integrated device having vertical absorbing sidewalls 4-904 positioned between spatial filter 4-232 and photodetector(s) 1-110. In some embodiments, vertical absorbing sidewalls 4-904 may extend continuously between spatial filter 4-232 and photodetector(s) 1-110 as shown in FIG. 4-10A. In some embodiments, vertical absorbing sidewalls 4-904 may extend partially between spatial filter 4-232 and photodetector(s) 1-110. Vertical absorbing sidewalls 4-904 may be formed by etching trenches between metal layer(s) 1-240 within the pixels of the integrated device and depositing absorbing material within the trenches to form the vertical absorbing sidewalls 4-904.

Some embodiments relate to an integrated device having regions of dielectric material positioned within individual pixels where the regions have a suitable refractive index for improving collection by the photodetectors of the integrated device. In some embodiments, the regions may have a higher refractive index than the surrounding material, such as the optically transparent material (e.g., silicon dioxide), which may act to direct light towards the photodetectors. These regions of high refractive index dielectric material may be positioned between a spatial filter and the photodetectors. FIG. 4-10B shows a cross-sectional view of an integrated device having regions of high refractive index material 4-906 positioned between spatial filter 4-232 and photodetectors 1-110 within individual pixels. Regions 4-906 may be formed by etching trenches between metal layer(s) 1-240 within the pixels of the integrated device and depositing the high refractive index material within the trenches to form the vertical absorbing sidewalls 4-904. Examples of suitable materials that may be used to form regions 4-906 include silicon nitride, silicon oxynitride, and/or other dielectric materials having a refractive index in the range of 1.5 to 2.0 at a particular characteristic wavelength. It should be appreciated that some embodiments of the integrated device may include both vertical absorbing sidewalls and regions of high refractive index dielectric material.

III. Additional Aspects of the System

The system may include an integrated device and an instrument configured to interface with the integrated device. The integrated device may include an array of pixels, where a pixel includes a sample well and at least one photodetector. A surface of the integrated device may have a plurality of sample wells, where a sample well is configured to receive a sample from a specimen placed on the surface of the integrated device. A specimen may contain multiple samples, and in some embodiments, different types of samples. The plurality of sample wells may have a suitable size and shape such that at least a portion of the sample wells receive one sample from a specimen. In some embodiments, the number of samples within a sample well may be distributed among the sample wells such that some sample wells contain one sample with others contain zero, two or more samples.

In some embodiments, a specimen may contain multiple single-stranded DNA templates, and individual sample wells on a surface of an integrated device may be sized and shaped to receive a single-stranded DNA template. Single-stranded DNA templates may be distributed among the sample wells of the integrated device such that at least a portion of the sample wells of the integrated device contain a single-stranded DNA template. The specimen may also contain labeled deoxynucleotide triphosphates (dNTPs) which then enter in the sample well and may allow for identification of a nucleotide as it is incorporated into a strand of DNA complementary to the single-stranded DNA template in the sample well. In such an example, the "sample" may refer to both the single-stranded DNA and the labeled dNTP currently being incorporated by a polymerase. In some embodiments, the specimen may contain single-stranded DNA templates and labeled dNTPs may be subsequently introduced to a sample well as nucleotides are incorporated into a complementary strand of DNA within the sample well. In this manner, timing of incorporation of nucleotides may be controlled by when labeled dNTPs are introduced to the sample wells of an integrated device.

Excitation light is provided from an excitation source located separate from the pixel array of the integrated device. The excitation light is directed at least in part by elements of the integrated device towards one or more pixels to illuminate an illumination region within the sample well. A marker may then emit emission light when located within the illumination region and in response to being illuminated by excitation light. In some embodiments, one or more excitation sources are part of the instrument of the system where components of the instrument and the integrated device are configured to direct the excitation light towards one or more pixels.

Emission light emitted by a sample may then be detected by one or more photodetectors within a pixel of the integrated device. Characteristics of the detected emission light may provide an indication for identifying the marker associated with the emission light. Such characteristics may include any suitable type of characteristic, including an arrival time of photons detected by a photodetector, an amount of photons accumulated over time by a photodetector, and/or a distribution of photons across two or more photodetectors. In some embodiments, a photodetector may have a configuration that allows for the detection of one or more timing characteristics associated with a sample's emission light (e.g., fluorescence lifetime). The photodetector may detect a distribution of photon arrival times after a pulse of excitation light propagates through the integrated device, and the distribution of arrival times may provide an indication of a timing characteristic of the sample's emission light (e.g., a proxy for fluorescence lifetime). In some embodiments, the one or more photodetectors provide an indication of the probability of emission light emitted by the marker (e.g., fluorescence intensity). In some embodiments, a plurality of photodetectors may be sized and arranged to capture a spatial distribution of the emission light. Output signals from the one or more photodetectors may then be used to distinguish a marker from among a plurality of markers, where the plurality of markers may be used to identify a sample within the specimen. In some embodiments, a sample may be excited by multiple excitation energies, and emission light and/or timing characteristics of the emission light emitted by the sample in response to the multiple excitation energies may distinguish a marker from a plurality of markers.

A schematic overview of the system 5-100 is illustrated in FIG. 5-1. The system comprises both an integrated device 5-102 that interfaces with an instrument 5-104. In some embodiments, instrument 5-104 may include one or more excitation sources 5-106 integrated as part of instrument 5-104. In some embodiments, an excitation source may be external to both instrument 5-104 and integrated device 5-102, and instrument 5-104 may be configured to receive excitation light from the excitation source and direct excitation light to the integrated device. The integrated device may interface with the instrument using any suitable socket for receiving the integrated device and holding it in precise optical alignment with the excitation source. The excitation source 5-106 may be configured to provide excitation light to the integrated device 5-102. As illustrated schematically in FIG. 5-1, the integrated device 5-102 has a plurality of pixels 5-112, where at least a portion of pixels may perform independent analysis of a sample. Such pixels 5-112 may be referred to as "passive source pixels" since a pixel receives excitation light from a source 5-106 separate from the pixel, where excitation light from the source excites some or all of the pixels 5-112. Excitation source 5-106 may be any suitable light source. Examples of suitable excitation sources are described in U.S. patent application Ser. No. 14/821,688 titled "INTEGRATED DEVICE FOR PROBING, DETECTING AND ANALYZING MOLECULES," which is incorporated by reference in its entirety. In some embodiments, excitation source 5-106 includes multiple excitation sources that are combined to deliver excitation light to integrated device 5-102. The multiple excitation sources may be configured to produce multiple excitation energies or wavelengths.

A pixel 5-112 has a sample well 5-108 configured to receive a sample and a photodetector 5-110 for detecting emission light emitted by the sample in response to illuminating the sample with excitation light provided by the excitation source 5-106. In some embodiments, sample well 5-108 may retain the sample in proximity to a surface of integrated device 5-102, which may ease delivery of excitation light to the sample and detection of emission light from the sample.

Optical elements for coupling excitation light from excitation light source 5-106 to integrated device 5-102 and guiding excitation light to the sample well 5-108 are located both on integrated device 5-102 and the instrument 5-104. Source-to-well optical elements may comprise one or more grating couplers located on integrated device 5-102 to couple excitation light to the integrated device and waveguides to deliver excitation light from instrument 5-104 to sample wells in pixels 5-112. One or more optical splitter elements may be positioned between a grating coupler and the waveguides. The optical splitter may couple excitation light from the grating coupler and deliver excitation light to at least one of the waveguides. In some embodiments, the optical splitter may have a configuration that allows for delivery of excitation light to be substantially uniform across all the waveguides such that each of the waveguides receives a substantially similar amount of excitation light. Such embodiments may improve performance of the integrated device by improving the uniformity of excitation light received by sample wells of the integrated device.

Sample well 5-108, a portion of the excitation source-to-well optics, and the sample well-to-photodetector optics are located on integrated device 5-102. Excitation source 5-106 and a portion of the source-to-well components are located in instrument 5-104. In some embodiments, a single component may play a role in both coupling excitation light to sample well 5-108 and delivering emission light from sample well 5-108 to photodetector 5-110. Examples of suitable components, for coupling excitation light to a sample well and/or directing emission light to a photodetector, to include in an integrated device are described in U.S. patent application Ser. No. 14/821,688 titled "INTEGRATED DEVICE FOR PROBING, DETECTING AND ANALYZING MOLECULES," and U.S. patent application Ser. No. 14/543,865 titled "INTEGRATED DEVICE WITH EXTERNAL LIGHT SOURCE FOR PROBING, DETECTING, AND ANALYZING MOLECULES," both of which are incorporated by reference in their entirety.

Pixel 5-112 is associated with its own individual sample well 5-108 and at least one photodetector 5-110. The plurality of pixels of integrated device 5-102 may be arranged to have any suitable shape, size, and/or dimensions. Integrated device 5-102 may have any suitable number of pixels. The number of pixels in integrated device 2-102 may be in the range of approximately 10,000 pixels to 1,000,000 pixels or any value or range of values within that range. In some embodiments, the pixels may be arranged in an array of 512 pixels by 512 pixels. Integrated device 5-102 may interface with instrument 5-104 in any suitable manner. In some embodiments, instrument 5-104 may have an interface that detachably couples to integrated device 5-102 such that a user may attach integrated device 5-102 to instrument 5-104 for use of integrated device 5-102 to analyze a sample and remove integrated device 5-102 from instrument 5-104 to allow for another integrated device to be attached. The interface of instrument 5-104 may position integrated device 5-102 to couple with circuitry of instrument 5-104 to allow for readout signals from one or more photodetectors to be transmitted to instrument 5-104. Integrated device 5-102 and instrument 5-104 may include multi-channel, high-speed communication links for handling data associated with large pixel arrays (e.g., more than 10,000 pixels).

Instrument 5-104 may include a user interface for controlling operation of instrument 5-104 and/or integrated device 5-102. The user interface may be configured to allow a user to input information into the instrument, such as commands and/or settings used to control the functioning of the instrument. In some embodiments, the user interface may include buttons, switches, dials, and a microphone for voice commands. The user interface may allow a user to receive feedback on the performance of the instrument and/or integrated device, such as proper alignment and/or information obtained by readout signals from the photodetectors on the integrated device. In some embodiments, the user interface may provide feedback using a speaker to provide audible feedback. In some embodiments, the user interface may include indicator lights and/or a display screen for providing visual feedback to a user.

In some embodiments, instrument 5-104 may include a computer interface configured to connect with a computing device. Computer interface may be a USB interface, a FireWire interface, or any other suitable computer interface. Computing device may be any general purpose computer, such as a laptop or desktop computer. In some embodiments, computing device may be a server (e.g., cloud-based server) accessible over a wireless network via a suitable computer interface. The computer interface may facilitate communication of information between instrument 5-104 and the computing device. Input information for controlling and/or configuring the instrument 5-104 may be provided to the computing device and transmitted to instrument 5-104 via the computer interface. Output information generated by instrument 5-104 may be received by the computing device via the computer interface. Output information may include feedback about performance of instrument 5-104, performance of integrated device 5-112, and/or data generated from the readout signals of photodetector 5-110.

In some embodiments, instrument 5-104 may include a processing device configured to analyze data received from one or more photodetectors of integrated device 5-102 and/or transmit control signals to excitation source(s) 2-106. In some embodiments, the processing device may comprise a general purpose processor, a specially-adapted processor (e.g., a central processing unit (CPU) such as one or more microprocessor or microcontroller cores, a field-programmable gate array (FPGA), an application-specific integrated circuit (ASIC), a custom integrated circuit, a digital signal processor (DSP), or a combination thereof.) In some embodiments, the processing of data from one or more photodetectors may be performed by both a processing device of instrument 5-104 and an external computing device. In other embodiments, an external computing device may be omitted and processing of data from one or more photodetectors may be performed solely by a processing device of integrated device 5-102.

An exemplary instrument 5-104 may comprise one or more mode-locked laser modules 5-258 mounted as a replaceable module within, or otherwise coupled to, the instrument, as depicted in FIG. 5-2A. The instrument 5-104 may include an optical system 5-255 and an analytic system 5-260. The optical system 5-255 may include some combination of optical components (which may include, for example, none, one, or more of each of: lens, mirror, optical filter, attenuator, beam-steering component, beam shaping component) and be configured to operate on and/or deliver output optical pulses 5-252 from a mode-locked laser module 5-258 to the analytic system 5-260. The analytic system may include a plurality of components that are arranged to direct the optical pulses to at least one sample that is to be analyzed, receive one or more optical signals (e.g., fluorescence, backscattered radiation) from the at least one sample, and produce one or more electrical signals representative of the received optical signals. In some embodiments, the analytic system 5-260 may include one or more photodetectors and signal-processing electronics (e.g., one or more microcontrollers, one or more field-programmable gate arrays, one or more microprocessors, one or more digital signal processors, logic gates, etc.) configured to process the electrical signals from the photodetectors. The analytic system 5-260 may also include data transmission hardware configured to transmit and receive data to and from external devices via one or more data communications links. In some embodiments, the analytic system 5-260 may be configured to receive integrated device 5-102, which may receive one or more samples to be analyzed.

FIG. 5-2B depicts temporal intensity profiles of the output pulses 5-252. In some embodiments, the peak intensity values of the emitted pulses may be approximately equal, and the profiles may have a Gaussian temporal profile, though other profiles such as a $sech^2$ profile may be possible. In some cases, the pulses may not have symmetric temporal profiles and may have other temporal shapes. The duration of each pulse may be characterized by a full-width-half-maximum (FWHM) value, as indicated in FIG. 5-2B. According to some embodiments of a mode-locked laser, ultrashort optical pulses may have FWHM values less than 100 picoseconds (ps). In some cases, the FWHM values may be between approximately 5 ps and approximately 30 ps.

The output pulses 5-252 may be separated by regular intervals T. For example, T may be determined by a round-trip travel time between an output coupler and a cavity end mirror of laser module 5-258. According to some embodiments, the pulse-separation interval T may be in the range of approximately 1 ns to approximately 30 ns, or any value or range of values within that range. In some cases, the pulse-separation interval T may be in the range of approximately 5 ns to approximately 20 ns, corresponding to a laser-cavity length (an approximate length of an optical axis within a laser cavity of laser module 5-258) between about 0.7 meter and about 3 meters.

According to some embodiments, a desired pulse-separation interval T and laser-cavity length may be determined by a combination of the number of sample wells on integrated device 5-102, fluorescent emission characteristics, and the speed of data-handling circuitry for reading data from integrated device 5-102. The inventors have recognized and appreciated that different fluorophores may be distinguished by their different fluorescent decay rates or characteristic lifetimes. Accordingly, there needs to be a sufficient pulse-separation interval T to collect adequate statistics for the selected fluorophores to distinguish between their different decay rates. Additionally, if the pulse-separation interval T is too short, the data handling circuitry cannot keep up with the large amount of data being collected by the large number of sample wells. The inventors have recognized and appreciated that a pulse-separation interval T between about 5 ns and about 20 ns is suitable for fluorophores that have decay rates up to about 2 ns and for handling data from between about 60,000 and 600,000 sample wells.

According to some implementations, a beam-steering module may receive output pulses from the mode-locked laser module 5-125 and be configured to adjust at least the position and incident angles of the optical pulses onto an optical coupler of the integrated device 5-102. In some cases, the output pulses from the mode-locked laser module may be operated on by a beam-steering module to additionally or alternatively change a beam shape and/or beam rotation at an optical coupler on the integrated device 5-102. In some implementations, the beam-steering module may further provide focusing and/or polarization adjustments of the beam of output pulses onto the optical coupler. One example of a beam-steering module is described in U.S. patent application Ser. No. 15/161,088 titled "PULSED LASER AND BIOANALYTIC SYSTEM," filed May 20, 2016, which is incorporated herein by reference. Another example of a beam-steering module is described in U.S. Pat. Application 62/435,679 titled "COMPACT BEAM SHAPING AND STEERING ASSEMBLY," which is incorporated herein by reference, said application filed Dec. 16, 2016.

Referring to FIG. 5-3, the output pulses 5-522 from a mode-locked laser module may be coupled into one or more optical waveguides 5-312 on the integrated device. In some embodiments, the optical pulses may be coupled to one or more waveguides via a grating coupler 5-310, though coupling to an end of one or more optical waveguides on the integrated device may be used in some embodiments. According to some embodiments, a quad detector 5-320 may be located on a semiconductor substrate 5-305 (e.g., a silicon substrate) for aiding in alignment of the beam of optical pulses 5-122 to a grating coupler 5-310. The one or more waveguides 5-312 and sample wells 5-330 may be integrated on the same semiconductor substrate with intervening dielectric layers (e.g., silicon dioxide layers) between the substrate, waveguide, sample wells, and photodetectors 5-322.

Each waveguide 5-312 may include a tapered portion 5-315 below the sample wells 5-330 to equalize optical power coupled to the sample wells along the waveguide. The reducing taper may force more optical energy outside the waveguide's core, increasing coupling to the sample wells and compensating for optical losses along the waveguide, including losses for light coupling into the sample wells. A second grating coupler 5-317 may be located at an end of each waveguide to direct optical energy to an integrated photodiode 5-324. The integrated photodiode may detect an amount of power coupled down a waveguide and provide a detected signal to feedback circuitry that controls a beam-steering module.

The sample wells 5-330 may be aligned with the tapered portion 5-315 of the waveguide and recessed in a tub 5-340. There may be time-binning photodetectors 5-322 located on the semiconductor substrate 5-305 for each sample well 5-330. A metal coating and/or multilayer coating 5-350 may be formed around the sample wells and above the waveguide to prevent or reduce optical excitation of fluorophores that are not in the sample well (e.g., dispersed in a solution above the sample wells). The metal coating and/or multilayer coating 5-350 may be raised beyond edges of the tub 5-340 to reduce absorptive losses of the optical energy in the waveguide 5-312 at the input and output ends of each waveguide.

There may be a plurality of rows of waveguides, sample wells, and time-binning photodetectors on the integrated device. For example, there may be 128 rows, each having 512 sample wells, for a total of 65,536 sample wells in some implementations. Other implementations may include fewer or more sample wells, and may include other layout configurations. Optical power from a mode-locked laser may be distributed to the multiple waveguides via one or more star couplers and/or multi-mode interference couplers, or by any other means, located between an optical coupler of the integrated device and the plurality of waveguides.

FIG. 5-4 illustrates optical energy coupling from an optical pulse 5-122 within a waveguide 5-315 to a sample well 5-330. Waveguide 5-315 may be considered as a channel waveguide. The drawing has been produced from an electromagnetic field simulation of the optical wave that accounts for waveguide dimensions, sample well dimensions, the different materials' optical properties, and the distance of the waveguide 5-315 from the sample well 5-330. The waveguide may be formed from silicon nitride in a surrounding medium 5-410 of silicon dioxide, for example. The waveguide, surrounding medium, and sample well may be formed by microfabrication processes described in U.S. patent application Ser. No. 14/821,688, filed Aug. 7, 2015, titled "INTEGRATED DEVICE FOR PROBING, DETECTING AND ANALYZING MOLECULES". According to some embodiments, an evanescent optical field 5-420 couples optical energy transported by the waveguide to the sample well 5-330.

A non-limiting example of a biological reaction taking place in a sample well 5-330 is depicted in FIG. 5-5. In this example, sequential incorporation of nucleotides and/or nucleotide analogs into a growing strand that is complementary to a target nucleic acid is taking place in the sample well. The sequential incorporation can be detected to sequence a series of nucleic acids (e.g., DNA, RNA). The sample well may have a depth in the range of approximately 100 to approximately 500 nm, or any value or range of values within that range, and a diameter in the range of approximately 80 nm to approximately 200 nm. A metallization layer 5-540 (e.g., a metallization for an electrical reference potential) may be patterned above the photodetector to provide an aperture that blocks stray light from adjacent sample wells and other unwanted light sources. According to some embodiments, polymerase 5-520 may be located within the sample well 5-330 (e.g., attached to a base of the sample well). The polymerase may take up a target nucleic acid 5-510 (e.g., a portion of nucleic acid derived from DNA), and sequence a growing strand of complementary nucleic acid to produce a growing strand of DNA 5-512. Nucleotides and/or nucleotide analogs labeled with different fluorophores may be dispersed in a solution above and within the sample well.

When a labeled nucleotide and/or nucleotide analog 5-610 is incorporated into a growing strand of complementary nucleic acid, as depicted in FIG. 5-6, one or more attached fluorophores 5-630 may be repeatedly excited by pulses of optical energy coupled into the sample well 5-330 from the waveguide 5-315. In some embodiments, the fluorophore or fluorophores 5-630 may be attached to one or more nucleotides and/or nucleotide analogs 5-610 with any suitable linker 5-620. An incorporation event may last for a period of time up to about 100 ms. During this time, pulses of fluorescent emission resulting from excitation of the fluorophore(s) by pulses from the mode-locked laser may be detected with a time-binning photodetector 5-322. By attaching fluorophores with different emission characteristics (e.g., fluorescent decay rates, intensity, fluorescent wavelength) to the different nucleotides (A,C,G,T), detecting and distinguishing the different emission characteristics while the strand of DNA 5-512 incorporates a nucleic acid and enables determination of the nucleotide sequence of the growing strand of DNA.

Figures 4, 5, 6, 7:
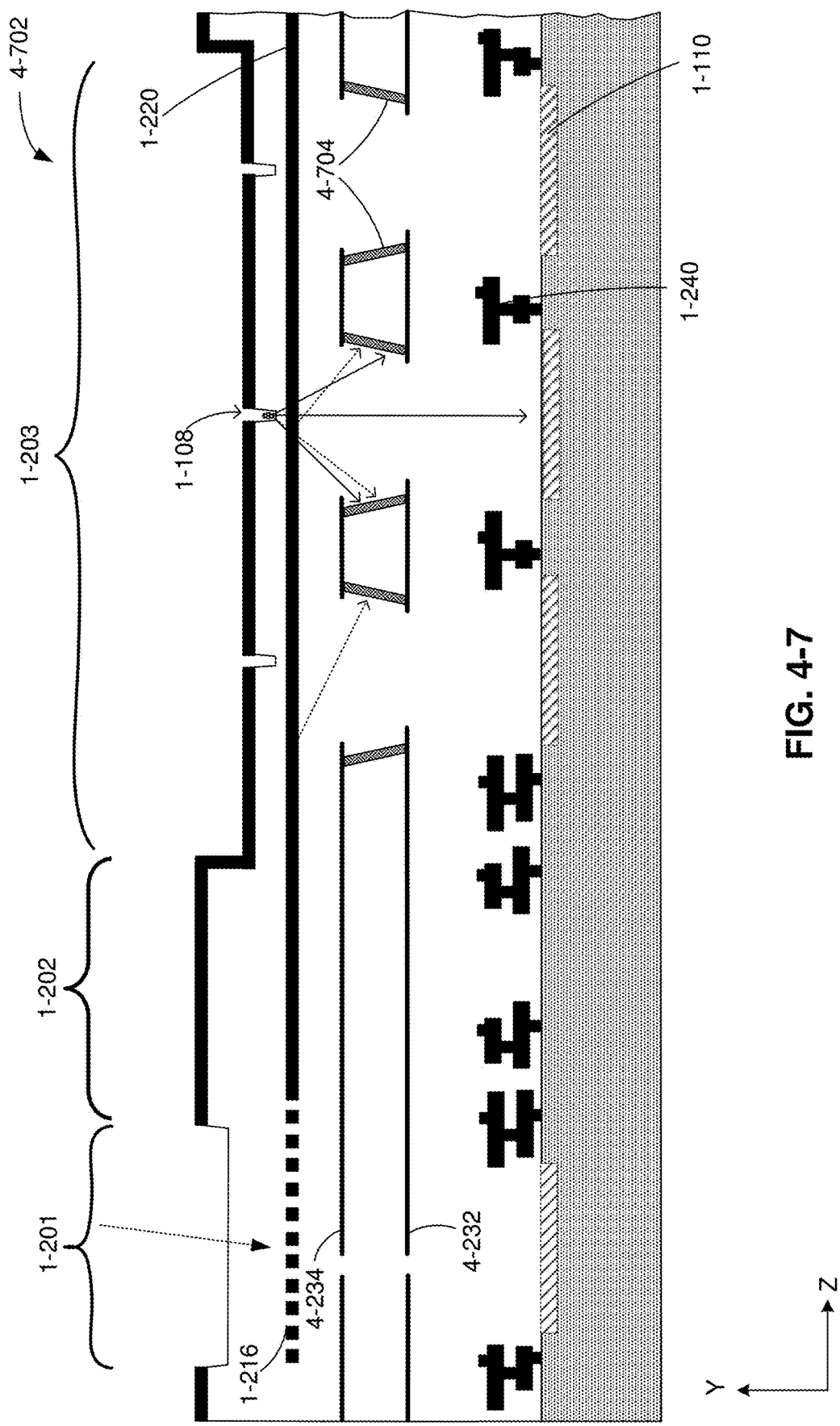
Figures 4, 5, 6, 7, 8, 8A:
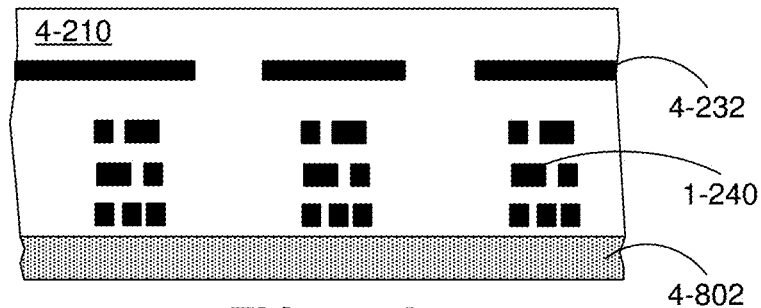
Figures 4, 5, 6, 7, 8, 8B:
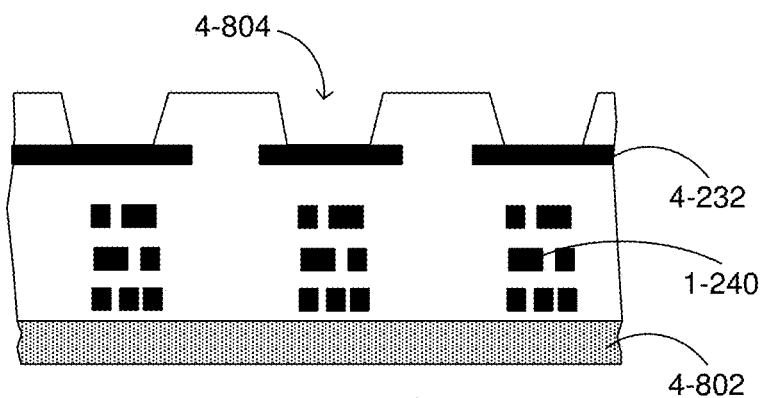
Figures 4, 5, 6, 7, 8, 8C:
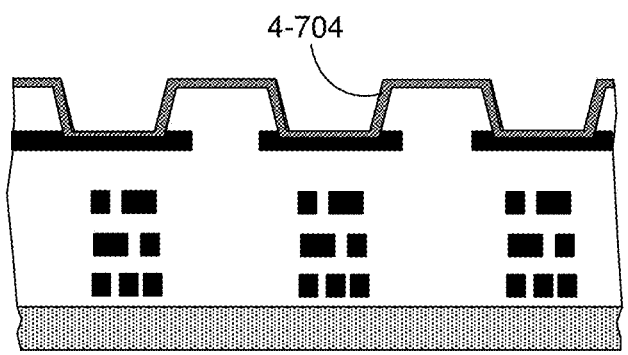
Figures 4, 5, 6, 7, 8, 8D:
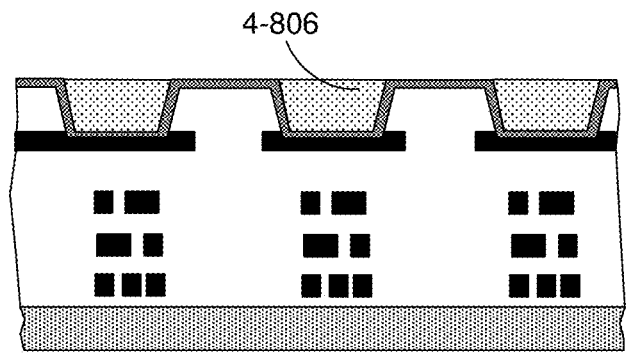
Figures 4, 5, 6, 7, 8, 8E:
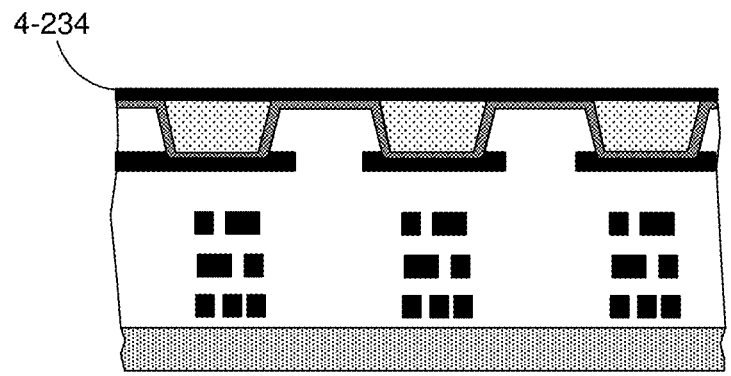
Figures 4, 5, 6, 7, 8, 8F:
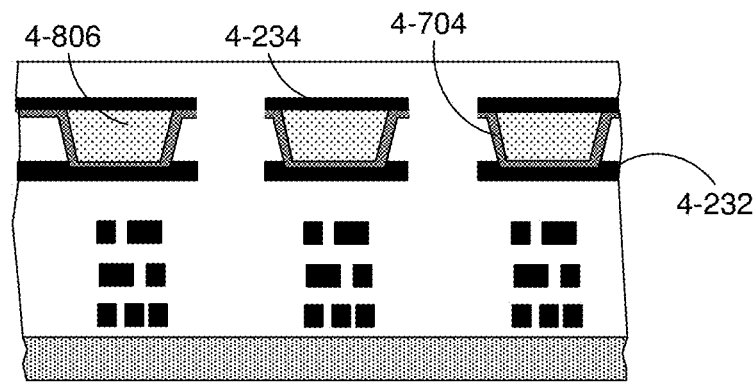
Figures 4, 5, 6, 7, 8, 9, 9A:
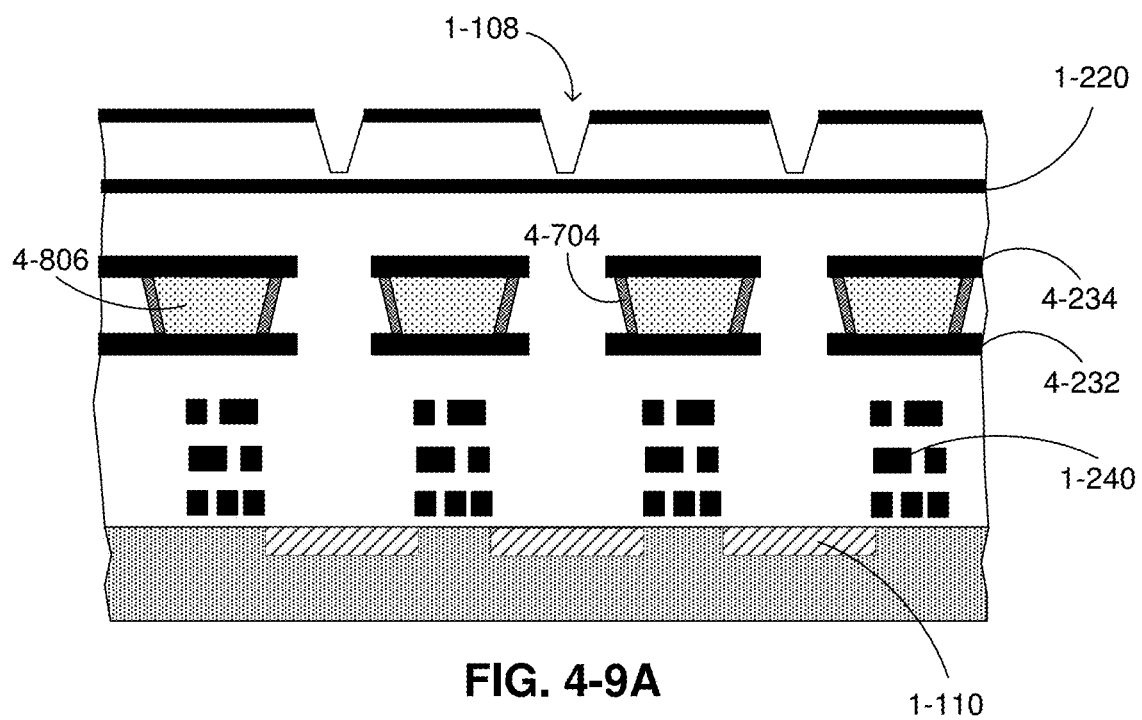
Figures 4, 5, 6, 7, 8, 9, 9B:
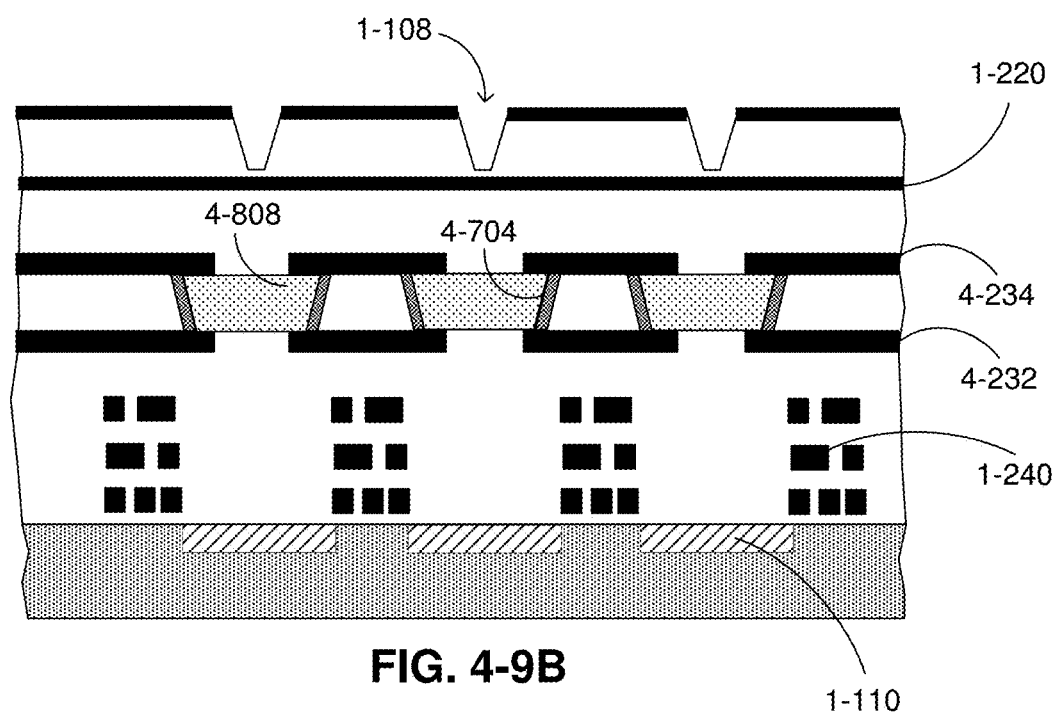
Figures 4, 5, 6, 7, 8, 9, 9C:
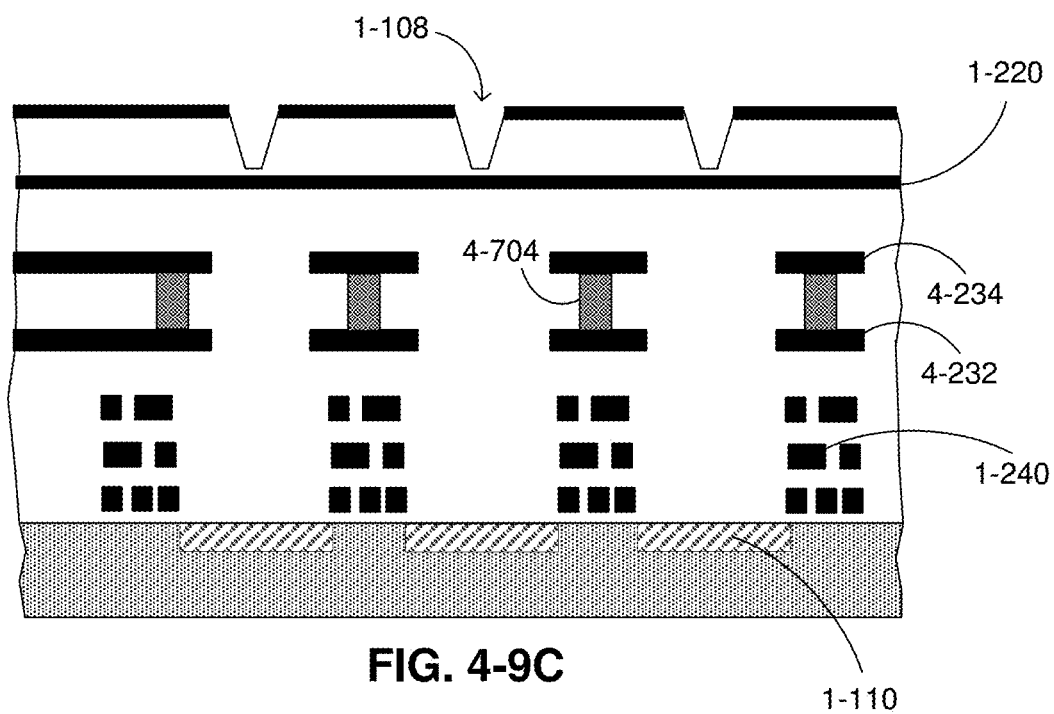
Figures 4, 5, 6, 7, 8, 9, 10, 10A:
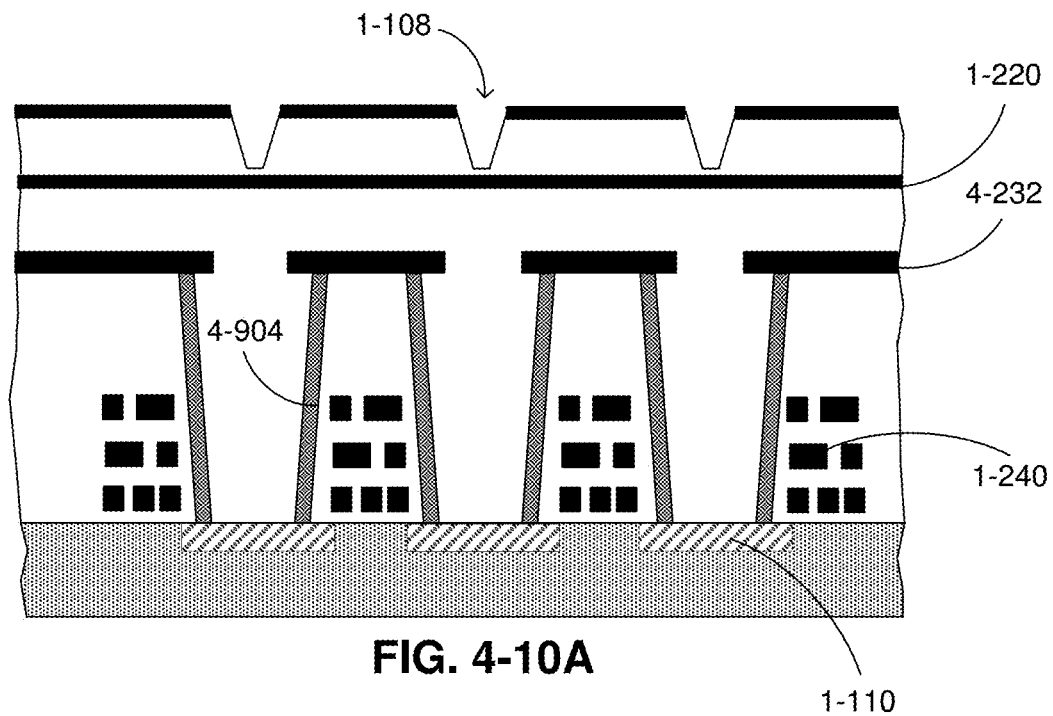
Figures 4, 5, 6, 7, 8, 9, 10, 10B:
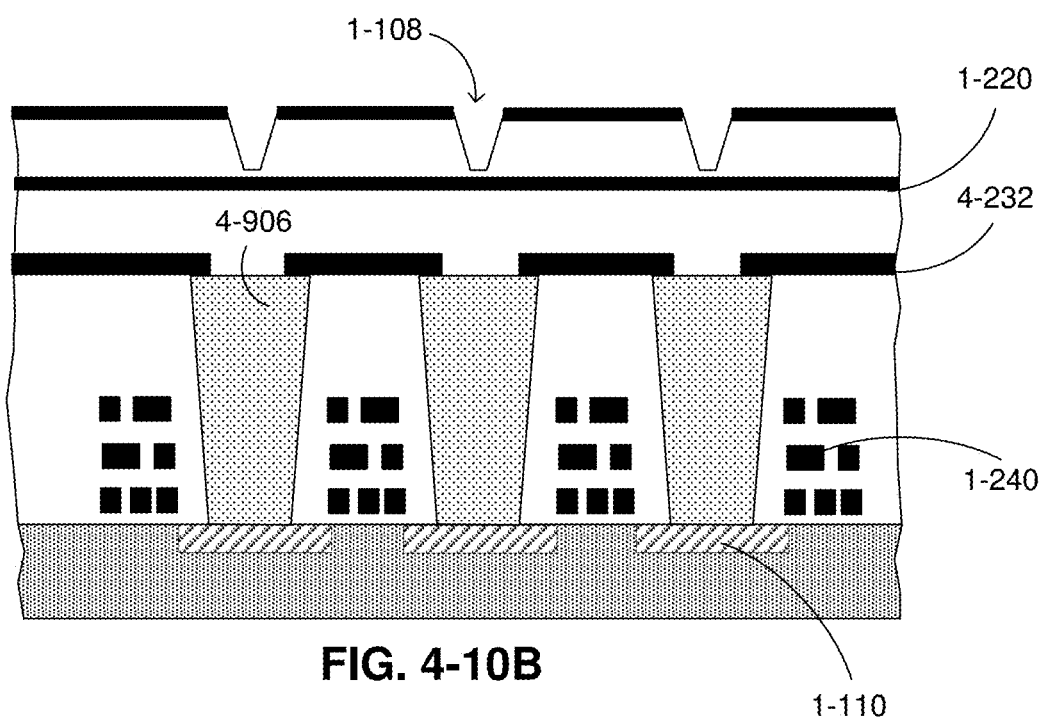
Figures 1, 5:
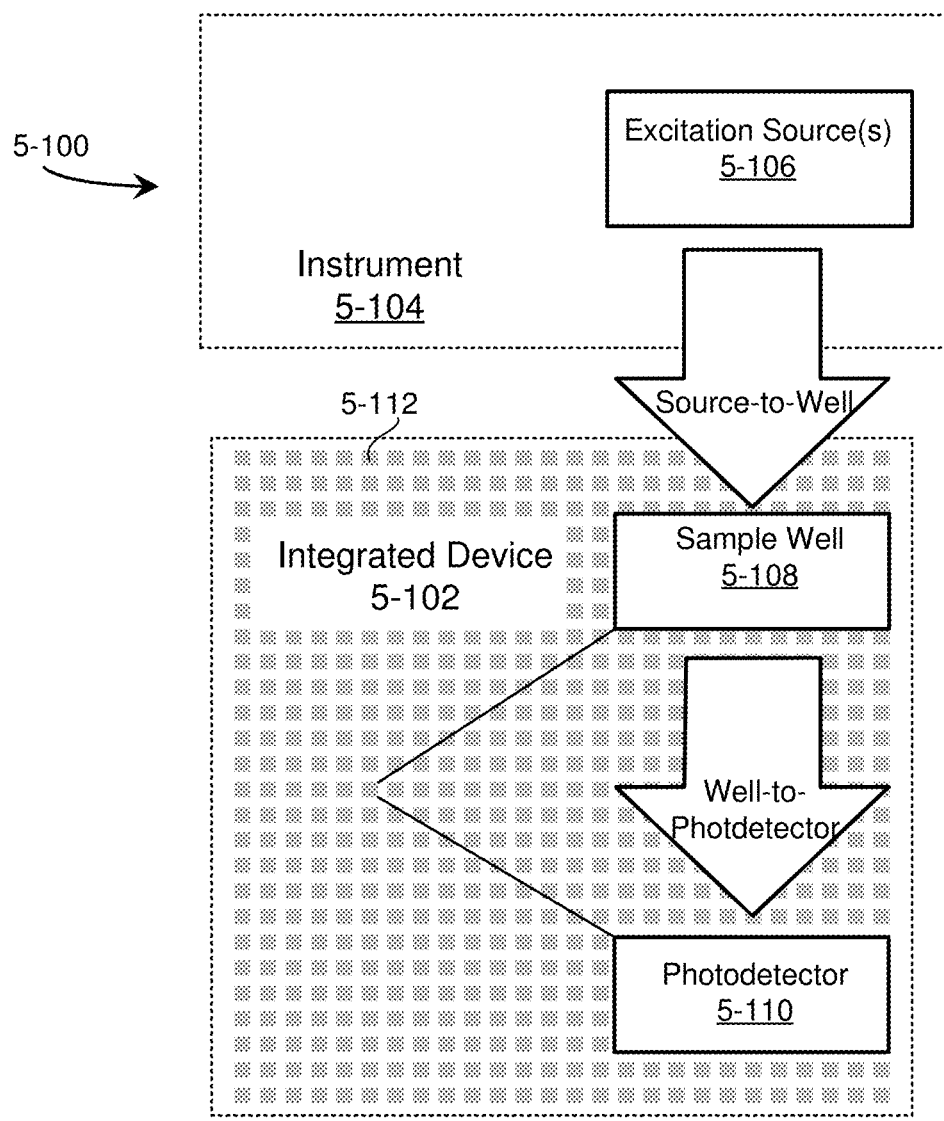
Figures 2A, 5:
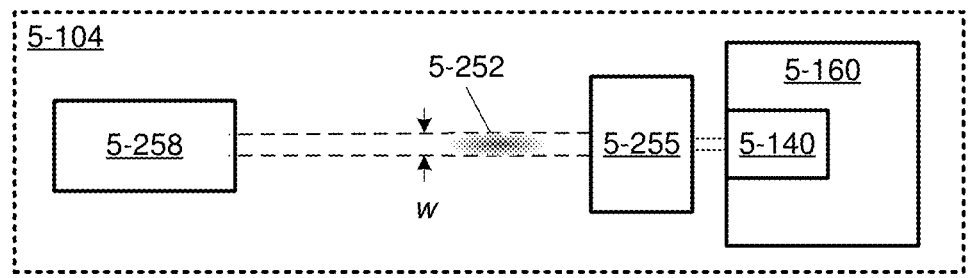
Figures 2B, 5:
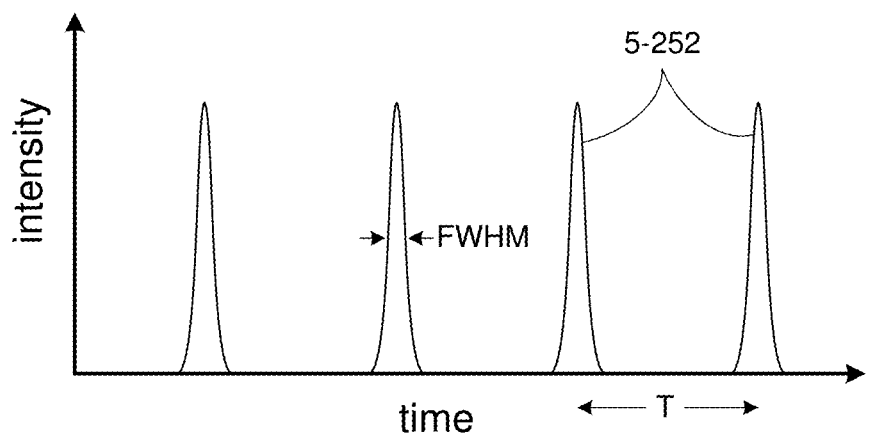
Figures 3, 5:
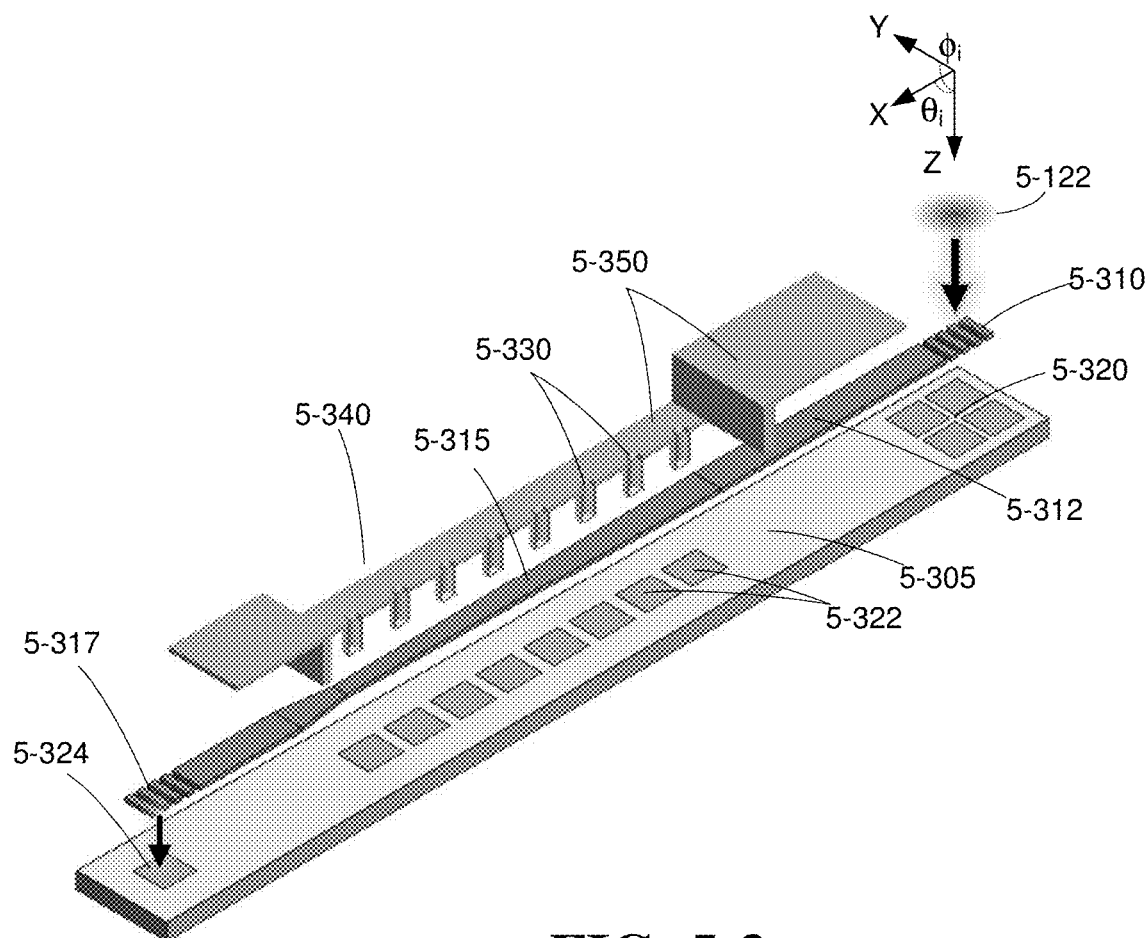
Figures 4, 5:
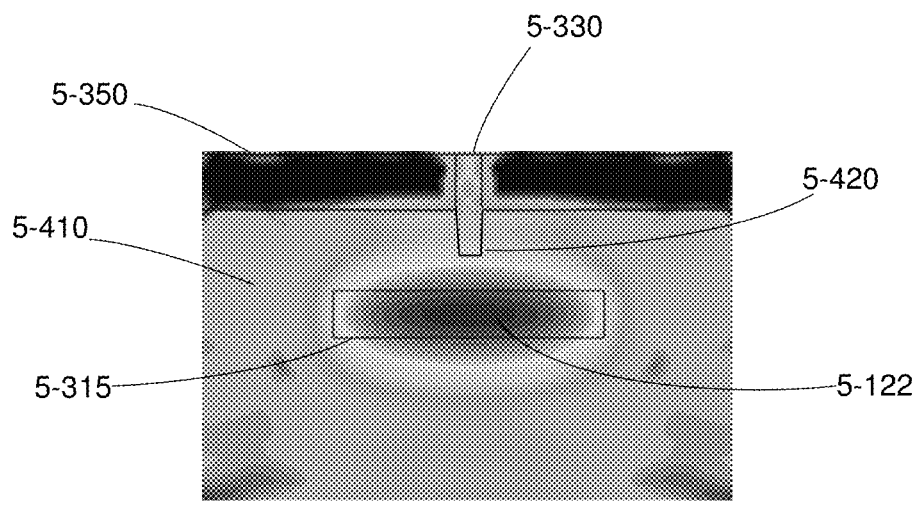
Figure 5:
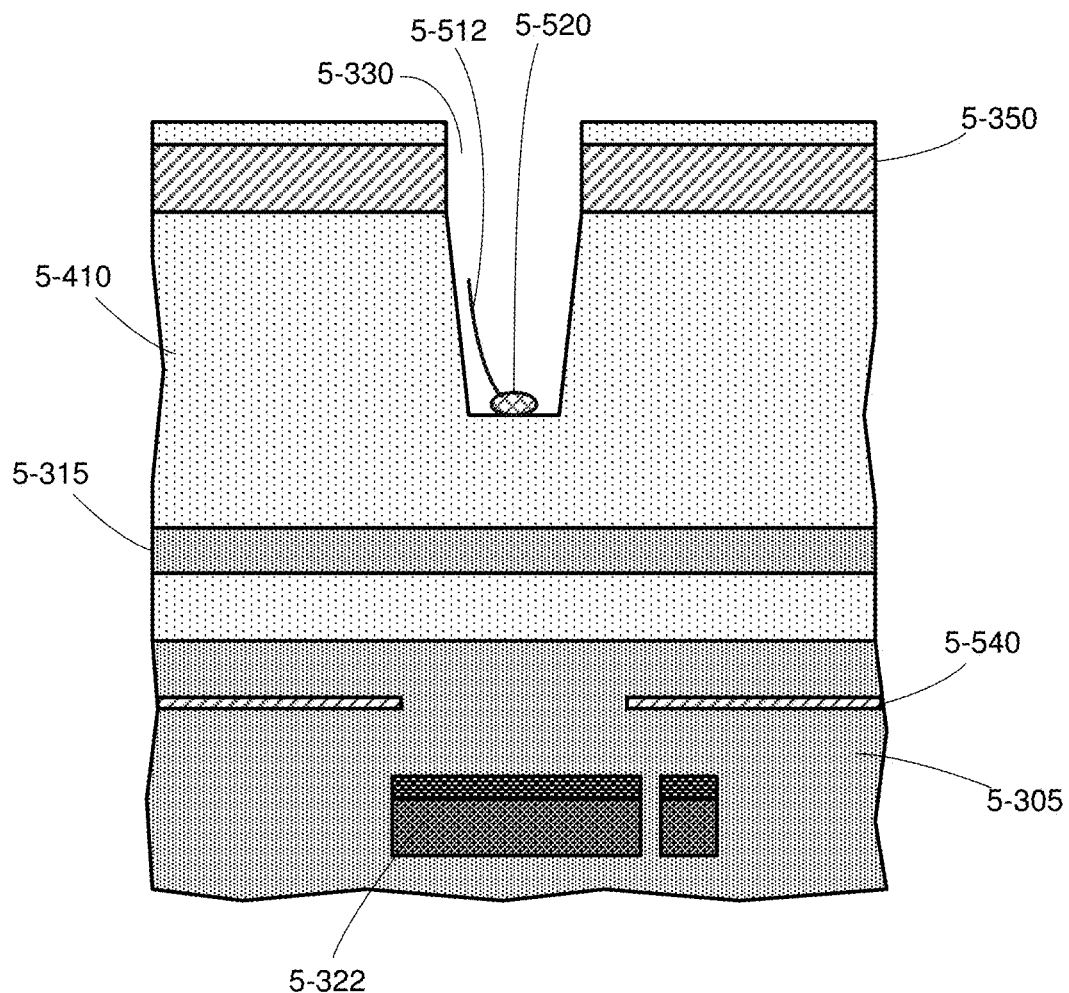
Figures 5, 6:
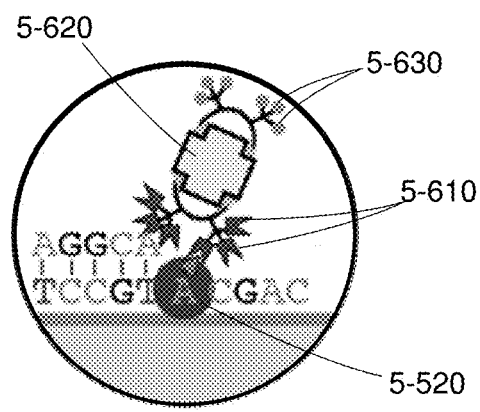
Figures 5, 6, 7:
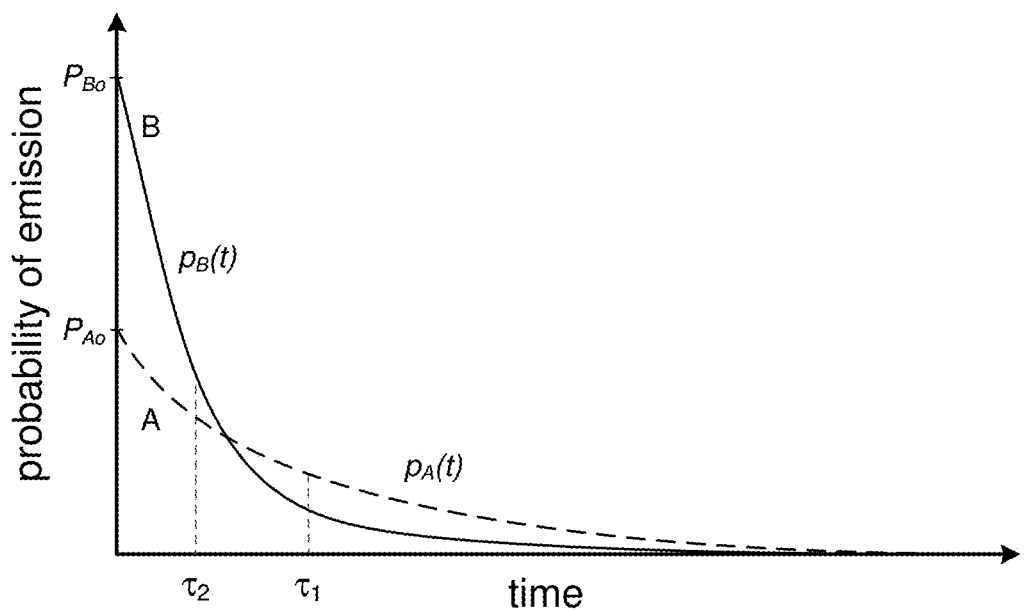
Figures 5, 6, 7, 8:
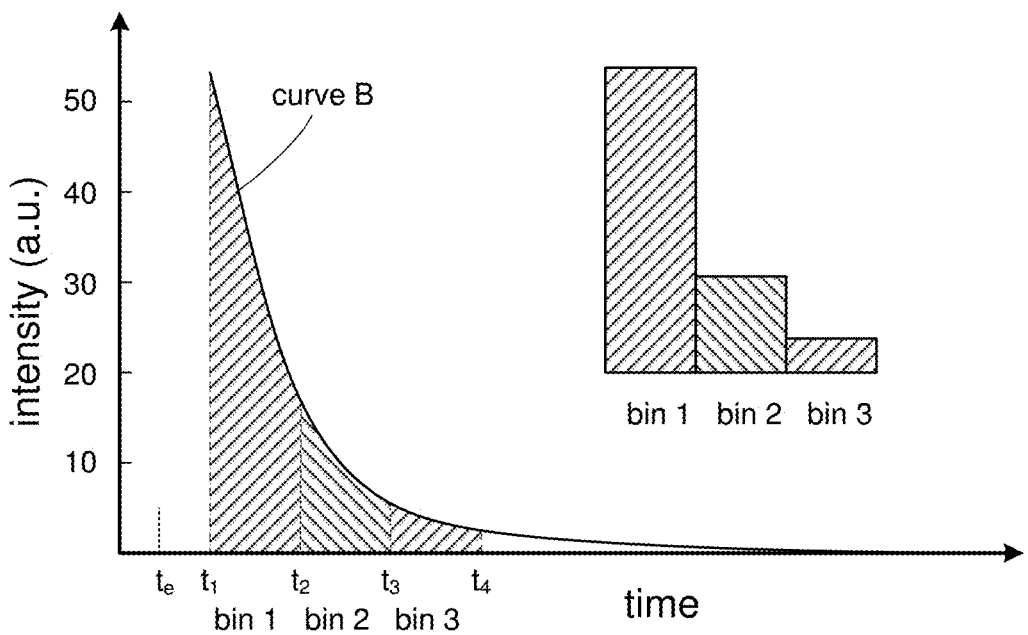
Figures 5, 6, 7, 8, 9, 9A:
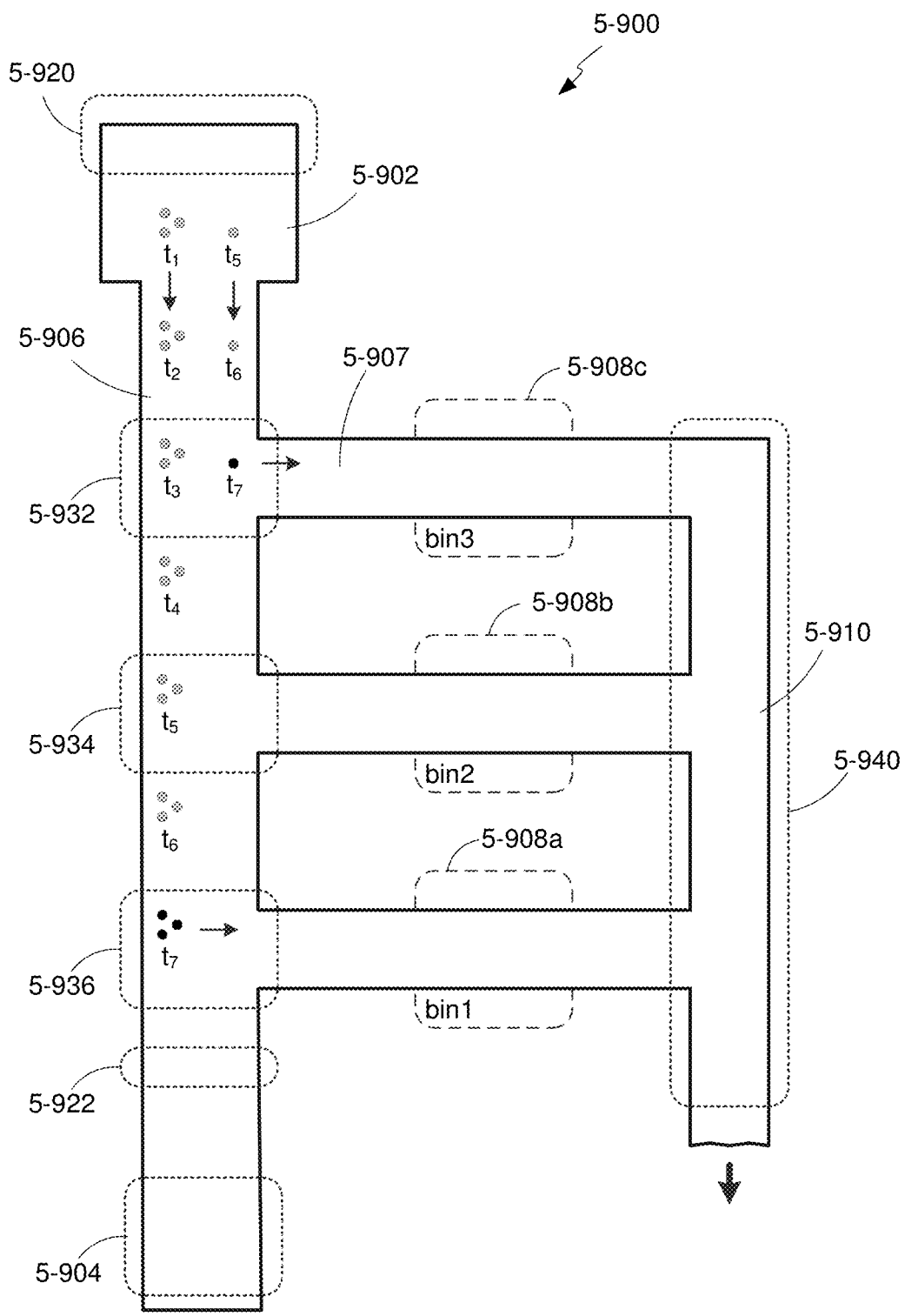
Figures 5, 6, 7, 8, 9, 9B:
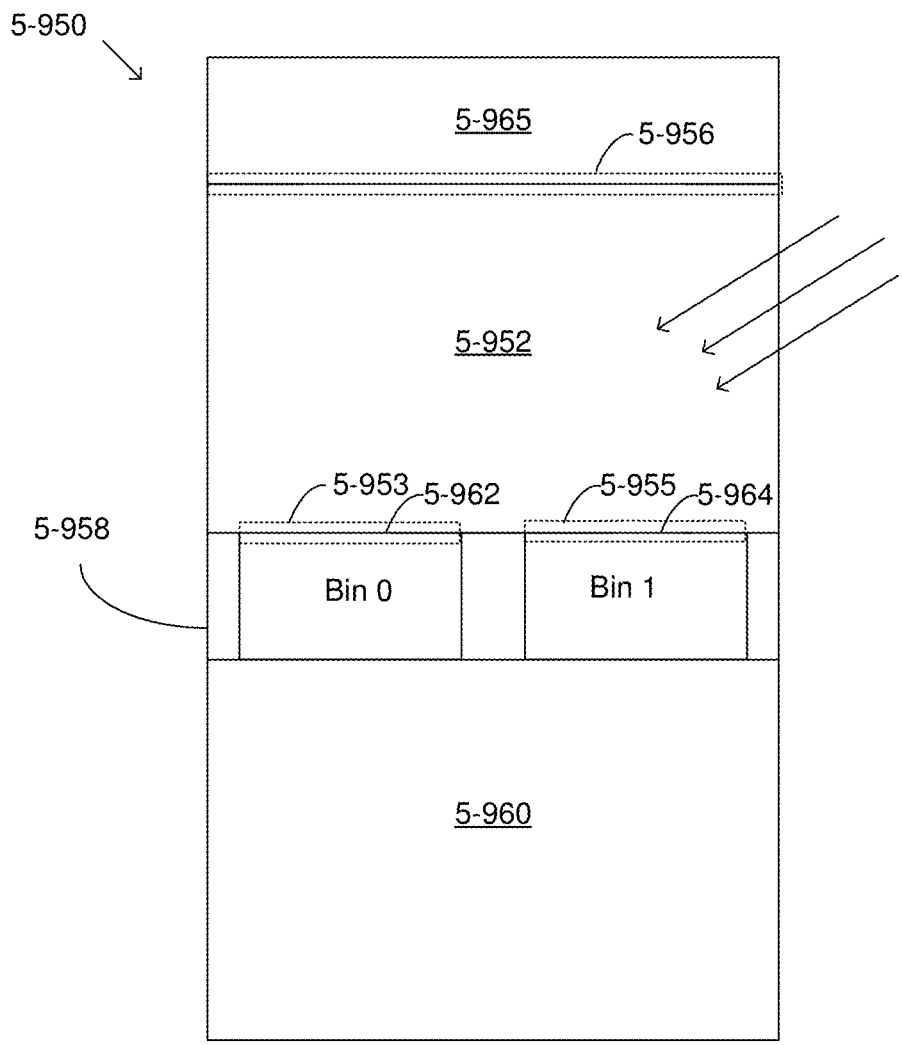
Figures 5, 6, 7, 8, 9, 10, 10A:
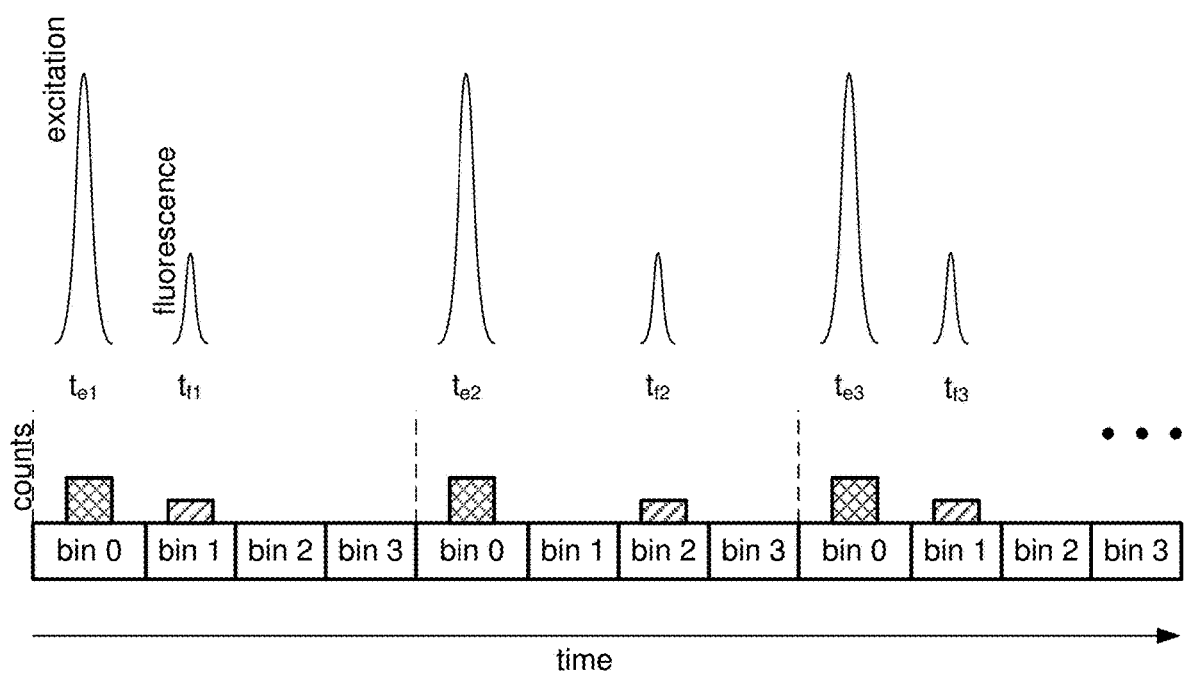
Figures 5, 6, 7, 8, 9, 10, 10B:
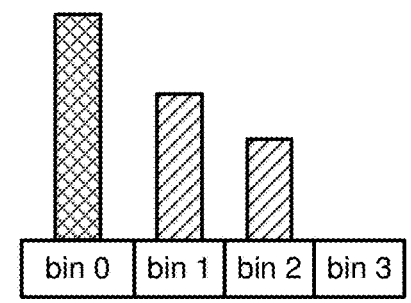
Figures 5, 6, 7, 8, 9, 10, 11, 11A:
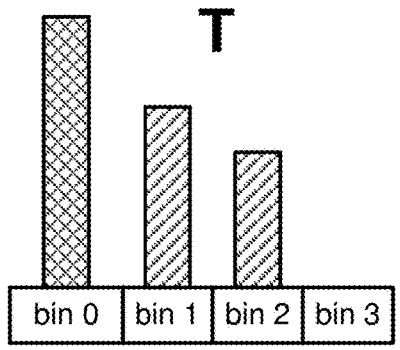
Figures 5, 6, 7, 8, 9, 10, 11, 11B:
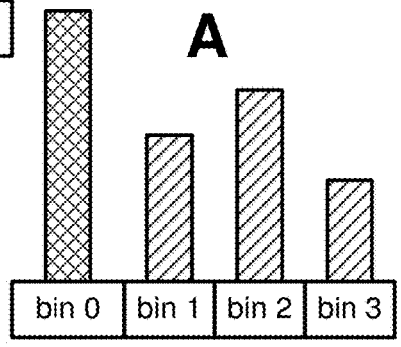
Figures 5, 6, 7, 8, 9, 10, 11, 11C:
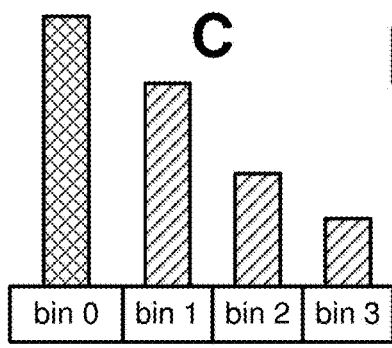
Figures 5, 6, 7, 8, 9, 10, 11, 11D:
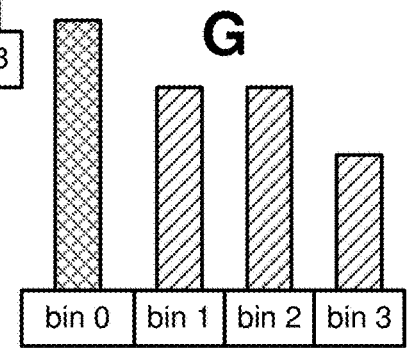

According to some embodiments, an instrument 5-104 that is configured to analyze samples based on fluorescent emission characteristics may detect differences in fluorescent lifetimes and/or intensities between different fluorescent molecules, and/or differences between lifetimes and/or intensities of the same fluorescent molecules in different environments. By way of explanation, FIG. 5-7 plots two different fluorescent emission probability curves (A and B), which may be representative of fluorescent emission from two different fluorescent molecules, for example. With reference to curve A (dashed line), after being excited by a short or ultrashort optical pulse, a probability $p_A(t)$ of a fluorescent emission from a first molecule may decay with time, as depicted. In some cases, the decrease in the probability of a photon being emitted over time may be represented by an exponential decay function $p_A(t)=P_{Ao}e^{-t/\tau_A}$, where $P_{Ao}$ is an initial emission probability and $\tau_A$ is a temporal parameter associated with the first fluorescent molecule that characterizes the emission decay probability. $\tau_A$ may be referred to as the "fluorescence lifetime," "emission lifetime," or "lifetime" of the first fluorescent molecule. In some cases, the value of $\tau_A$ may be altered by a local environment of the fluorescent molecule. Other fluorescent molecules may have different emission characteristics than that shown in curve A. For example, another fluorescent molecule may have a decay profile that differs from a single exponential decay, and its lifetime may be characterized by a half-life value or some other metric.

A second fluorescent molecule may have a decay profile that is exponential, but has a measurably different lifetime $\tau_B$, as depicted for curve B in FIG. 5-7. In the example shown, the lifetime for the second fluorescent molecule of curve B is shorter than the lifetime for curve A, and the probability of emission is higher sooner after excitation of the second molecule than for curve A. Different fluorescent molecules may have lifetimes or half-life values ranging from about 0.1 ns to about 20 ns, in some embodiments.

The inventors have recognized and appreciated that differences in fluorescent emission lifetimes can be used to discern between the presence or absence of different fluorescent molecules and/or to discern between different environments or conditions to which a fluorescent molecule is subjected. In some cases, discerning fluorescent molecules based on lifetime (rather than emission wavelength, for example) can simplify aspects of an instrument 5-104. As an example, wavelength-discriminating optics (such as wavelength filters, dedicated detectors for each wavelength, dedicated pulsed optical sources at different wavelengths, and/or diffractive optics) may be reduced in number or eliminated when discerning fluorescent molecules based on lifetime. In some cases, a single pulsed optical source operating at a single characteristic wavelength may be used to excite different fluorescent molecules that emit within a same wavelength region of the optical spectrum but have measurably different lifetimes. An analytic system that uses a single pulsed optical source, rather than multiple sources operating at different wavelengths, to excite and discern different fluorescent molecules emitting in a same wavelength region can be less complex to operate and maintain, more compact, and may be manufactured at lower cost.

Although analytic systems based on fluorescent lifetime analysis may have certain benefits, the amount of information obtained by an analytic system and/or detection accuracy may be increased by allowing for additional detection techniques. For example, some analytic systems 5-160 may additionally be configured to discern one or more properties of a sample based on fluorescent wavelength and/or fluorescent intensity.

Referring again to FIG. 5-7, according to some embodiments, different fluorescent lifetimes may be distinguished with a photodetector that is configured to time-bin fluorescent emission events following excitation of a fluorescent molecule. The time binning may occur during a single charge-accumulation cycle for the photodetector. A charge-accumulation cycle is an interval between read-out events during which photo-generated carriers are accumulated in bins of the time-binning photodetector. The concept of determining fluorescent lifetime by time-binning of emission events is introduced graphically in FIG. 5-8. At time $t_e$ just prior to $t_1$, a fluorescent molecule or ensemble of fluorescent molecules of a same type (e.g., the type corresponding to curve B of FIG. 5-7) is (are) excited by a short or ultrashort optical pulse. For a large ensemble of molecules, the intensity of emission may have a time profile similar to curve B, as depicted in FIG. 5-8.

For a single molecule or a small number of molecules, however, the emission of fluorescent photons occurs according to the statistics of curve B in FIG. 5-7, for this example. A time-binning photodetector 5-322 may accumulate carriers generated from emission events into discrete time bins (three indicated in FIG. 5-8) that are temporally resolved with respect to the excitation time of the fluorescent molecule(s). When a large number of emission events are summed, carriers accumulated in the time bins may approximate the decaying intensity curve shown in FIG. 5-8, and the binned signals can be used to distinguish between different fluorescent molecules or different environments in which a fluorescent molecule is located.

Examples of a time-binning photodetector are described in U.S. patent application Ser. No. 14/821,656, filed Aug. 7, 2015, titled "INTEGRATED DEVICE FOR TEMPORAL BINNING OF RECEIVED PHOTONS," which is incorporated herein by reference. For explanation purposes, a non-limiting embodiment of a time-binning photodetector is depicted in FIG. 5-9A. A single time-binning photodetector 5-900 may comprise a photon-absorption/carrier-generation region 5-902, a carrier travel/capture region 5-906, and carrier storage region having one or more charge carrier storage regions 5-908a, 5-908b, 5-908c, which may correspond to time bins. The carrier travel/capture region may be connected to the charge carrier storage regions by carrier-transport channels 5-907. Only three carrier-storage bins are shown, but there may be more or less. In some embodiments, a single time-binning photodetector 5-900 includes at least two charge carrier storage regions. There may be a read-out channel 5-910 connected to the charge carrier storage regions. The photon-absorption/carrier-generation region 5-902, carrier travel/capture region 5-906, charge carrier storage regions 5-908a, 5-908b, 5-908c, and read-out channel 5-910 may be formed by doping the semiconductor locally and/or forming adjacent insulating regions to provide photodetection capability and confine carriers. A time-binning photodetector 5-900 may include a drain 5-904 formed to connect with carrier travel/capture region 5-906. Drain 5-904 may be configured to discard charge carriers at particular times. By removing photogenerated charge carriers in this manner, unwanted charge carriers produced in response to excitation light may be discarded. A time-binning photodetector 5-900 may include a plurality of electrodes 5-920, 5-922, 5-932, 5-934, 5-936, 5-940 formed on the substrate that are configured to generate electric fields in the device for transporting charge carriers through the photodetector. The plurality of electrodes may establish a potential gradient such that charge carriers travel toward drain 5-904.

In operation, fluorescent photons may be received at the photon-absorption/carrier-generation region 5-902 at different times and generate carriers. For example, at approximately time $t_1$ three fluorescent photons may generate three carrier electrons in a depletion region of the photon-absorption/carrier-generation region 5-902. An electric field in the device (due to doping and/or an externally applied bias to electrodes 5-920 and 5-922, and optionally or alternatively to 5-932, 5-934, 5-936) may move the carriers to the carrier travel/capture region 5-906. In the carrier travel/capture region, distance of travel translates to a time after excitation of the fluorescent molecules. At a later time $t_5$, another fluorescent photon may be received in the photon-absorption/carrier-generation region 5-902 and generate an additional carrier. At this time, the first three carriers have traveled to a position in the carrier travel/capture region 5-906 adjacent to the second storage bin 5-908b. At a later time $t_7$, an electrical bias may be applied between electrodes 5-932, 5-934, 5-936 and electrode 5-940 to laterally transport carriers from the carrier travel/capture region 5-906 to the storage bins. The first three carriers may then be transported to and retained in the first bin 5-908a and the later-generated carrier may be transported to and retained in the third bin 5-908c. In some implementations, the time intervals corresponding to each storage bin are at the sub-nanosecond time scale, though longer time scales may be used in some embodiments (e.g., in embodiments where fluorophores have longer decay times).

The process of generating and time-binning charge carriers after an excitation event (e.g., excitation pulse from a pulsed optical source) may occur once after a single excitation pulse or be repeated multiple times after multiple excitation pulses during a single charge-accumulation cycle for the photodetector 5-900. After charge accumulation is complete, carriers may be read out of the storage bins via the read-out channel 5-910. For example, an appropriate biasing sequence may be applied to at least electrode 5-940 and a downstream electrode (not shown) to remove carriers from the storage bins 5-908a, 5-908b, 5-908c.

Time-binning photodetector 5-900 may be configured to discard charge carriers produced from photons of excitation light, or other unwanted light. The timing of the raising of one or more potential barriers within the carrier travel/capture region 5-906 may be timed such that photogenerated carriers produced by unwanted light, including excitation light, travels towards drain 5-904 and not towards charge carrier storage regions 5-908a, 5-908b, 5-908c. The timing of applying a voltage to an electrode, such as electrode 5-922, to raise a potential barrier may occur after a period of time such that some or all of the charge carriers generated during the period of time travel towards drain 5-904 and are not directed to charge carrier storage regions 5-908a, 5-908b, 5-908c. Subsequent charge carriers generated, after the period of time, may be selectively directed to charge carrier storage regions 5-908a, 5-908b, 5-908c. In some embodiments, the excitation light is a pulse of excitation light, and time-binning photodetector 5-900 may be configured to discard at least some of the charge carriers produced from photons of an excitation light pulse over a first period of time. After the first period of time, time-binning photodetector 5-900 may selectively direct, over a second period of time, one or more charge carriers produced by incident photons into respective charge carrier storage regions based upon times at which the charge carriers are produced.

After a number of excitation events, the accumulated signal in each electron-storage bin may be read out to provide a histogram having corresponding bins that represent the fluorescent emission decay rate, for example. Such a process is illustrated in FIG. 5-10A and FIG. 5-10B. The histogram's bins may indicate a number of photons detected during each time interval after excitation of the fluorophore(s) in a sample well. In some embodiments, signals for the bins will be accumulated following a large number of excitation pulses, as depicted in FIG. 5-10A. The excitation pulses may occur at times $t_{e1}$, $t_{e2}$, $t_{e3}$, . . . $t_{eN}$ which are separated by the pulse interval time T. There may be between $10^5$ and $10^7$ excitation pulses applied to the sample well during an accumulation of signals in the electron-storage bins. In some embodiments, one bin (bin 0) may be configured to detect an amplitude of excitation light delivered with each optical pulse, and be used as a reference signal (e.g., to normalize data).

In some embodiments, a time-binning photodetector may generate charge carriers in a photon absorption/carrier generation region and directly transfer charge carriers to a charge carrier storage bin in a charge carrier storage region. In such embodiments, the time-binning photodetector may not include a carrier travel/capture region. Such a time-binning photodetector may be referred to as a "direct binning pixel." Examples of a time-binning photodetectors, including direct binning pixels, are described in U.S. Pat. Application No. 62/438,051, filed Dec. 22, 2016, titled "INTEGRATED PHOTODETECTOR WITH DIRECT BINNING PIXEL," which is incorporated herein by reference. For explanation purposes, a non-limiting embodiment of a time-binning photodetector is depicted in FIG. 5-9B. As shown in FIG. 5-9B, time-binning photodetector 5-950 includes photon absorption/carrier generation region 5-952, bins of charge carrier storage region 5-958, and readout circuitry 5-960 that reads out signals from the bins of charge carrier storage region 5-958. The bin to which a charge carrier is transferred is based on the time of arrival of a photon in photon absorption/carrier generation region 5-952 that produces the charge carrier. FIG. 5-9B shows an example of time-binning photodetector having two bins in charge carrier storage region 5-958: bin 0 and bin 1. In some instances, bin 0 may aggregate charge carriers received in one period following a trigger event (e.g., a pulse of excitation light), and bin 1 may aggregate charge carriers received in a later time period with respect to a trigger event. However, charge storage region 5-958 may have any number of bins, such as one bin, three bins, four bins, or more. Time-binning photodetector 5-950 may include electrodes 5-953, 5-955, and 5-956, which may be configured to apply voltages to establish potential gradients to direct charge carriers. Time-binning photodetector 5-950 may include rejection region 5-965, which may act as a drain or otherwise be configured to discard charge carriers produced in photon absorption/carrier generation region 5-952. A period of time when charge carriers are rejected by rejection region 5-965 may be timed to occur during a trigger event, such as an excitation light pulse.

Since an excitation light pulse may produce a number of unwanted charge carriers in photon absorption/carrier generation region 5-952, a potential gradient may be established in pixel 5-950 to drain such charge carriers to rejection region 5-965 during a rejection period. As an example, rejection region 5-965 may include a high potential diffusion area where electrons are drained to a supply voltage. Rejection region 5-965 may include an electrode 5-956 that charge couples region 5-952 directly to rejection region 5-965. The voltage of the electrode 5-956 may be varied to establish a desired potential gradient in photon absorption/carrier generation region 5-952. During a rejection period, the voltage of the electrode 5-956 may be set to a level that draws carriers from the photon absorption/carrier generation region 5-952 into the electrode 5-956, and out to the supply voltage. For example, the voltage of the electrode 5-956 may be set to a positive voltage to attract electrons, such that they are drawn away from the photon absorption/carrier generation region 5-952 to rejection region 5-965. Rejection region 5-965 may be considered a "lateral rejection region" because it allows transferring carriers laterally from region 5-952 to a drain.

Following the rejection period, a photogenerated charge carrier produced in photon absorption/carrier generation region 5-952 may be time-binned. Individual charge carriers may be directed to a bin based on their time of arrival. To do so, the electrical potential between photon absorption/carrier generation region 5-952 and charge carrier storage region 5-958 may be changed in respective time periods to establish a potential gradient that causes the photogenerated charge carriers to be directed to respective time bins. For example, during a first time period a barrier 5-962 formed by electrode 5-953 may be lowered, and a potential gradient may be established from photon absorption/carrier generation region 5-952 to bin 0, such that a carrier generated during this period is transferred to bin 0. Then, during a second time period, a barrier 5-964 formed by electrode 5-955 may be lowered, and a potential gradient may be established from photon absorption/carrier generation region 5-952 to bin 1, such that a carrier generated during this later period is transferred to bin 1.

In some implementations, only a single photon on average may be emitted from a fluorophore following an excitation event, as depicted in FIG. 5-10A. After a first excitation event at time $t_{e1}$, the emitted photon at time $t_{f1}$ may occur within a first time interval, so that the resulting electron signal is accumulated in the first electron-storage bin (contributes to bin 1). In a subsequent excitation event at time $t_{e2}$, the emitted photon at time $t_{f2}$ may occur within a second time interval, so that the resulting electron signal contributes to bin 2.

After a large number of excitation events and signal accumulations, the electron-storage bins of the time-binning photodetector 5-322 may be read out to provide a multi-valued signal (e.g., a histogram of two or more values, an N-dimensional vector, etc.) for a sample well. The signal values for each bin may depend upon the decay rate of the fluorophore. For example and referring again to FIG. 5-8, a fluorophore having a decay curve B will have a higher ratio of signal in bin 1 to bin 2 than a fluorophore having a decay curve A. The values from the bins may be analyzed and compared against calibration values, and/or each other, to determine the particular fluorophore, which in turn identifies the nucleotide or nucleotide analog (or any other molecule or specimen of interest) linked to the fluorophore when in the sample well.

To further aid in understanding the signal analysis, the accumulated, multi-bin values may be plotted as a histogram, as depicted in FIG. 5-10B for example, or may be recorded as a vector or location in N-dimensional space. Calibration runs may be performed separately to acquire calibration values for the multi-valued signals (e.g., calibration histograms) for four different fluorophores linked to the four nucleotides or nucleotide analogs. As an example, the calibration histograms may appear as depicted in FIG. 5-11A (fluorescent label associated with the T nucleotide), FIG. 5-11B (fluorescent label associated with the A nucleotide), FIG. 5-11C (fluorescent label associated with the C nucleotide), and FIG. 5-11D (fluorescent label associated with the G nucleotide). A comparison of the measured multi-valued signal (corresponding to the histogram of FIG. 5-10B) to the calibration multi-valued signals may determine the identity "T" (FIG. 5-11A) of the nucleotide or nucleotide analog being incorporated into the growing strand of DNA.

In some implementations, fluorescent intensity may be used additionally or alternatively to distinguish between different fluorophores. For example, some fluorophores may emit at significantly different intensities or have a significant difference in their probabilities of excitation (e.g., at least a difference of about 35%) even though their decay rates may be similar. By referencing binned signals (bins 1-3) to measured excitation light bin 0, it may be possible to distinguish different fluorophores based on intensity levels.

In some embodiments, different numbers of fluorophores of the same type may be linked to different nucleotides or nucleotide analogs, so that the nucleotides may be identified based on fluorophore intensity. For example, two fluorophores may be linked to a first nucleotide (e.g., "C") or nucleotide analog and four or more fluorophores may be linked to a second nucleotide (e.g., "T") or nucleotide analog. Because of the different numbers of fluorophores, there may be different excitation and fluorophore emission probabilities associated with the different nucleotides. For example, there may be more emission events for the "T" nucleotide or nucleotide analog during a signal accumulation interval, so that the apparent intensity of the bins is significantly higher than for the "C" nucleotide or nucleotide analog.

The inventors have recognized and appreciated that distinguishing nucleotides or any other biological or chemical specimens based on fluorophore decay rates and/or fluorophore intensities enables a simplification of the optical excitation and detection systems in an instrument 5-104. For example, optical excitation may be performed with a single-wavelength source (e.g., a source producing one characteristic wavelength rather than multiple sources or a source operating at multiple different characteristic wavelengths). Additionally, wavelength discriminating optics and filters may not be needed in the detection system. Also, a single photodetector may be used for each sample well to detect emission from different fluorophores. The simplified optical excitation and detection systems facilitate shorter optical paths from the sample well to the photodetector, which improves signal collection and/or allows for pixels that occupy a smaller area footprint in the integrated device.

The phrase "characteristic wavelength" or "wavelength" is used to refer to a central or predominant wavelength within a limited bandwidth of radiation (e.g., a central or peak wavelength within a 20 nm bandwidth output by a pulsed optical source). In some cases, "characteristic wavelength" or "wavelength" may be used to refer to a peak wavelength within a total bandwidth of radiation output by a source.

The inventors have recognized and appreciated that fluorophores having emission wavelengths in a range between about 560 nm and about 900 nm can provide adequate amounts of fluorescence to be detected by a time-binning photodetector (which may be fabricated on a silicon wafer using CMOS processes). These fluorophores can be linked to biological molecules of interest such as nucleotides or nucleotide analogs. Fluorescent emission in this wavelength range may be detected with higher responsivity in a silicon-based photodetector than fluorescence at longer wavelengths. Additionally, fluorophores and associated linkers in this wavelength range may not interfere with incorporation of the nucleotides or nucleotide analogs into growing strands of DNA. The inventors have also recognized and appreciated that fluorophores having emission wavelengths in a range between about 560 nm and about 660 nm may be optically excited with a single-wavelength source. An example fluorophore in this range is Alexa Fluor 647, available from Thermo Fisher Scientific Inc. of Waltham, Mass. The inventors have also recognized and appreciated that excitation light at shorter wavelengths (e.g., between about 500 nm and about 650 nm) may be required to excite fluorophores that emit at wavelengths between about 560 nm and about 900 nm. In some embodiments, the time-binning photodetectors may efficiently detect longer-wavelength emission from the samples, e.g., by incorporating other materials, such as Ge, into the photodetectors active region.

Although the prospect of sequencing DNA using an excitation source that emits a single characteristic wavelength can simplify some of the optical system, it can place technically challenging demands on the excitation source, as noted above. For example, the inventors have recognized and appreciated that optical pulses from the excitation source should extinguish quickly for the detection schemes described above, so that the excitation light does not overwhelm or interfere with the subsequently detected fluorescent signal. In some embodiments and referring again to FIG. 5-5, there may be no wavelength filters between the waveguide 5-315 and the time-binning photodetector 5-322. To avoid interference of the excitation light with subsequent signal collection, the excitation pulse may need to reduce in intensity by at least 50 dB within about 100 ps from the peak of the excitation pulse. In some implementations, the excitation pulse may need to reduce in intensity by at least 80 dB within about 100 ps from the peak of the excitation pulse. The inventors have recognized and appreciated that mode-locked lasers can provide such rapid turn-off characteristics. However, mode-locked lasers can be difficult to operate in a stable mode-locking state for extended periods of time. Also, because the pulse repetition rate may need to be lower than 100 MHz for data acquisition purposes, the length of a mode-locked laser cavity can become very long. Such long lengths are contrary to a compact optical source that can be incorporated into a portable, desk-top instrument. Additionally, a mode-locked laser must provide adequate energy per pulse (or high average powers) for excitation of fluorophores at wavelengths below 660 nm, so that fluorescence is detectable with integrated photodiodes for thousands or even millions of sample wells in parallel. The inventors have further recognized and appreciated that a beam quality of the mode-locked laser should be high (e.g., an $M^2$ value less than 1.5), so that efficient coupling can be achieved to an optical coupler and waveguides of an integrated device 5-102, for example. Currently, there is no commercial mode-locked lasing system available that provides pulses at repetition rates between 50 MHz and 200 MHz, at wavelengths between 500 nm and 650 nm, at average powers between 250 mW and 1 W, in a compact module (e.g., occupying a volume of less than 0.1 ft$^3$) that could be incorporated into a portable, desk-top instrument and remain stable for extended periods of time.

In some embodiments, a sample may be labeled with one or more markers, and emission associated with the markers is discernable by the instrument. For example, the photodetector may be configured to convert photons from the emission light into electrons to form an electrical signal that may be used to discern a lifetime that is dependent on the emission light from a specific marker. By using markers with different lifetimes to label samples, specific samples may be identified based on the resulting electrical signal detected by the photodetector.

A sample may contain multiple types of molecules and different luminescent markers may uniquely associate with a molecule type. During or after excitation, the luminescent marker may emit emission light. One or more properties of the emission light may be used to identify one or more types of molecules in the sample. Properties of the emission light used to distinguish among types of molecules may include a fluorescence lifetime value, intensity, and/or emission wavelength. A photodetector may detect photons, including photons of emission light, and provide electrical signals indicative of one or more of these properties. In some embodiments, electrical signals from a photodetector may provide information about a distribution of photon arrival times across one or more time intervals. The distribution of photon arrival times may correspond to when a photon is detected after a pulse of excitation light is emitted by an excitation source. A value for a time interval may correspond to a number of photons detected during the time interval. Relative values across multiple time intervals may provide an indication of a temporal characteristic of the emission light (e.g., lifetime). Analyzing a sample may include distinguishing among markers by comparing values for two or more different time intervals within a distribution. In some embodiments, an indication of the intensity may be provided by determining a number of photons across all time bins in a distribution.

IV. Conclusion

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. An integrated device comprising:
    a plurality of sample wells arranged on a first layer of the integrated device, wherein individual sample wells of the plurality of sample wells are configured to receive a sample configured to emit emission light in response to excitation light;
    a plurality of photodetectors arranged on a second layer of the integrated device and positioned to receive photons of emission light emitted from the plurality of sample wells, wherein the plurality of sample wells and the plurality of photodetectors form pixels, each of at least some of the pixels including a sample well of the plurality of sample wells aligned with at least one photodetector of the plurality of photodetectors, and a signal generated by the at least one photodetector indicates photons of emission light emitted by a sample in the sample well; and
    at least one photonic structure configured to attenuate the excitation light relative to the emission light, wherein the at least one photonic structure includes at least one spatial filter including a first spatial filter with first openings each having a first size and a second spatial filter with second openings each having a second size, wherein a first opening of the first spatial filter and a second opening of the second spatial filter overlap with a sample well, the first spatial filter is positioned between the first layer and the second spatial filter, and the first size is greater than the second size.

2. The integrated device of claim 1, wherein the at least one photonic structure is positioned to align on a common axis with an individual sample well and its respective at least one photodetector.

3. The integrated device of claim 1, wherein a sample well of the plurality of sample wells is positioned to overlap with its respective at least one photodetector.

4. The integrated device of claim 1, wherein individual sample wells of the plurality of sample wells align with individual photodetectors of the plurality of photodetectors.

5. The integrated device of claim 1, wherein one first opening of the plurality of first openings aligns on a common axis with an individual sample well and its respective at least one photodetector.

6. The integrated device of claim 1, further comprising at least one waveguide configured to couple excitation light to a portion of the plurality of sample wells.

7. The integrated device of claim 6, wherein a first waveguide of the at least one waveguide is positioned to overlap with a first sample well of the portion of sample wells and a first photodetector of the plurality of photodetectors along a common axis.

8. The integrated device of claim 7, wherein the at least one photonic structure is positioned between the first waveguide and the first photodetector along the common axis.

9. The integrated device of claim 1, wherein the at least one spatial filter is configured to block transmission of at least a portion of the excitation light.

10. The integrated device of claim 9, wherein the at least one spatial filter includes at least one metal layer configured to block transmission of at least a portion of the excitation light.

11. The integrated device of claim 10, wherein the integrated device further comprises circuitry that includes the at least one metal layer, wherein the circuitry is electrically coupled to at least one photodetector of the plurality of photodetectors.

12. The integrated device of claim 1, wherein the at least one photonic structure includes at least one spectral filter configured to transmit a first range of wavelengths at a higher level than a second range of wavelengths, wherein the first range of wavelengths includes at least one characteristic wavelength of the emission light and the second range of wavelengths includes at least one characteristic wavelength of the excitation light.

13. The integrated device of claim 12, wherein the at least one spectral filter is positioned between the first spatial filter and the second spatial filter.

14. The integrated device of claim 12, wherein the at least one spectral filter includes a plurality of low refractive index layers having a low refractive index material and a plurality of high refractive index layers having a high refractive index material.

15. The integrated device of claim 14, wherein the at least one spectral filter includes alternating layers of the plurality of high refractive index layers and the plurality of low refractive index layers.

16. The integrated device of claim 12, wherein the integrated device further includes an excitation source coupling region configured to receive a beam of excitation light and optically couple excitation light to a waveguide of the integrated device, wherein the at least one spectral filter overlaps with the excitation source coupling region.

17. The integrated device of claim 1, wherein the at least one photonic structure includes at least one polarization filter configured to attenuate transmission of light having a type of polarization.

18. The integrated device of claim 17, wherein the excitation light is transverse electric (TE) polarized light, and the at least one polarization filter is configured to attenuate TE polarized light.

19. The integrated device of claim 17, wherein the at least one polarization filter includes a periodic array of slits.

20. The integrated device of claim 1, wherein the excitation light is a pulse of excitation light and the emission light is a photon emitted by at least one fluorescent marker emitted in response to the pulse of excitation light, wherein individual photodetectors of the plurality of photodetectors are further configured to generate a signal indicative of a lifetime of the emission light.

21. The integrated device of claim 1, wherein individual photodetectors of the plurality of photodetectors are configured to discard charge carriers produced from photons of excitation light.

22. The integrated device of claim 21, wherein the excitation light is a pulse of excitation light, and individual photodetectors are further configured to discard charge carriers produced from photons of the excitation light pulse over a first period of time.

23. The integrated device of claim 22, wherein individual photodetectors are further configured to selectively direct, over a second period of time, charge carriers produced by incident photons into respective charge carrier storage regions based upon times at which the charge carriers are produced.

24. The integrated device of claim 1, wherein the at least one photonic structure is configured to attenuate excitation light over a range of angles from normal to the at least one photonic structure.

25. The integrated device of claim 1, wherein a characteristic wavelength of the emission light is between 550 nm and 650 nm.

26. The integrated device of claim 1, wherein a characteristic wavelength of the excitation light is 532 nm.

27. The integrated device of claim 1, wherein a characteristic wavelength of the excitation light is 515 nm.

28. The integrated device of claim 1, further comprising vertical sidewalls positioned between the at least one spatial filter and at least a portion of the plurality of photodetectors.

29. The integrated device of claim 1, further comprising vertical sidewalls positioned between the first spatial filter and the second spatial filter.

30. The integrated device of claim 1, further comprising a region having a first dielectric material positioned between the at least one spatial filter and at least one photodetector of the plurality of photodetectors and a region having a second dielectric material positioned between the at least one spatial filter and a sample well overlapping with the at least one photodetector, wherein the first dielectric material has a higher refractive index than the second dielectric material.

31. The integrated device of claim 1, wherein a distance between one sample well of the plurality of sample wells and at least one photodetector of the plurality of photodetectors is less than 10 microns.

32. The integrated device of claim 1, wherein a distance between one sample well of the plurality of sample wells and at least one photodetector of the plurality of photodetectors is less than 5 microns.

33. The integrated device of claim 1, wherein a distance between one sample well of the plurality of sample wells and at least one photodetector of the plurality of photodetectors is between 1.5 microns and 5 microns.

34. The integrated device of claim 1, wherein a first opening of the plurality of first openings has a cross-sectional dimension greater than a cross-sectional dimension of a sample well of the plurality of sample wells.

35. The integrated device of claim 1, wherein an area of a first opening of the plurality of first openings is greater than an area of a cross-sectional area of a sample well.

36. The integrated device of claim 1, wherein a first opening of the plurality of first openings is non-coaxial with a sample well.

37. The integrated device of claim 1, wherein the at least one spatial filter includes one or more metal layers and one or more anti-reflective layers.

38. A method of forming an integrated device comprising:
forming a plurality of sample wells arranged on a first layer of the integrated device, wherein individual sample wells of the plurality of sample wells are configured to receive a sample configured to emit emission light in response to excitation light;
forming a plurality of photodetectors arranged on a second layer of the integrated device and positioned to receive photons of emission light emitted from the plurality of sample wells, wherein the plurality of sample wells and the plurality of photodetectors form pixels, each of at least some of the pixels including a sample well of the plurality of sample wells aligned with at least one photodetector of the plurality of photodetectors, and a signal generated by the at least one photodetector indicates photons of emission light emitted by a sample in the sample well; and
forming at least one photonic structure configured to attenuate the excitation light relative to the emission light, wherein the at least one photonic structure includes at least one spatial filter including a first spatial filter with first openings each having a first size and a second spatial filter with second openings each having a second size, wherein a first opening of the first spatial filter and a second opening of the second spatial filter overlap with a sample well, the first spatial filter is positioned between the first layer and the second spatial filter, and the first size is greater than the second size.

* * * * *